(12) United States Patent
Matsuura

(10) Patent No.: US 9,035,460 B2
(45) Date of Patent: May 19, 2015

(54) SEMICONDUCTOR DEVICE AND METHOD OF MANUFACTURING THE SAME

(71) Applicant: Renesas Electronics Corporation, Kanagawa (JP)

(72) Inventor: Masazumi Matsuura, Kanagawa (JP)

(73) Assignee: RENESAS ELECTRONICS CORPORATION, Kanagawa (JP)

(*) Notice: Subject to any disclaimer, the term of this patent is extended or adjusted under 35 U.S.C. 154(b) by 0 days.

(21) Appl. No.: 13/677,968

(22) Filed: Nov. 15, 2012

(65) Prior Publication Data

US 2013/0140709 A1 Jun. 6, 2013

(30) Foreign Application Priority Data

Dec. 2, 2011 (JP) ................. 2011-264733

(51) Int. Cl.
| | |
|---|---|
| H01L 23/48 | (2006.01) |
| H01L 23/52 | (2006.01) |
| H01L 29/40 | (2006.01) |
| H01L 21/768 | (2006.01) |
| H01L 29/78 | (2006.01) |
| H01L 23/00 | (2006.01) |

(52) U.S. Cl.
CPC ........ *H01L 23/481* (2013.01); *H01L 21/76841* (2013.01); *H01L 21/76898* (2013.01); *H01L 23/564* (2013.01); *H01L 29/78* (2013.01); *H01L 2924/0002* (2013.01)

(58) Field of Classification Search
CPC ........... H01L 2224/48227; H01L 2224/73203; H01L 21/76898; H01L 23/481; H01L 2224/81; H01L 2225/06513; H01L 2225/06541; H01L 23/5389; H01L 2224/16; H01L 23/3128; H01L 24/97; H01L 2224/81801; H01L 2225/06586; H01L 2225/06517; H01L 23/49827; H01L 24/05; H01L 24/06; H01L 2224/32014; H01L 2224/48257; H01L 24/10; H01L 2224/4911; H01L 2224/73257; H01L 23/147; H01L 23/49816; H01L 2224/05; H01L 23/5226; H01L 24/14; H01L 24/17; H01L 24/24; H01L 24/75; H01L 24/83; H05K 2201/09127; H05K 2201/10287; H05K 2201/10295; H05K 2201/09536; H05K 2201/09563; H05K 2201/09609; H05K 2201/09827
USPC ................. 257/664–665, 734–786, 257/E29.111–E29.165, E23.01–E23.079, 257/E23.141–E23.179, E21.138–E21.21, 257/E21.627, E21.641, 41, 81, 82, 91, 99, 257/177–182; 438/630, 637–640, 668, 672, 438/675
See application file for complete search history.

(56) References Cited

U.S. PATENT DOCUMENTS

| | | | |
|---|---|---|---|
| 2010/0140749 A1* | 6/2010 | Kuo ............................. | 257/621 |
| 2012/0061827 A1* | 3/2012 | Fujita ........................... | 257/737 |
| 2012/0181658 A1* | 7/2012 | Mohammed et al. ......... | 257/532 |

OTHER PUBLICATIONS

P. Leduc et al., "First integration of Cu TSV using die-to-wafer direct bonding and planarization", IEEE 3D System Integration Conference 2009.

*Primary Examiner* — Dao H Nguyen
*Assistant Examiner* — Tram H Nguyen
(74) *Attorney, Agent, or Firm* — Young & Thompson

(57) ABSTRACT

To provide a technique adopting a TSV technique, capable of improving manufacturing yield and reliability of semiconductor devices. By partitioning a connection pad-forming region into a plurality of regions and by forming, respectively, connection pads 17 having a relatively small planar area, spaced apart from an adjacent connection pad 17 in each of partitioned regions, dishing generated in the connection pad 17 is lightened. In addition, by not forming a through hole 23 for forming a through electrode 27 in an interlayer insulating film 9 covering a semiconductor element, intrusion of $H_2O$, a metal ion such as $Na^+$ or $K^+$, etc. into an element-forming region from the through hole, via the interlayer insulating film is prevented.

15 Claims, 43 Drawing Sheets

SEMICONDUCTOR DEVICE AND METHOD OF MANUFACTURING THE SAME

CROSS-REFERENCE TO RELATED APPLICATION

The disclosure of Japanese Patent Application No. 2011-264733 filed on Dec. 2, 2011 including the specification, drawings and abstract is incorporated herein by reference in its entirety.

BACKGROUND

The present invention relates to a semiconductor device and a technique of manufacturing the same, particularly, to a through silicon via (TSV) technique that is required in manufacturing three-dimensional multifunctional devices in which heterogeneous devices are stacked vertically such as memory devices, a memory device and a logic device, or a micro electro mechanical system (MEMS).

Until now, in the manufacturing of semiconductor elements, a fine processing technology using photolithography has been used. However, presently, design dimensions of semiconductor elements become shorter than wavelengths of light to be used in the photolithography, and miniaturization of semiconductor elements by the photolithography approaches the limits. Therefore, in order to further improve the performance of semiconductor elements, a three-dimensional wiring technique, in which semiconductor chips are stacked vertically, attracts attention as a so-called "More Than Moore" technique.

Incidentally, as one of the most important techniques for realizing three-dimensional wiring, there is the TSV technique. The TSV technique is a technique of forming a through electrode passing through a silicon substrate vertically in a thickness direction. In the TSV technique, depending on timing for forming the through electrode, there are three systems: (1) a via first system (TSV is formed before forming semiconductor devices), (2) a via middle system (TSV is formed in the formation process of semiconductor devices), and (3) a via last system (TSV is formed after forming semiconductor devices).

Among these, since the via last system is easy to be introduced into the manufacturing process of a semiconductor device as compared with other systems, investigations into the practical application of the TSV technique by the via last system is actively performed. For example, a TSV technique by the via last system is described in Non-patent document 1 (P. Leduc, et al., "First integration of Cu TSV using die-to-wafer direct bonding and planarization," IEEE 3D System Integration Conference 2009).

SUMMARY

However, as to semiconductor devices adopting a TSV technique by the via last system, there exist technical problems as described below.

(1) A connection pad connected with a through electrode is formed, generally, by a damascene method. However, since a shape of the connection pad viewed from above is, for example, a tetragon having a side dimension of about 5 to 100 μm viewed from above, dishing is likely to be generated in chemical mechanical polishing (CMP) used in the damascene method. A connection pad in which the dishing has been generated leads to a defective shape of wiring to be formed on an upper layer thereof. As a result, there occurs a problem of lowering of the manufacturing yield of the semiconductor device.

(2) After a semiconductor element has been formed on a main surface of a silicon substrate and, when a through hole for forming a through electrode is formed in the silicon substrate and an interlayer insulating film covering the semiconductor element, the interlayer insulating film is exposed in the side surface of the through hole, and thus moisture, a metal ion, etc. intrude easily inside the interlayer insulating film. Consequently, there occurs a problem in which these cause the variation of operation characteristics of the semiconductor element to thereby lower the reliability of the semiconductor device.

The present invention has been made in view of the above circumstances and provides a technique capable of improving manufacturing yield and reliability of semiconductor devices adopting the TSV technique.

The other purposes and the new feature of the present invention will become clear from the description of the present specification and the accompanying drawings.

The following explains briefly the outline of a typical invention among the inventions disclosed in the present application.

The embodiment is a semiconductor device having a semiconductor substrate, a through hole passing through the semiconductor substrate from the front surface to the rear surface, a through electrode formed inside the through hole, an insulating film formed over the main surface of the semiconductor substrate, and a plurality of connection pads formed over the insulating film, in which the plurality of the connection pads are electrically coupled to the through electrode via a connection electrode formed inside a connection hole formed in the insulating film.

The embodiment is a method of manufacturing a semiconductor device including the steps of: forming a first insulating film over a surface of a semiconductor substrate; etching the first insulating film to form, respectively, a plurality of connection holes reaching a main surface of the semiconductor substrate in each of partitioned regions formed by partitioning a connection pad-forming region; embedding a first metal film inside the connection holes to form, respectively, a plurality of connection electrodes including the first metal film in each of partitioned regions; forming a second insulating film over the first insulating film and the connection electrodes; etching the second insulating film to form, respectively, trenches passing through the second insulating film from an upper surface to a lower surface in each of partitioned regions; embedding, respectively, a second metal film inside the trenches in each of partitioned regions to form, respectively, connection pads including the second metal film in each of partitioned regions; after subjecting the semiconductor substrate to a processing thinly from the rear surface, forming a through hole reaching the main surface in the semiconductor substrate; forming a third insulating film on a side surface of the through hole; and forming, inside the through hole, a through electrode electrically coupled to the connection pad in each of partitioned regions.

The following explains briefly the effect acquired by an embodiment of the typical invention among the inventions disclosed in the present application.

It is possible to improve the manufacturing yield and reliability of semiconductor devices adopting the TSV technique.

DETAILED DESCRIPTION

Figure 1:
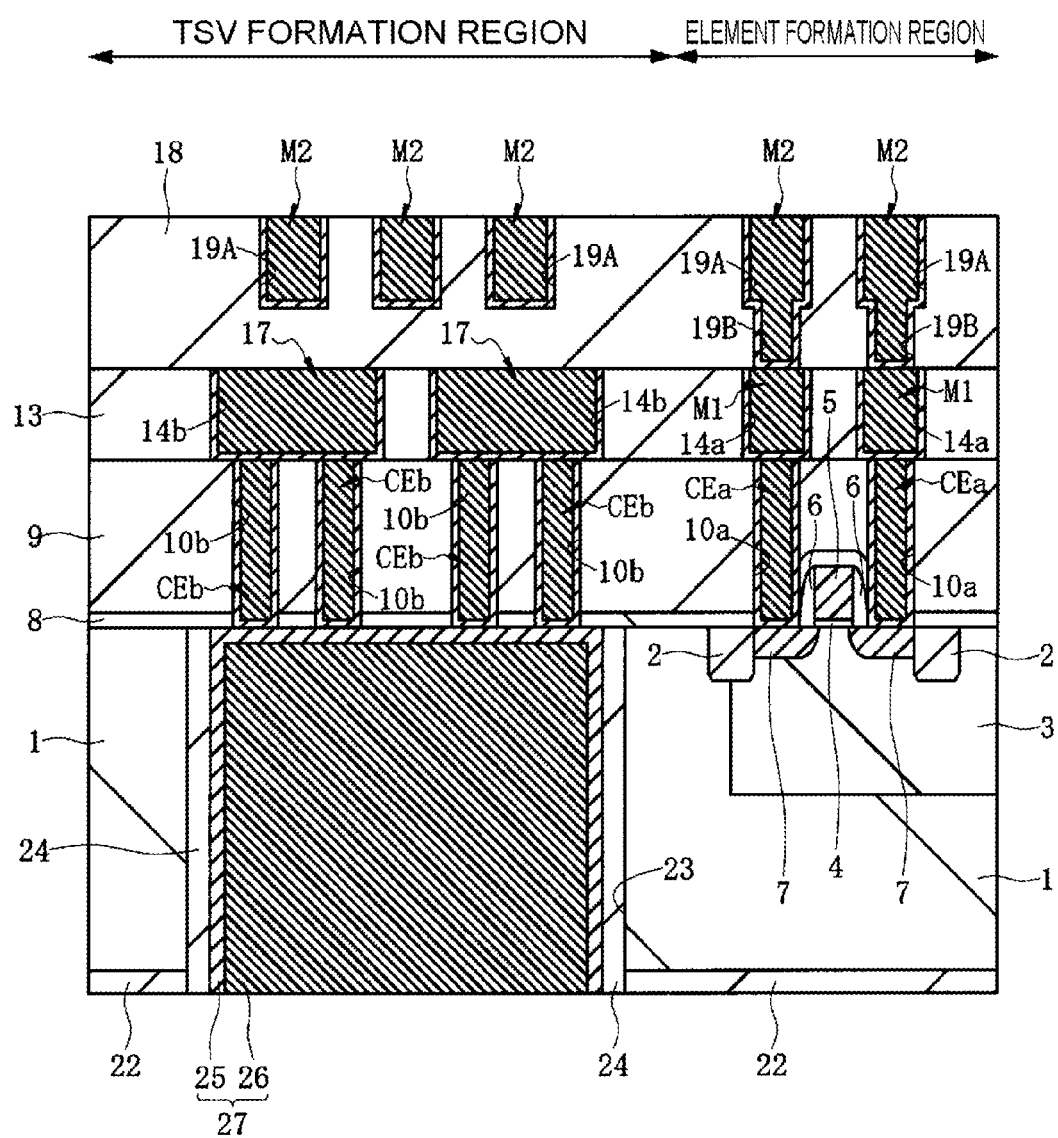
FIG. 1 is a principal part cross-sectional view showing a semiconductor device adopting the TSV technique by the via last system according to a First embodiment of the invention.

The following embodiments will be explained, divided into plural sections or embodiments, if necessary as a matter of convenience. Except for the case where it shows clearly in particular, they are not mutually unrelated and one has relationships such as a modification, details, and supplementary explanation of some or entire of another.

In addition, in the following embodiments, when referring to the number of elements, etc. (including the number, a numeric value, an amount, a range, etc.), they may be not restricted to the specific number but may be greater or smaller than the specific number, except for the case where they are clearly specified in particular and where they are clearly restricted to a specific number theoretically.

Furthermore, in the following embodiments, it is needless to say that an element (including an element step etc.) is not necessarily indispensable, except for the case where it is clearly specified in particular and where it is considered to be clearly indispensable from a theoretical point of view, etc. Similarly, in the following embodiments, when referring to shape, position relationship, etc. of an element etc., what resembles or is similar to the shape substantially shall be included, except for the case where it is clearly specified in particular and where it is considered to be clearly not right from a theoretical point of view. This statement also applies to the numeric value and range described above.

In addition, in the drawings for use in embodiments, in order to make a drawing intelligible, hatching may be attached even if it is a plan view. Furthermore, in the embodiments, a wafer denotes mainly a Si (silicon) single crystal wafer, but is not limited to it and shall denote an SOI (Silicon On Insulator) wafer, an insulating film substrate for forming an integrated circuit thereon, etc. The shape thereof is not limited to a circle or an approximate circle, but shall also include a square, a rectangle, etc. Moreover, in the embodiments below, the expression of a planner area intends the area of the upper surface of each of parts viewed from above.

Furthermore, in all the drawings for explaining embodiments, the same symbol is attached to ones having the same function, as a principle, and the repeated explanation thereof is omitted. Hereinafter, the embodiments of the invention will be explained in detail on the basis of the drawings.

First, because it is considered that the semiconductor device and the method of manufacturing the same, adopting the TSV technique by the via last system according to embodiments of the invention will become clearer, a method of manufacturing a semiconductor device adopting a TSV technique by the via last system before the application of the invention, which was examined by the inventor of the invention, will be explained below by using FIGS. 38 to 43. FIGS. 38 to 41 and FIG. 43 are principal part cross-sectional views of a semiconductor device in the process of manufacturing the semiconductor device, and show a region in which the connection pad and the through electrode are to be formed (hereinafter, referred to as a TSV-forming region) and a region in which a semiconductor element is to be formed (hereinafter, referred to as an element-forming region). In addition, FIG. 42 is a principal part top view of a region in which the connection pad and the through electrode are formed. In the element-forming region of semiconductor devices, various semiconductor elements such as a field-effect transistor, a resistive element and a capacitive element are formed, and, here, an n-channel type MISFET (Metal Insulator Semiconductor Field Effect Transistor), which represents a field-effect transistor, is exemplified. Furthermore, in the explanation below, an n-channel type MISFET is abbreviated as an nMISFET.

Figure 38:
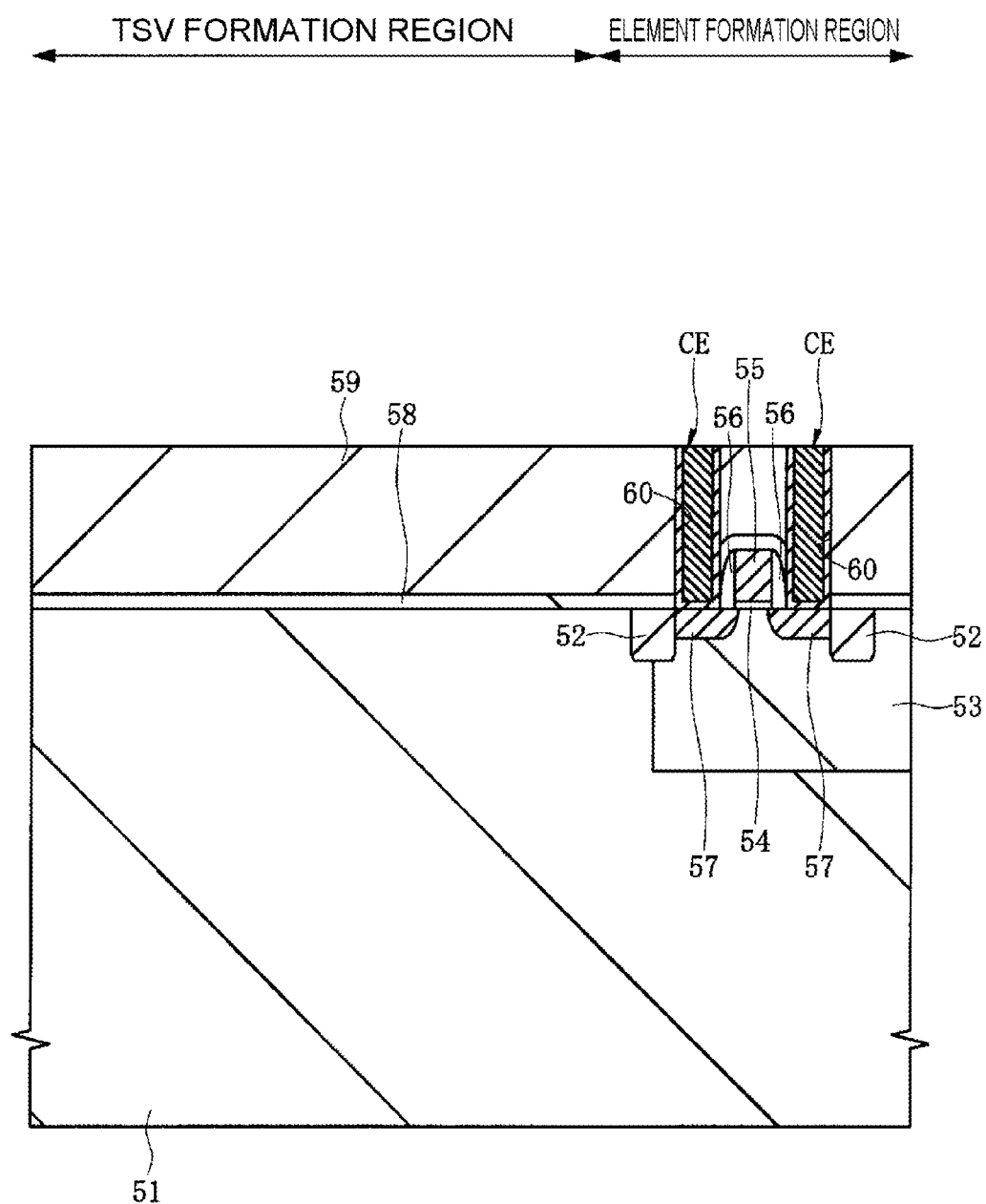
FIG. 38 is a principal part cross-sectional view showing a process of manufacturing a semiconductor device, which adopts the TSV technique by the via last system and was examined by the inventor of the application.

First, as shown in FIG. 38, a semiconductor substrate (a thin plate of a semiconductor in an approximately circular shape in a plane referred to as a wafer) 51 including, for example, single crystalline silicon is prepared. The thickness of the semiconductor substrate 51 is, for example, about 750 µm. Next, after forming an isolation part 52 including an insulating film in an element isolation region of a main surface (a front surface) of the semiconductor substrate 51, impurities showing a p-type electroconductivity are ion-implanted into the semiconductor substrate 51 in a region in which an nMISFET is to be formed, to thereby form a p-type well 53.

Next, after forming a gate insulating film 54 on the main surface of the semiconductor substrate 51, over the gate insulating film 54, a gate electrode 55 is formed, and, furthermore, on a side surface of the gate electrode 55, a sidewall 56 is formed. Subsequently, into p-type wells 53 on both sides of the gate electrode 55, impurities showing an n-type electroconductivity are ion-implanted to form n-type semiconductor regions 57 that function as source/drain, in a self-alignment manner relative to the gate electrode 55 and the sidewall 56.

Then, after forming sequentially a stopper insulating film 58 and an interlayer insulating film 59 over the main surface of the semiconductor substrate 51, the interlayer insulating film 59 and the stopper insulating film 58 are processed sequentially by dry etching using a resist pattern as a mask, to form a connection hole 60. The stopper insulating film 58 is a film serving as an etching stopper when processing the interlayer insulating film 59, and is formed by using a material having an etching selection ratio relative to the interlayer insulating film 59. The connection hole 60 is formed in necessary parts such as over the n-type semiconductor region 57. Subsequently, inside the connection hole 60, a connection electrode CE including a metal film is formed.

Next, by a single-damascene method, a first layer wiring is formed in the element-forming region, and the connection pad is formed in the TSV-forming region.

Figure 39:
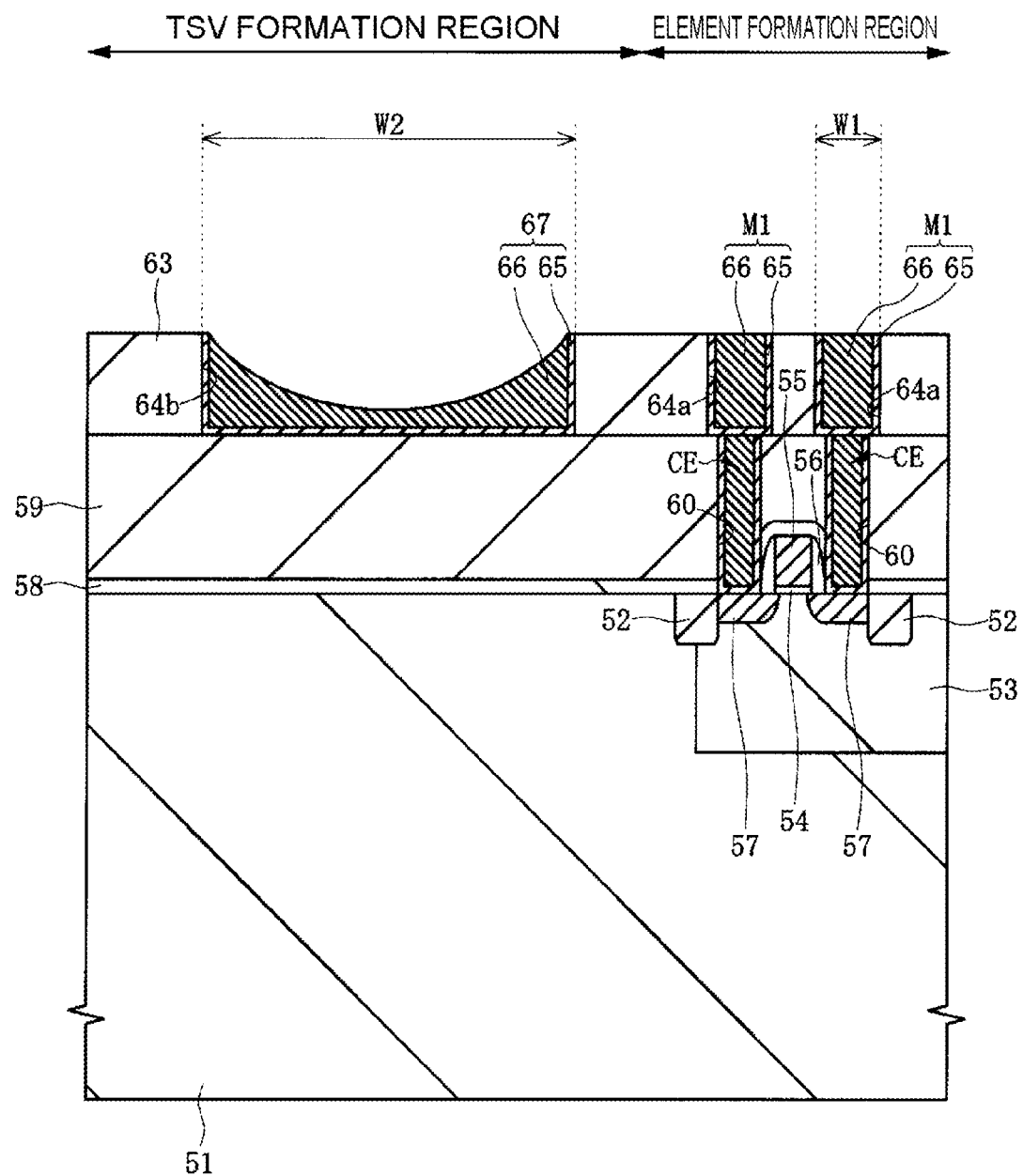
FIG. 39 is a principal part cross-sectional view of the same place as in FIG. 38 in the process of manufacturing the semiconductor device, following FIG. 38.

First, as shown in FIG. 39, after forming an interlayer insulating film 63 over the main surface of the semiconductor substrate 51, the interlayer insulating film 63 is dry-etched using a resist pattern as a mask, to thereby form a trench 64a for forming wiring, passing through the interlayer insulating film 63 from the upper surface to the lower surface in a region in which the first layer wiring is to be formed in a later process. Simultaneously, there is formed a trench 64b for forming the connection pad, which passes through the interlayer insulating film 63 from the upper surface to the lower surface and has a tetragonal shape viewed from above, in a region in which the connection pad is to be formed in a later process.

Then, after forming a barrier metal film 65 over the main surface of the semiconductor substrate 51, over the barrier metal film 65, a seed layer of copper (Cu) (illustration is omitted) is formed, and, furthermore, over the seed layer, a Cu plating film 66 is formed using an electrolytic plating method. With the Cu plating film 66, the inside of the trench 64a for forming wiring and the inside of the trench 64b for forming the connection pad are embedded.

Next, the Cu plating film 66, the seed layer and the barrier metal film 65 in regions other than the inside of the trench 64a for forming wiring and the inside of the trench 64b for forming the connection pad are removed by a CMP method to form a first layer wiring M1 including a Cu film as a main conductor inside the trench 64a for forming wiring. Simultaneously, a connection pad 67 including a Cu film as a main conductor is formed inside the trench 64b for forming the connection pad.

Incidentally, a wiring width (W1) of the first layer wiring M1 is, for example, about 0.1 μm, but the dimension (W2) of a side of the connection pad 67 is, for example, about 5 to 100 μm. Therefore, the connection pad 67 has a relatively large planar area. Consequently, when removing the Cu plating film 66, the seed layer and the barrier metal film 65 by a CMP method, there is generated a phenomenon in which the central part of the connection pad 67 becomes thinner than the peripheral part, so-called dishing.

Then, by a dual-damascene method, a second layer wiring is formed in the element-forming region and the TSV-forming region.

Figure 40:
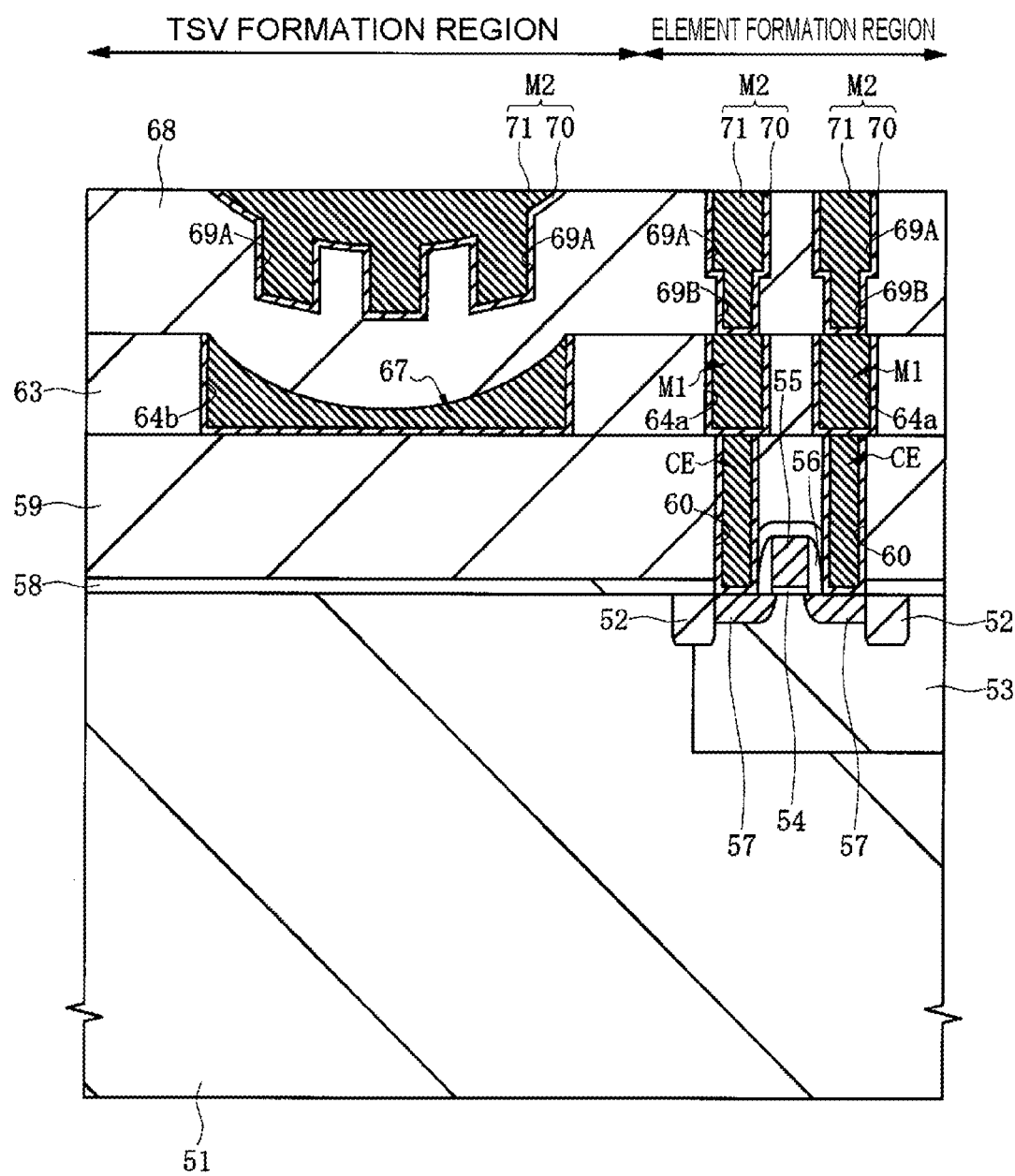
FIG. 40 is a principal part cross-sectional view of the same place as in FIG. 38 in the process of manufacturing the semiconductor device, following FIG. 39.

First, as shown in FIG. 40, an interlayer insulating film 68 is formed over the main surface of the semiconductor substrate 51, for example, by a plasma chemical vapor deposition (CVD) method. The interlayer insulating film 68 is formed after each surface shape of the interlayer insulating film 63, the first layer wiring M1 and the connection pad 67 that are lower layers thereof. Consequently, the surface of the interlayer insulating film 68 positioned directly above the connection pad 67 in which dishing has been generated becomes more depressed than surfaces of the interlayer insulating film 68 positioned in other regions. Subsequently, the interlayer insulating film 68 is dry-etched by using a resist pattern as a mask, to thereby form a trench 69A for forming wiring in a region in which the second layer wiring is to be formed in a later process, and, furthermore, to form a connection hole 69B in a part connecting the trench 69A for forming wiring with the first layer wiring M1.

Next, after forming a barrier metal film 70 over the main surface of the semiconductor substrate 51, over the barrier metal film 70, a seed layer of Cu (illustration is omitted) is formed, and, furthermore, over the seed layer, a Cu plating film 71 is formed using an electrolytic plating method. With the Cu plating film 71, the inside of the trench 69A for forming wiring and the inside of the connection hole 69B are embedded.

Then, the Cu plating film 71, the seed layer and the barrier metal film 70 in regions other than the inside of the trench 69A for forming wiring and the inside of the connection hole 69B are removed by a CMP method, to thereby form a second layer wiring M2 including a Cu film as a main conductor inside the trench 69A for forming wiring, and to form a connection member formed integral with the second layer wiring M2 inside the connection hole 69B.

However, when the second layer wiring M2 is formed directly above the connection pad 67 in which dishing has been generated, even if the Cu plating film 71, the seed layer and the barrier metal film 70 are removed by a CMP method, the Cu plating film 71, the seed layer and the barrier metal film 70 are left in a concavity existing on the surface of the interlayer insulating film 68, to thereby link adjacent second layer wirings M2. Consequently, in the second layer wiring M2, a short-circuit defect is generated.

Next, a through electrode is formed.

Figure 41:
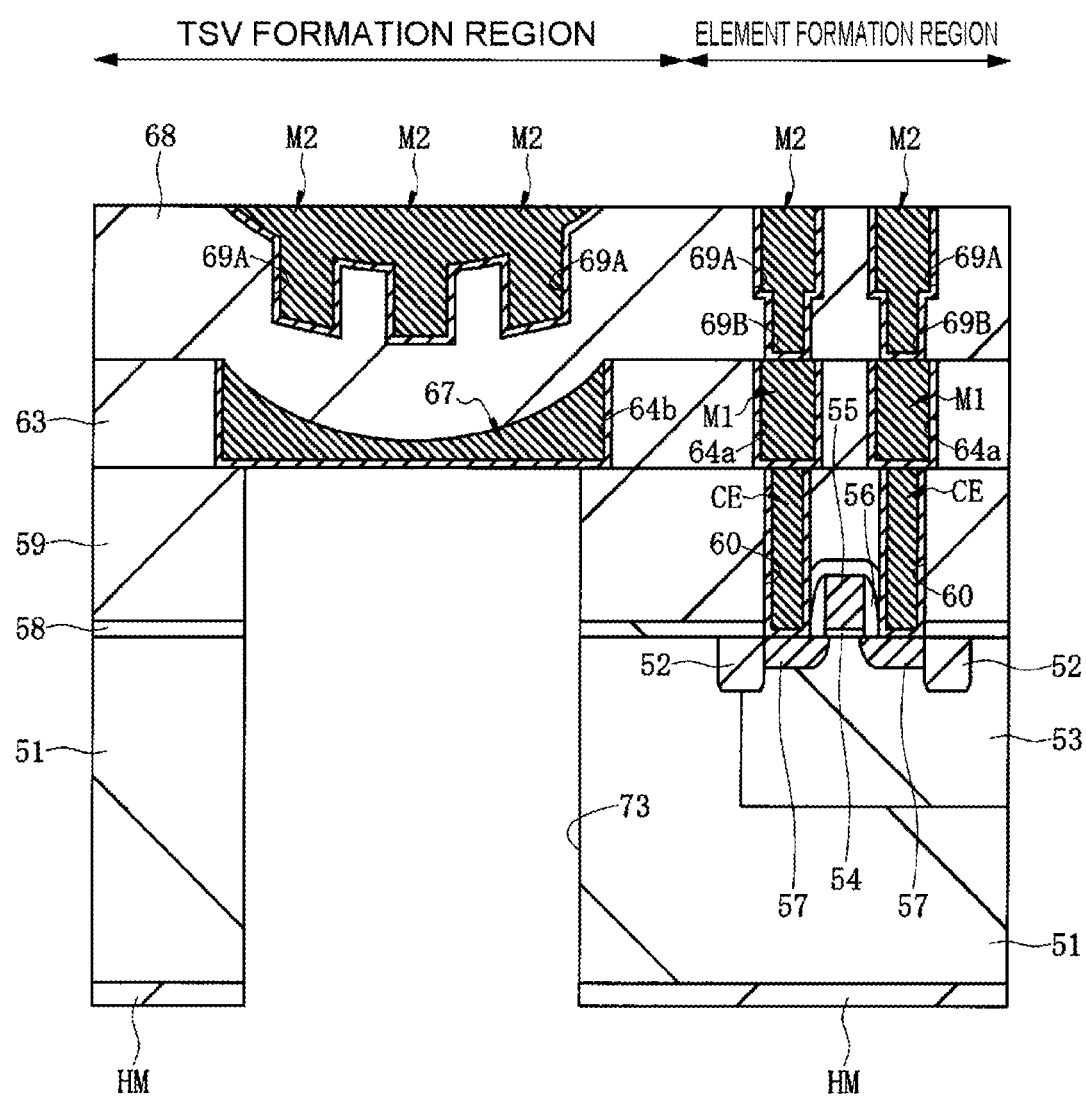
FIG. 41 is a principal part cross-sectional view of the same place as in FIG. 38 in the process of manufacturing the semiconductor device, following FIG. 40.
Figure 42:
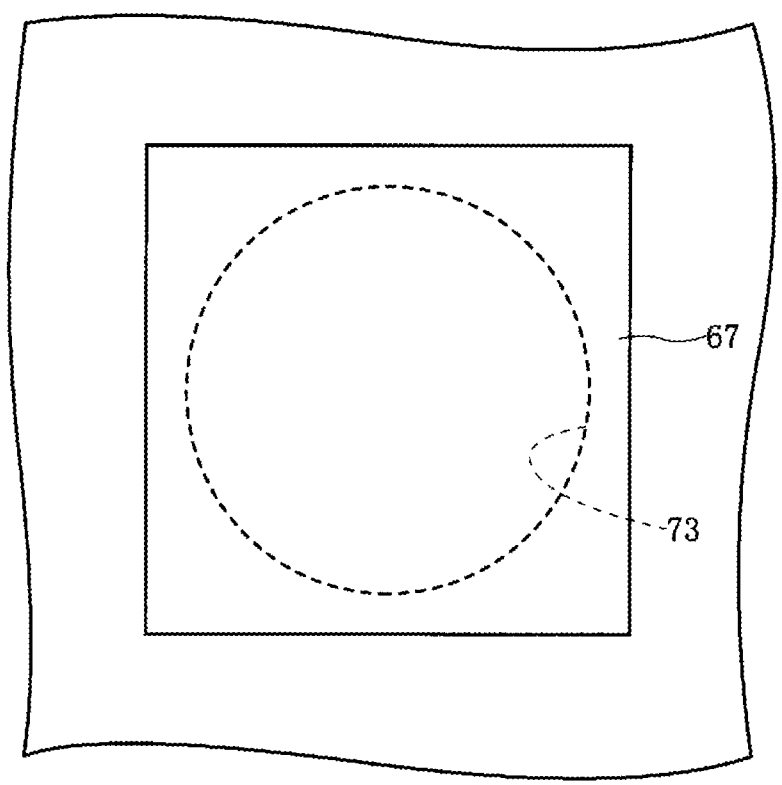
FIG. 42 is a principal part top view of a region in which the connection pad and the through electrode having been examined by the inventor of the application are formed.

First, as shown in FIG. 41, by polishing the rear surface of the semiconductor substrate 51, which is the surface opposite to the main surface, the thickness of the semiconductor substrate 51 is set to, for example, not more than 100 μm. Subsequently, after forming a hard mask HM on the rear surface of the semiconductor substrate 51, from the rear surface of the semiconductor substrate 51, the semiconductor substrate 51, the stopper insulating film 58 and the interlayer insulating film 59 are dry-etched sequentially to form a through hole 73 that reaches the connection pad 67. As shown in FIG. 42, the through hole 73 is formed so that the connection pad 67 and the through hole 73 overlap with each other when viewed from above, and so that the planar area of the through hole 73 is smaller than the planar area of the connection pad 67, in consideration of the positioning margin of the two.

Here, in the side surface of the through hole 73, the interlayer insulating film 59 is exposed. Consequently, from the interlayer insulating film 59 exposed in the side surface of the through hole 73, moisture ($H_2O$), a metal ion such as a sodium ion ($Na^+$) or potassium ion ($K^+$), etc. may possibly intrude into the element-forming region, to thereby vary operation characteristics of an nMISFET formed on the main surface of the semiconductor substrate 51.

Figure 43:
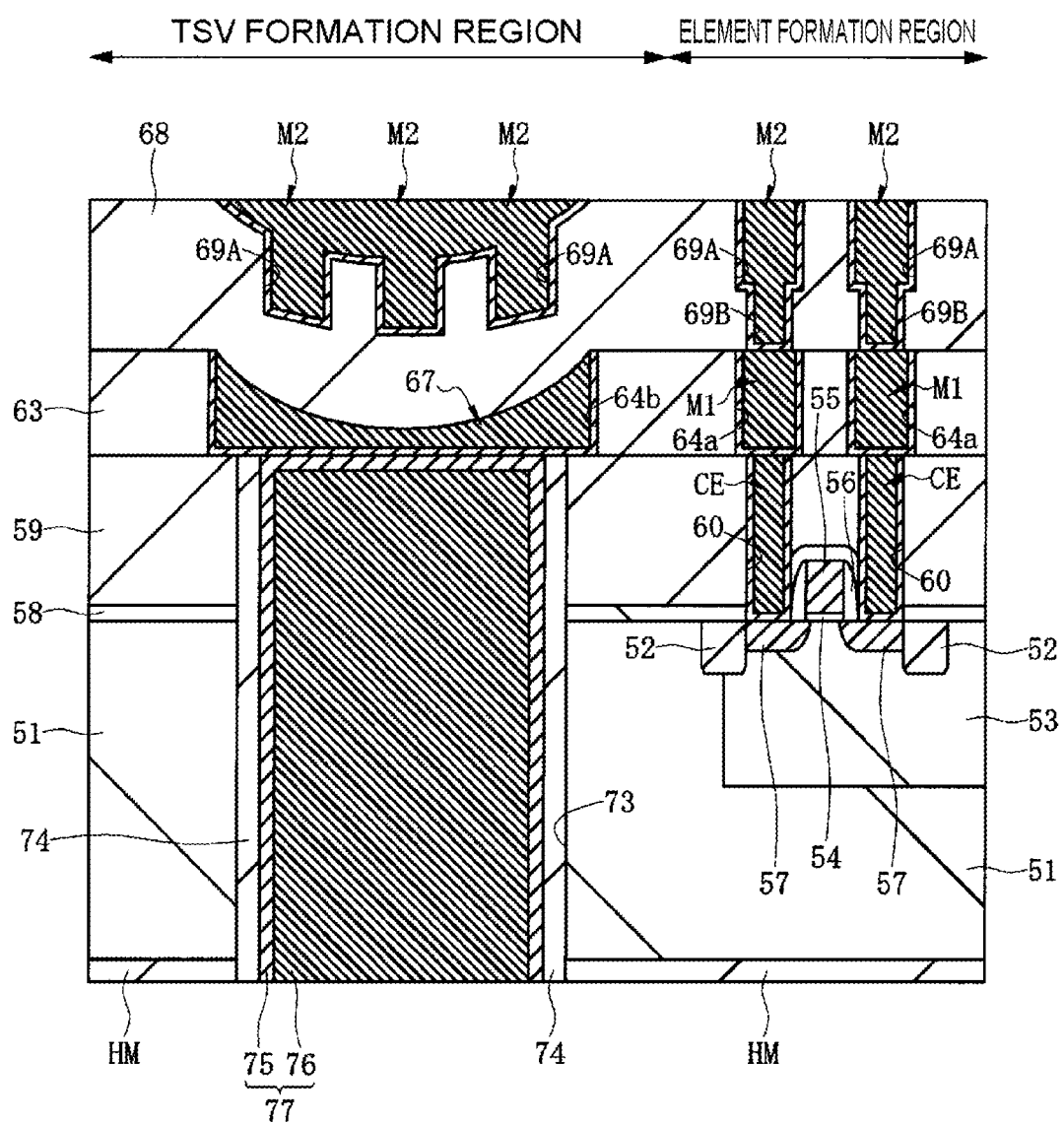
FIG. 43 is a principal part cross-sectional view of the same place as in FIG. 38 in the process of manufacturing the semiconductor device, following FIG. 41.

Next, as shown in FIG. 43, on the side surface of the through hole 73, an insulating film 74 is formed. Then, after forming a barrier metal film 75 over the rear surface of the semiconductor substrate 51, over the barrier metal film 75, a seed layer of Cu (illustration is omitted) is formed, and, furthermore, over the seed layer, a Cu plating film 76 is formed using an electrolytic plating method. After that, the Cu plating film 76, the seed layer and the barrier metal film 75 in regions other than the inside of the through hole 73 are removed by a CMP method to form a through electrode 77 including a Cu film as a main conductor inside the through hole 73.

As described above, in the method of manufacturing a semiconductor device adopting the TSV technique by the via last system before the application of the invention, the short-circuit defect occurs in the second layer wiring M2 formed directly above the connection pad 67 in which dishing is generated via the interlayer insulating film 68. Furthermore, operation characteristics of such a semiconductor element as an nMISFET formed over the main surface of the semiconductor substrate 51 vary by moisture, a metal ion or the like that intrudes into the element-forming region from the interlayer insulating film 59 exposed in the side surface of the through hole 73.

First Embodiment

Figure 2:
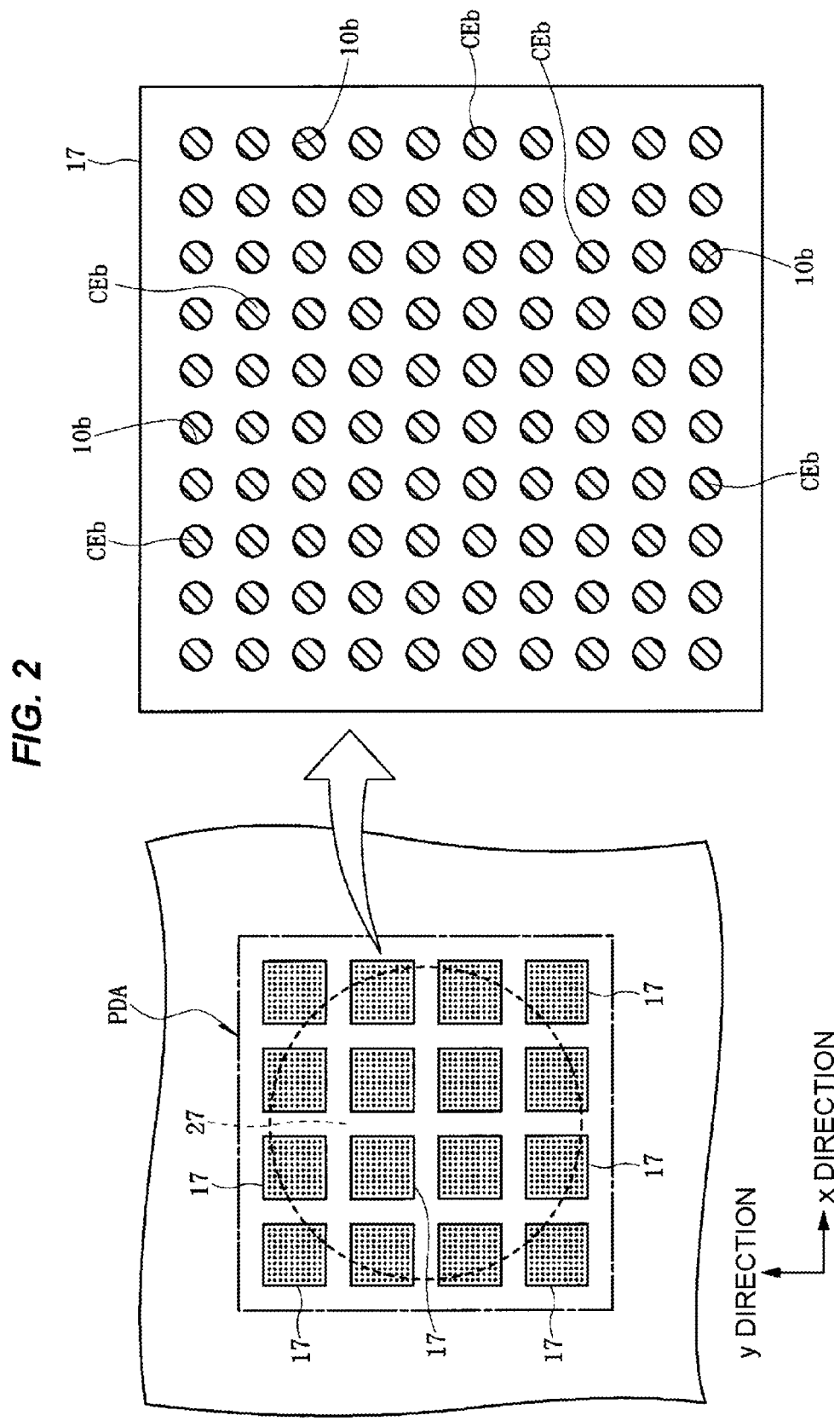
FIG. 2 is a principal part top view of a region in which a connection pad and a through electrode according to the First embodiment of the invention are formed.

The semiconductor device provided with the TSV according to the First embodiment will be explained by using FIGS. 1 and 2. FIG. 1 is a principal part cross-sectional view of the semiconductor device, and FIG. 2 is a principal part top view of the region in which the connection pad and the through electrode are formed. In the semiconductor device, there are provided, in regions different from each other, a region (an element-forming region) in which various semiconductor elements such as a field-effect transistor, a resistive element and a capacitive element are formed, and a region (a TSV-forming region) in which the connection pad and the through electrode are formed. In FIG. 1, an nMISFET representing a field-effect transistor is illustrated, among various semiconductor elements formed in the element-forming region. Moreover, in FIG. 1, as a matter of convenience, only a part of connection electrodes connected to the through electrode and a part of connection pads connected to the connection electrode are illustrated.

First, the configuration of the nMISFET formed in the element-forming region will be explained by using FIG. 1.

As shown in FIG. 1, on the main surface (the front surface, first main surface) of the semiconductor substrate 1 in the element-forming region, an isolation part 2, in which an insulating film is embedded inside an isolation trench, is formed, and the isolation part 2 defines an active region in which the nMISFET is to be formed. The thickness of the semiconductor substrate 1 is, for example, not more than 100 μm. On the main surface of the semiconductor substrate 1, a p-type well 3 is formed, and, in the region in which the p-type well 3 is formed, the nMISFET is formed. Over the main surface of the semiconductor substrate 1, a gate electrode 5 is formed via a gate insulating film 4 of the nMISFET. The gate insulating film 4 includes, for example, a silicon oxide film formed by a thermal oxidation method, and the gate electrode 5 includes, for example, a polycrystalline silicon film formed by a CVD method.

On the side surface of the gate electrode 5 of the nMISFET, a sidewall 6 is formed. The sidewall 6 includes, for example, a silicon oxide film or a silicon nitride film. Moreover, in p-type wells 3 on both sides of the gate electrode 5 of the nMISFET, n-type semiconductor regions 7 functioning as source/drain are formed with a channel region interposed therebetween.

Furthermore, the nMISFET is covered with a stopper insulating film 8 and an interlayer insulating film 9. The stopper insulating film 8 includes, for example, a silicon nitride film. Moreover, the interlayer insulating film 9 includes, for example, a silicon oxide film, and the surface thereof is flattened. In the stopper insulating film 8 and the interlayer insulating film 9, a connection hole (illustration is omitted) reaching the gate electrode 5 and a connection hole 10a reaching the n-type semiconductor region 7 are formed. The connection hole 10a is in a columnar shape having a diameter set to be the same as or smaller than the line width of the first layer wiring M1, for example, about 0.06 μm. Inside the connection hole 10a, a connection electrode CEa including a metal film is formed.

Over the connection electrode CEa, a first layer wiring M1 including, for example, a Cu film as a main conductor is formed, connected with the connection electrode CEa, by a single damascene method. That is, the first layer wiring M1 is formed by forming a trench 14a for forming wiring in the interlayer insulating film 13 deposited over the connection electrode CEa and the interlayer insulating film 9, and by embedding the inside thereof with a Cu film. The line width of the first layer wiring M1 is, for example, about 0.1 μm.

Furthermore, over the first layer wiring M1, the second layer wiring M2 including, for example, a Cu film as a main conductor is formed being connected to the first layer wiring M1 via a connection member, by a dual damascene method. That is, the second layer wiring M2 is formed by forming a trench 19A for forming wiring in the interlayer insulating film 18 deposited over the first layer wiring M1 and the interlayer insulating film 13, furthermore forming a connection hole 19B in a part connecting the trench 19A for forming wiring and the first layer wiring M1, and embedding a Cu film into the inside thereof. Inside the connection hole 19B, a connection member formed integral with the second layer wiring M2 is formed.

In addition, over the second layer wiring M2, wirings of upper layers, for example, a third layer to a sixth layer wirings are formed, but illustration thereof is omitted.

Next, the configuration of the TSV formed in the TSV-forming region will be explained by using FIGS. 1 and 2.

As shown in FIGS. 1 and 2, in the semiconductor substrate 1 in the TSV-forming region, a through hole 23 passing through the semiconductor substrate 1 is formed. Generally, the through hole 23 having a diameter, for example, of about 5 to 100 μm is formed, and, in the First embodiment it is set to about 5 μm. On the side surface and the bottom surface of the through hole 23, a barrier metal film 25 is formed, and, furthermore, inside the through hole 23, a Cu plating film 26 is formed. Therefore, the barrier metal film 25 and the Cu plating film 26 constitute a through electrode 27. The barrier metal film 25 includes, for example, a titanium nitride (TiN) film, a tantalum (Ta) film, a tantalum nitride (TaN) film or the like.

On the rear surface (a second main surface) of the semiconductor substrate 1, an insulating film 22 is formed. The insulating film 22 functions as a hard mask when forming the through hole 23 in the semiconductor substrate 1, and also functions as a protective film that prevents metal pollution from the rear surface of the semiconductor substrate 1. Moreover, between the through electrode 27 and the semiconductor substrate 1, an insulating film 24 is formed. The insulating film 24 functions as a protective film that prevents metal pollution from the through electrode 27. In addition, the insulating film 24 also fulfills the function of insulating and separating the through electrode 27 and the semiconductor substrate 1. The thickness of insulating films 22 and 24 is, for example, about 0.5 μm.

In FIG. 2, a region surrounded by a dashed one-dotted line is a region PDA in which the connection pat 17 to be electrically coupled to the through electrode 27 is to be formed (hereinafter, referred to as a connection pad-forming region). In the First embodiment, the connection pad-forming region PDA in a tetragonal shape having a side dimension of about 7 μm viewed from above is illustrated, and the connection pad-forming region PDA and the through electrode 27 overlap with each other when viewed from above. However, in the connection pad-forming region PDA, not one connection pad is arranged for the whole surface of the connection pad-forming region PDA (see aforementioned FIG. 42), but the connection pad-forming region PDA is partitioned into a plurality of regions and a connection pad 17 is arranged, spaced apart from an adjacent connection pad 17 in each of partitioned regions. In the First embodiment, a mode in which the connection pad-forming region PDA is partitioned into 16 (into 4 in a first direction (the x direction shown in FIG. 2) and into 4 in a second direction orthogonal to the first direction (the y direction shown in FIG. 2)) and connection pads 17 are arranged respectively in each of partitioned regions, is illustrated. The shape of the connection pad 17 viewed from above is, for example, a tetragon having a side dimension of about 1 μm, and intervals between adjacent connection pads 17 are, for example, about 0.5 μm.

The connection pad 17 is formed in the same process as that for the first layer wiring M1 by using a single damascene method. That is, the connection pad 17 is formed by forming the trench 14b for forming a connection pad in the interlayer insulating film 13 and embedding the inside thereof with a Cu film. However, the connection pad-forming region PDA is partitioned into a plurality of regions, and, in each of partitioned regions, trenches 14b for forming a connection pad having a planar area that hardly allows the dishing to be generated are formed respectively. Since the inside of the trench 14b for forming a connection pad thus formed is embedded with a Cu film, the dishing to be generated in the connection pad 17 is lightened as compared with a case where one connection pad is formed on the whole surface of the connection pad-forming region PDA, and the surface of the pad 17 is approximately flat.

Furthermore, over the connection pad 17, the second layer wiring M2 is formed using a dual damascene method in the same manner as in the element-forming region. That is, the second layer wiring M2 is formed by forming the trench 19A for forming wiring in the interlayer insulating film 18, and embedding the inside thereof with a Cu film. However, since the surface of the connection pad 17 is approximately flat, the surface of the interlayer insulating film 18 is also approximately flat. Accordingly, in the TSV-forming region, the short-circuit defect between adjacent second layer wirings M2 can be prevented, which allows avoidance of lowering manufacturing yield of semiconductor devices caused by the dishing of the connection pad 17.

Furthermore, each of connection pads 17 is electrically coupled to the through electrode 27, but is not directly coupled to the through electrode 27. It is electrically coupled to the through electrode 27 via the connection electrode CEb formed inside the connection hole 10b for a through electrode formed in the stopper insulating film 8 and the interlayer insulating film 9.

That is, over the main surface of the semiconductor substrate 1 in the TSV-forming region, the stopper insulating film 8 and the interlayer insulating film 9 are formed, in the same manner as in the aforementioned element-forming region. Furthermore, in the stopper insulating film 8 and the interlayer insulating film 9, a plurality of connection holes 10b for a through electrode reaching the through electrode 27 are formed, and, inside each of connection holes 10b for a through electrode, connection electrodes CEb including a metal film are formed, respectively.

The connection hole 10b for a through electrode has a columnar shape in the same manner as the connection hole 10a formed in the element-forming region, and the shape thereof viewed from above is circular. In addition, the diameter of the connection hole 10b for a through electrode is the same as the diameter of the connection hole 10a formed in the element-forming region, and is set, for example, to be the same as or smaller than the line width of the first layer wiring M1. In the First embodiment, for example, the line width of the first layer wiring M1 is set to be about 0.1 μm, and diameters of the connection hole 10a and the connection hole 10b for a through electrode are set to be about 0.06 μm. Here, the diameter of the connection hole 10a formed in the element-forming region and the diameter of the connection hole 10b for a through electrode formed in the TSV-forming region are set to be the same, but diameters may be different from each other.

As described above, in the interlayer insulating film 9, no through hole 23 for forming the through electrode 27 is formed. Accordingly, it is possible to prevent $H_2O$, a metal ion such as $Na^+$ or $K^+$, etc. from intruding into the element-forming region from the through hole 23 via the interlayer insulating film 9. Consequently, the variation of operation characteristics of the nMISFET can be suppressed, which allows avoidance of lowering reliability of the semiconductor device.

Incidentally, as shown in FIG. 2, in the TSV-forming region, the connection pad 17 in a tetragonal shape having a side dimension of about 1 μm viewed from above is illustrated. Furthermore, the connection electrode CEb in a circular shape having a diameter of about 0.06 μm viewed from above and having the same dimension in the first and second directions is illustrated. However, the shape of the connection pad 17 and the shape of the connection electrode CEb are not limited to these.

FIGS. 3 to 6 show modifications of the TSV included in the semiconductor device according to the First embodiment. Each of FIGS. 3, 4, 5 and 6 shows a principal part top view of the TSV-forming region showing a first modification, a second modification, a third modification and a fourth modification of the TSV, respectively.

Figure 3:
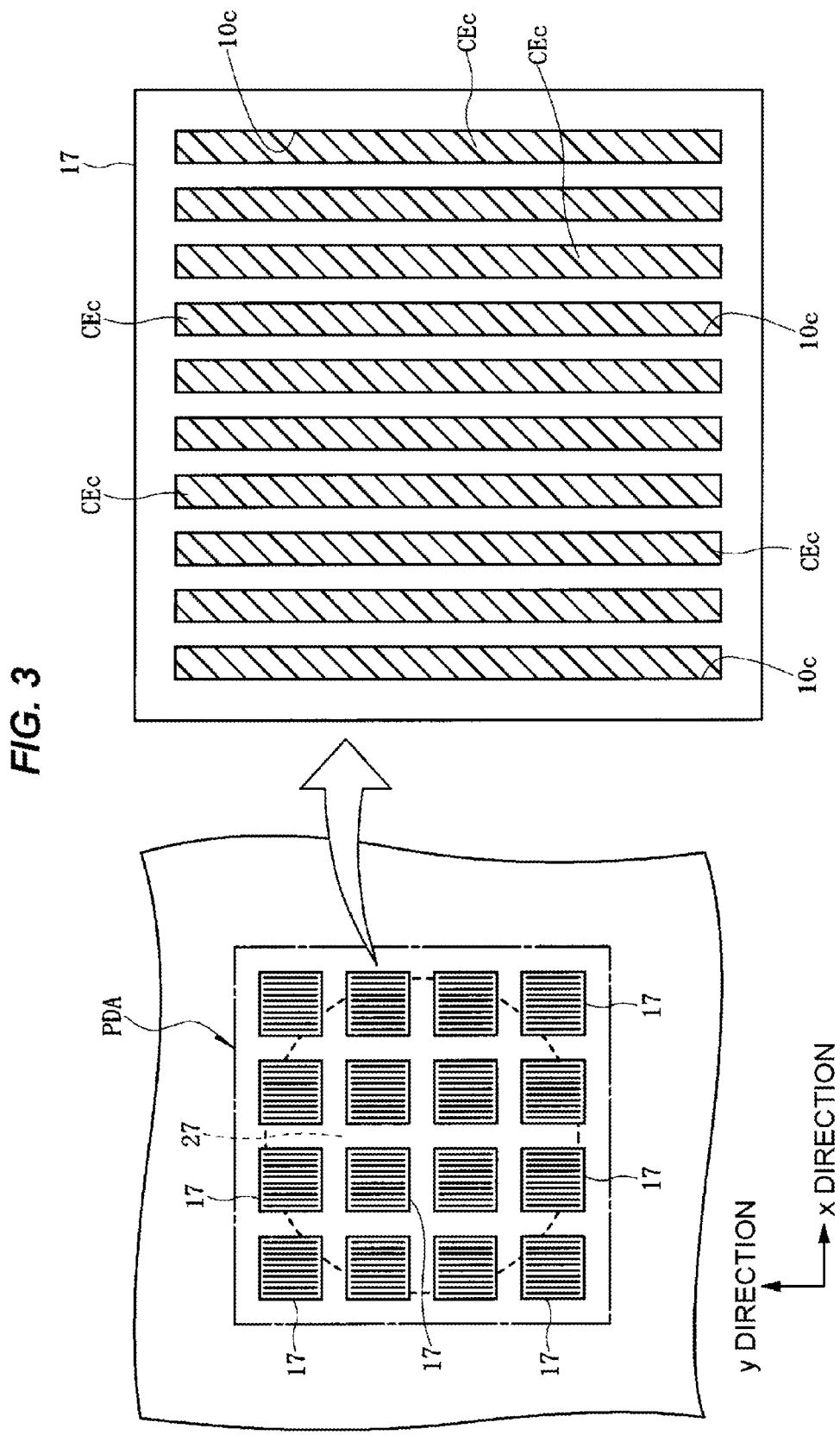
FIG. 3 is a principal part top view explaining a modification of the connection electrode connecting the connection pad and the through electrode according to the First embodiment of the invention.

First, by using FIG. 3, the first modification will be explained. FIG. 3 shows a modification of the connection electrode (the connection hole for a through electrode). The shape of the connection pad 17 viewed from above is, as described previously, for example, a tetragon having a side dimension of about 1 μm.

A connection hole 10c for a through electrode has a shape of a trench extending along the second direction (the y direction shown in FIG. 3) in constant width. The width of the connection hole 10c for a through electrode is, for example, about 0.05 μm. A plurality of connection holes 10c for a through electrode having such a shape as a trench is arranged, spaced apart from each other along the first direction (the x direction shown in FIG. 3) orthogonal to the second direction. Inside the connection hole 10c for a through electrode, a connection electrode CEc is formed. Accordingly, there is formed a plurality of connection electrodes CEc having a shape in which the dimension in the second direction is larger than the dimension in the first direction viewed from above. Meanwhile, a plurality of connection holes for a through electrode extending along the first direction (the x direction shown in FIG. 3) in constant width may be arranged along the second direction (the y direction shown in FIG. 3).

Figure 4:
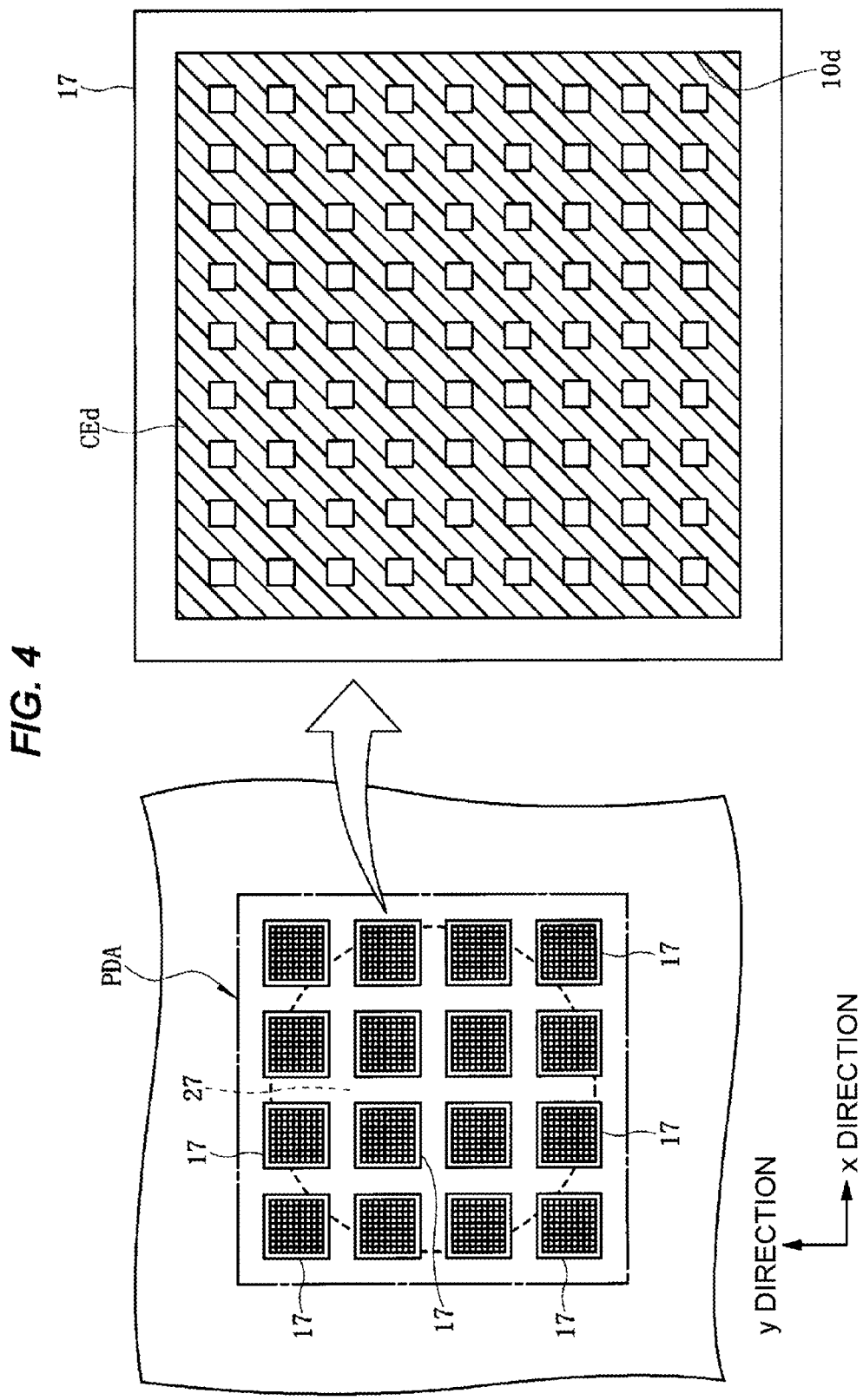
FIG. 4 is a principal part top view explaining another modification of the connection electrode connecting the connection pad and the through electrode according to the First embodiment of the invention.

Then, by using FIG. 4, the second modification will be explained. FIG. 4 shows another modification of the connection electrode (the connection hole for a through electrode). The shape of the connection pad 17 viewed from above is, as described previously, a tetragon having a side dimension, for example, of about 1 μm.

A connection hole 10d for a through electrode has a shape of a lattice-type trench formed by the crossing of a plurality of trenches that extends along the first direction (the x direction shown in FIG. 4) in constant width and that is arranged, spaced apart from each other, in the second direction (the y direction shown in FIG. 4) orthogonal to the first direction, and a plurality of trenches that extends along the second direction in constant width and that is arranged, spaced apart from each other, in the first direction. The width of the trench is, for example, 0.05 μm. Inside the connection hole 10d for a through electrode, a connection electrode CEd is formed. Accordingly, a lattice-type connection electrode CEd viewed from above is formed.

Figure 5:
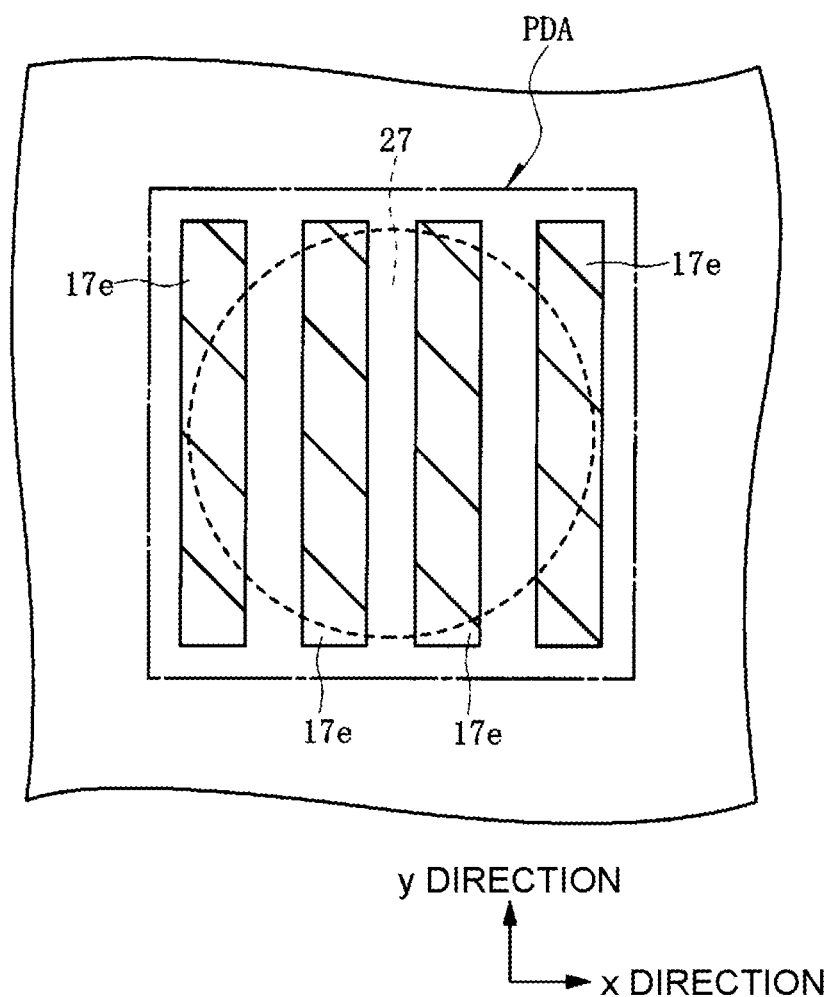
FIG. 5 is a principal part top view explaining a modification of the connection pad according to the First embodiment of the invention.

Next, by using FIG. 5, the third modification will be explained. FIG. 5 shows a modification of the connection pad.

A connection pad 17e has a shape extending along the second direction (the y direction shown in FIG. 5) in constant width viewed from above. The width of the connection pad 17e is, for example, about 1 μm. A plurality of (four in the third modification) connection pads 17e having such a shape is arranged, spaced apart from each other along the first direction (the x direction shown in FIG. 5) orthogonal to the second direction. Meanwhile, a plurality of connection pads extending along the first direction (the x direction shown in FIG. 5) in constant width viewed from above may be arranged along the second direction (the y direction shown in FIG. 5).

The connection pad 17e is electrically coupled to the through electrode 27 via a connection electrode, for example, in a columnar shape having a diameter of about 0.06 μm.

Figure 6:
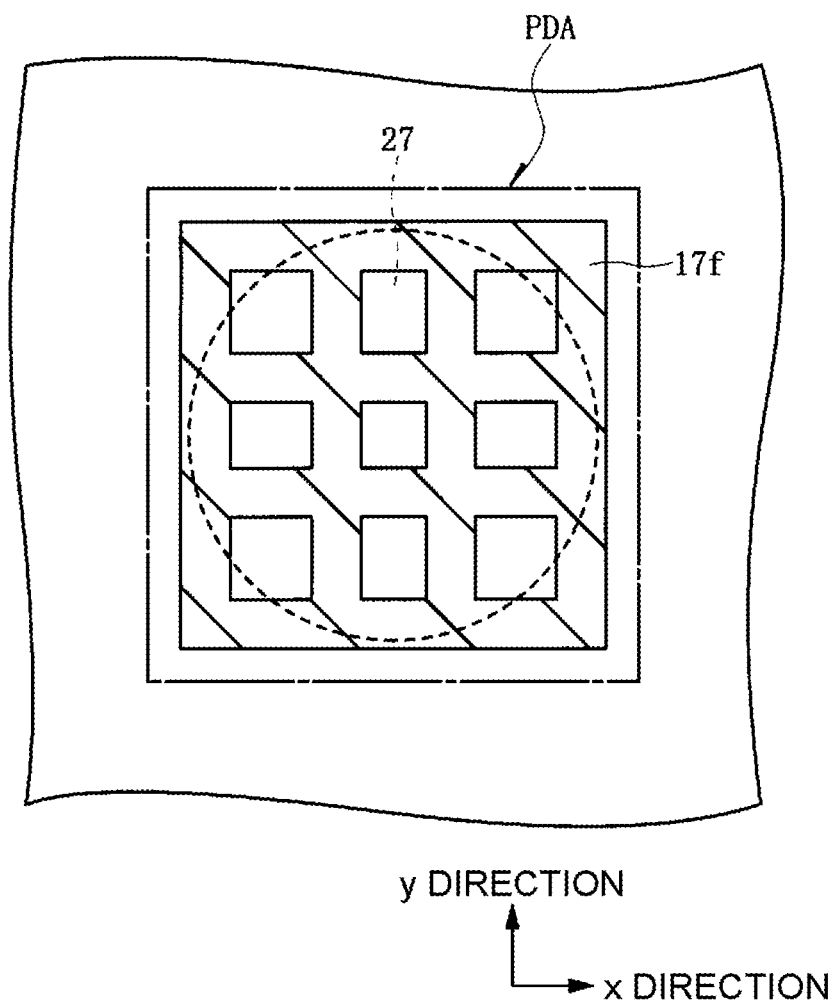
FIG. 6 is a principal part top view explaining another modification of the connection pad according to the First embodiment of the invention.

Then, by using FIG. 6, the fourth modification will be explained. FIG. 6 shows another modification of the connection pad.

A connection pad 17f has a lattice-type shape formed by the crossing of a plurality of parts that extend along the first direction (the x direction shown in FIG. 6) in constant width viewed from above and that are arranged, spaced apart from each other, in the second direction (the y direction shown in FIG. 6) orthogonal to the first direction, and a plurality of parts that extend along the second direction in constant width viewed from above and that are arranged, spaced apart from each other, in the first direction. The width is, for example, about 1 μm.

The connection pad 17f is electrically coupled to the through electrode 27 via a connection electrode, for example, in a columnar shape having a diameter of about 0.06 μm.

Next, a method of manufacturing a semiconductor device adopting the TSV technique by the via last system according to the First embodiment will be explained in order of processes by using FIGS. 7 to 14. FIGS. 7 to 14 are principal part cross-sectional views of a semiconductor device in a process of manufacturing the semiconductor device, and show a part of the element-forming region, and the TSV-forming region. Moreover, in element-forming regions in FIGS. 7 to 14, an nMISFET is illustrated as a semiconductor element.

Figure 7:
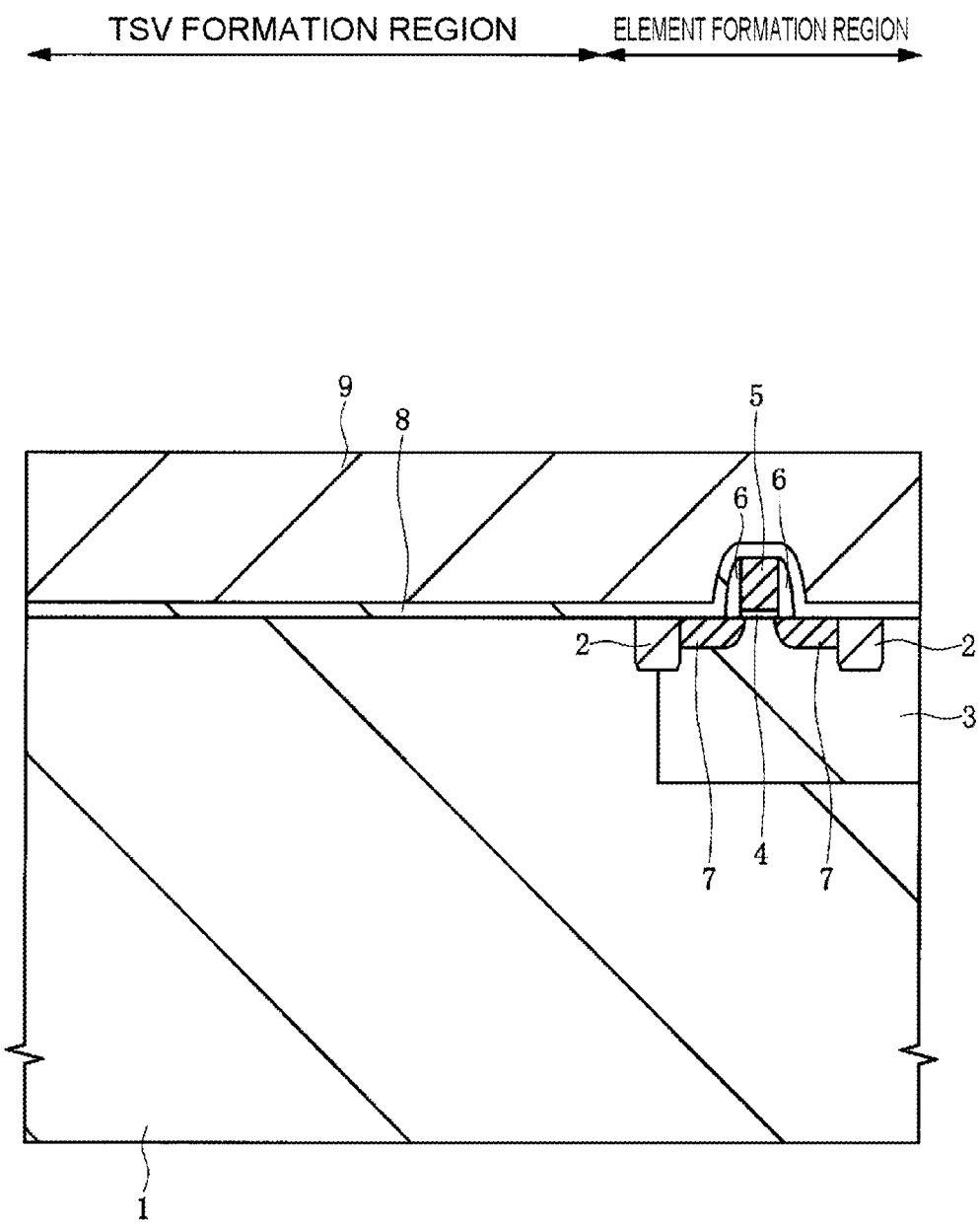
FIG. 7 is a principal part cross-sectional view showing a process of manufacturing a semiconductor device, adopting the TSV technique by the via last system according to the First embodiment of the invention.

First, as shown in FIG. 7, there is prepared the semiconductor substrate (a thin plate of a semiconductor having an approximately circular planar shape referred to as a wafer) 1 including, for example, single crystalline silicon. The thickness of the semiconductor substrate 1 is, for example, about 750 μm. Then, in the element isolation region on the main surface (the front surface, first main surface) of the semiconductor substrate 1, the isolation part 2 including an insulating film is formed. Subsequently, impurities showing a p-type electroconductivity are ion-implanted into the semiconductor substrate 1 in a region in which an nMISFET is to be formed, to form the p-type well 3.

Next, after forming the gate insulating film 4 on the main surface of the semiconductor substrate 1, over the gate insulating film 4, the gate electrode 5 of the nMISFET is formed. Subsequently, after forming the sidewall 6 on a side surface of the gate electrode 5, into p-type wells 3 on both sides of the gate electrode 5, impurities showing a n-type electroconductivity are ion-implanted to form n-type semiconductor regions 7 that function as source/drain of the nMISFET, in a self-alignment manner relative to the gate electrode 5 and the sidewall 6.

Then, over the main surface of the semiconductor substrate 1, the stopper insulating film 8 and the interlayer insulating film 9 are formed sequentially. The stopper insulating film 8 is a film serving as an etching stopper when processing the interlayer insulating film 9, and is formed by using a material having an etching selection ratio relative to the interlayer insulating film 9. The stopper insulating film 8 includes, for example, a silicon nitride film, and the interlayer insulating film 9 includes, for example, a silicon oxide film. The silicon nitride film has a stronger stress than that of the silicon oxide film, and the stress generates strain in the semiconductor substrate 1 serving as a channel part of the nMISFET. The strain generated in the channel part improves the mobility of electrons in the channel part, and thus the driving current of the nMISFET can be increased.

Figure 8:
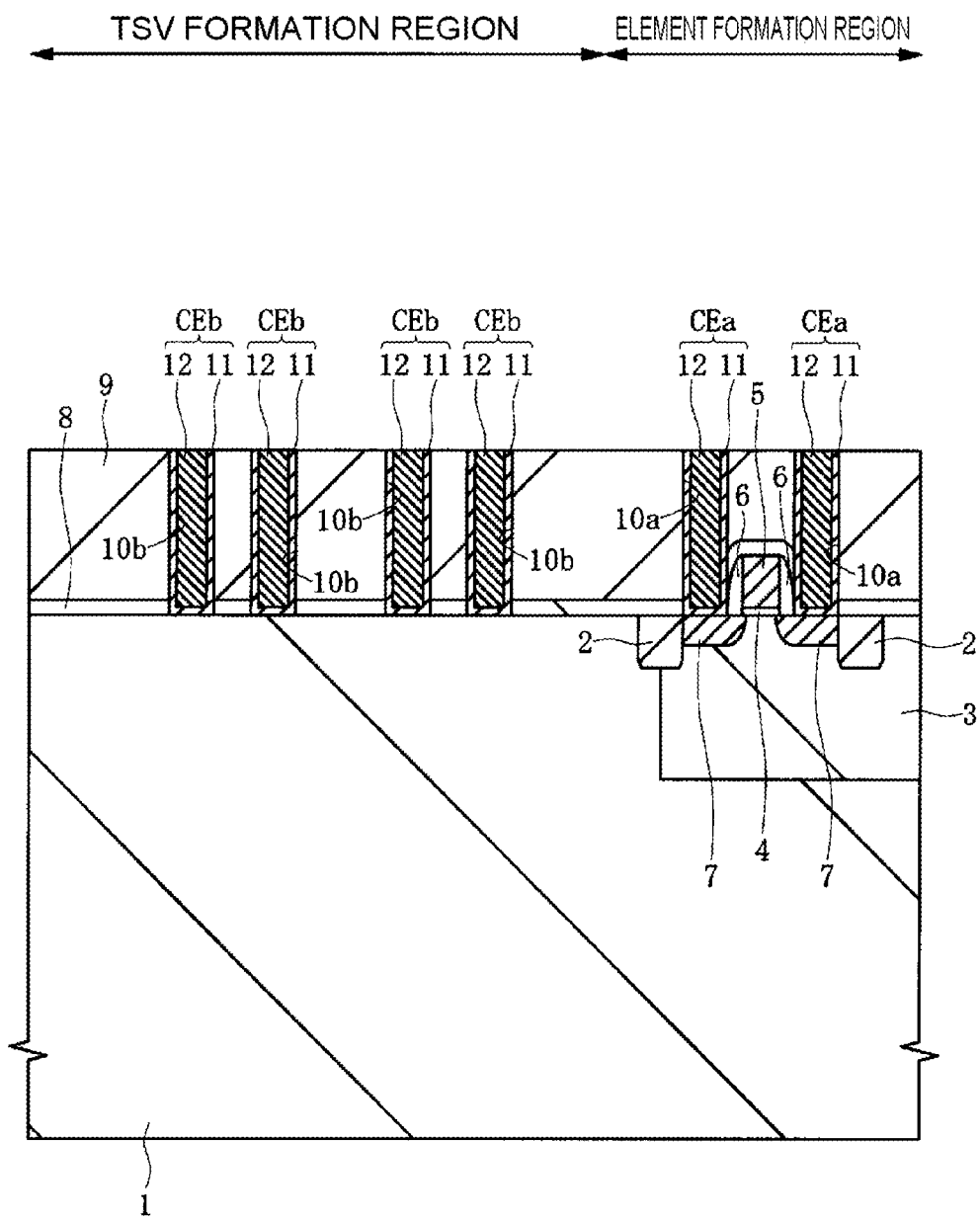
FIG. 8 is a principal part cross-sectional view of the same place as in FIG. 7 in the process of manufacturing the semiconductor device, following FIG. 7.

Next, as shown in FIG. 8, by dry etching using a resist pattern as a mask, the interlayer insulating film 9 and the stopper insulating film 8 are processed sequentially to form the connection hole 10a and the connection hole 10b for a through electrode. The connection hole 10a is formed in parts to which application of voltage is necessary in order to operate the nMISFET such as over the n-type semiconductor region 7 and over the gate electrode 5. In addition, the connection hole 10b for a through electrode is formed in parts that are respective partitioned regions of the connection pad-forming region and parts in which the through electrode 17 is to be formed in a later process.

Then, over the main surface of the semiconductor substrate 1, a barrier metal film 11 is formed, for example, by a sputtering method. The barrier metal film 11 includes, for example, a TiN film, a Ta film, a TaN film or the like. Subsequently, over the barrier metal film 11, a tungsten (W) film is formed by, for example, a CVD method or a sputtering method. Subsequently, there are removed the W film and the barrier metal film 11 in regions other than the inside of the connection hole 10a and the inside of the connection hole 10b for a through electrode by a CMP method, to thereby form the connection electrode CEa including the W film as a main conductor inside the connection hole 10a, and to thereby form a connection electrode CEb including the W film as a main conductor inside the connection hole 10b for a through electrode.

Next, by a single damascene method, the first layer wiring M1 is formed in the element-forming region, and the connection pad 17 is formed in the TSV-forming region.

Figure 9:
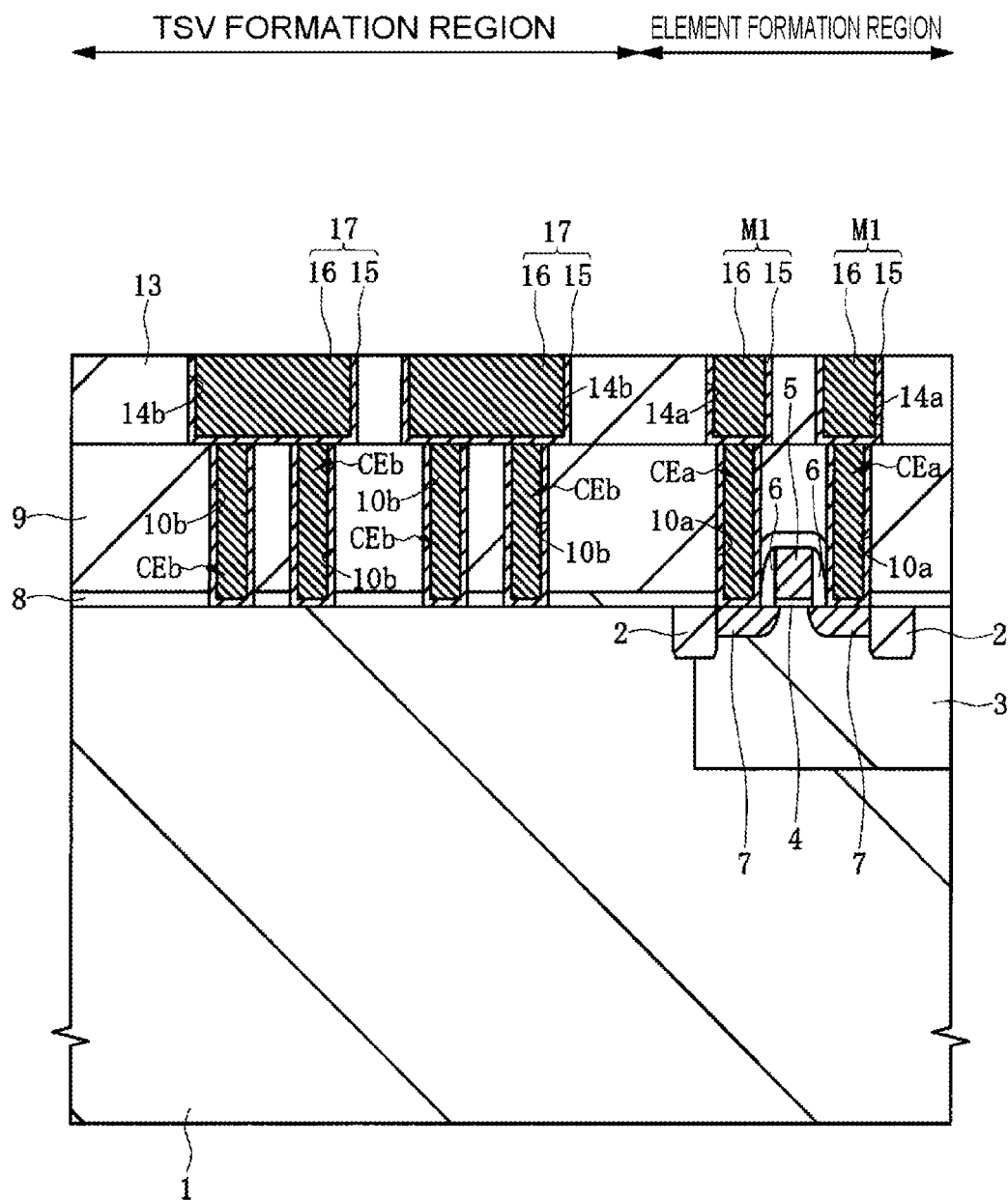
FIG. 9 is a principal part cross-sectional view of the same place as in FIG. 7 in the process of manufacturing the semiconductor device, following FIG. 8.

First, as shown in FIG. 9, the interlayer insulating film 13 is formed over the main surface of the semiconductor substrate 1. The interlayer insulating film 13 includes a silicon oxide film formed, for example, by a plasma CVD method. Subsequently, the interlayer insulating film 13 is dry-etched by using a resist pattern as a mask to form the trench 14a for forming wiring, which passes through the interlayer insulating film 13 from the upper surface to the lower surface and which reaches the connection electrode CEa, in a region in which the first layer wiring is to be formed. Simultaneously, the trench 14b for forming a connection pad, which passes through the interlayer insulating film 13 from the upper surface to the lower surface and which reaches the connection electrode CEb, is formed in each of partitioned regions in the connection pad-forming region in the TSV-forming region.

Here, as described by using FIG. 2, in the connection pad-forming region, a plurality of trenches 14b for forming a connection pad are formed, spaced apart from each other. The shape of the trench 14b for forming a connection pad viewed from above is, for example, a tetragon having a side dimension of about 1 μm, and intervals between adjacent trenches 14b for forming a connection pad are, for example, about 0.5 μm.

Next, the barrier metal film 15 is formed over the main surface of the semiconductor substrate 1. The barrier metal film 15 includes, for example, a TiN film, a Ta film, a TaN film or the like. Subsequently, over the barrier metal film 15, a seed layer of Cu (illustration is omitted) is formed by a CVD method or a sputtering method, and, furthermore, over the seed layer, the Cu plating film 16 is formed by using an electrolytic plating method. The inside of the trench 14a for forming wiring and the inside of the trench 14b for forming a connection pad are embedded with the Cu plating film 16.

Then, the Cu plating film 16, the seed layer, and the barrier metal film 15 in regions other than the inside of the trench 14a for forming wiring and the inside of the trench 14b for forming a connection pad are removed by a CMP method. Consequently, inside the trench 14a for forming wiring, a first layer wiring M1 including a Cu film as a main conductor is formed. Simultaneously, inside the trench 14b for forming a connection pad, the connection pad 17 including a Cu film as a main conductor is formed. The shape of the connection pad 17 viewed from above is, for example, a tetragon having a side dimension of about 1 μm, and intervals between adjacent connection pads 17 are, for example, about 0.5 μm.

As described above, the connection pad-forming region is partitioned into a plurality of regions, trenches 14b for forming a connection pad having a planar area that hardly allows the dishing to be generated are formed, respectively, in each of partitioned regions, and the inside of trenches 14b for forming a connection pad thus formed is embedded with a Cu film. Therefore, the surface of the connection pad 17 becomes approximately flat. Meanwhile, in the First embodiment, the Cu film being a main conductor for constituting the first layer wiring M1 and the connection pad 17 is formed by an electrolytic plating method, but it may be formed by a CVD method, a sputtering method, a sputter-reflow method or the like.

Next, by a dual damascene method, the second layer wiring M2 is formed in the element-forming region and the TSV-forming region.

Figure 10:
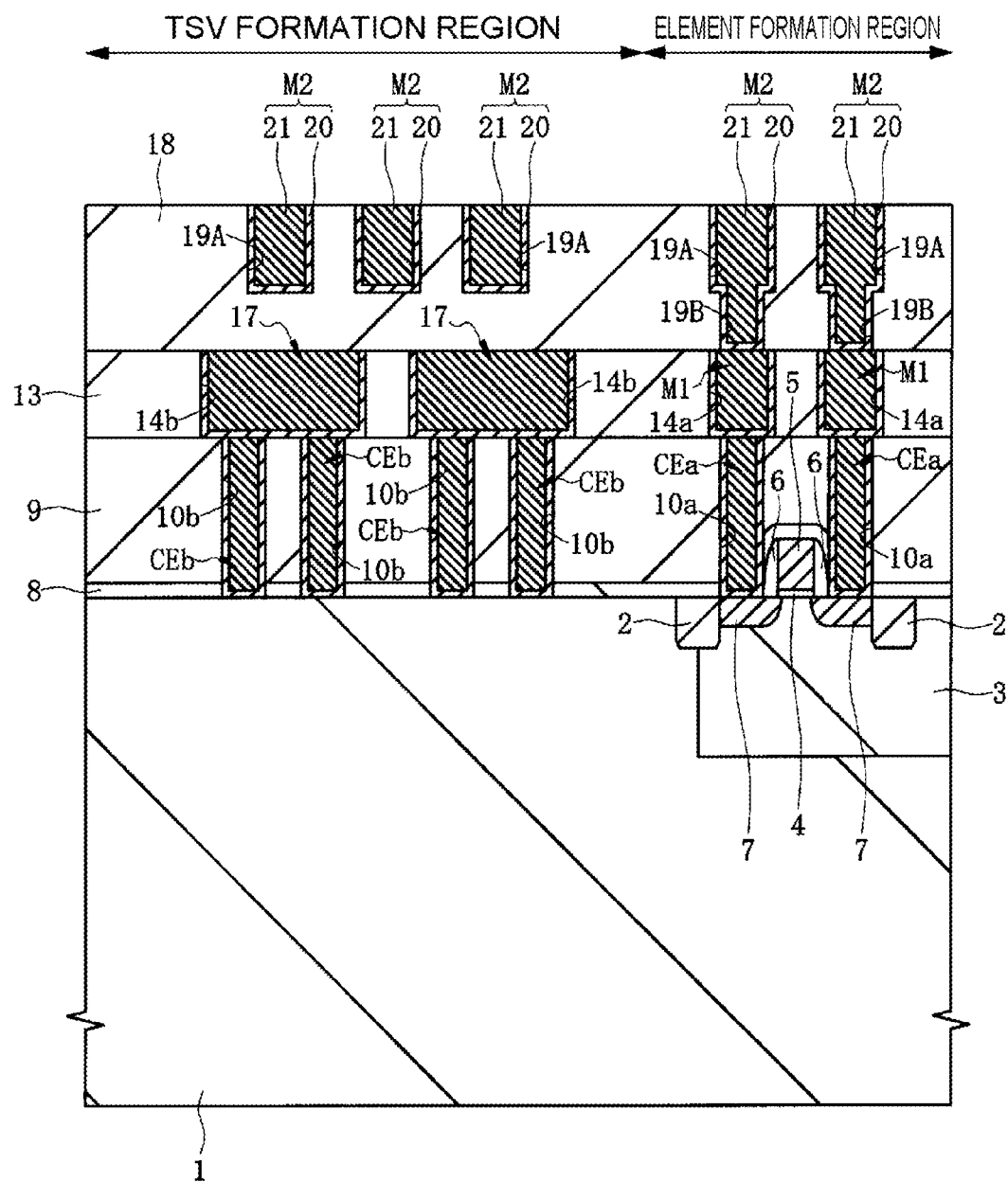
FIG. 10 is a principal part cross-sectional view of the same place as in FIG. 7 in the process of manufacturing the semiconductor device, following FIG. 9.

First, as shown in FIG. 10, over the main surface of the semiconductor substrate 1, the interlayer insulating film 18 is formed, for example, by a plasma CVD method. The interlayer insulating film 18 is formed after each surface shape of the interlayer insulating film 13, the first layer wiring M1 and the connection pad 17 that are lower layers thereof, and since surfaces of these are approximately flat, the surface of the interlayer insulating film 18 is also approximately flat. Subsequently, the interlayer insulating film 18 is dry-etched using a resist pattern as a mask to form the trench 19A for forming wiring in a region in which the second layer wiring is to be formed, and, furthermore, to form the connection hole 19B reaching the first layer wiring M1 in a part connecting the trench 19A for forming wiring with the first layer wiring M1.

Then, after forming the barrier metal film 20 over the main surface of the semiconductor substrate 1, over the barrier metal film 20, a seed layer of Cu (illustration is omitted) is formed, and, furthermore, over the seed layer, the Cu plating film 21 is formed using an electrolytic plating method. The barrier metal film 20 includes, for example, a TiN film, a Ta film, a TaN film or the like.

Next, the Cu plating film 21, the seed layer, and the barrier metal film 20 in regions other than the inside of the trench 19A for forming wiring and the inside of the connection hole 19B are removed by a CMP method, to thereby form the second layer wiring M2 including a Cu film as a main conductor inside the trench 19A for forming wiring, and to form a connection member formed integral with the second layer wiring M2 inside the connection hole 19B. Here, since the surface of the interlayer insulating film 18, in which the trench 19A for forming wiring is formed, is approximately flat, the short-circuit defect of the second layer wiring M2 caused by the dishing generated in the connection pad as shown in FIG. 43 is not generated.

After that, although illustration is omitted, wirings of further upper layers, for example, the third layer to sixth layer wirings are formed, for example, by the same method as in the second layer wiring M2.

Then, the through electrode 27 is formed.

Figure 11:
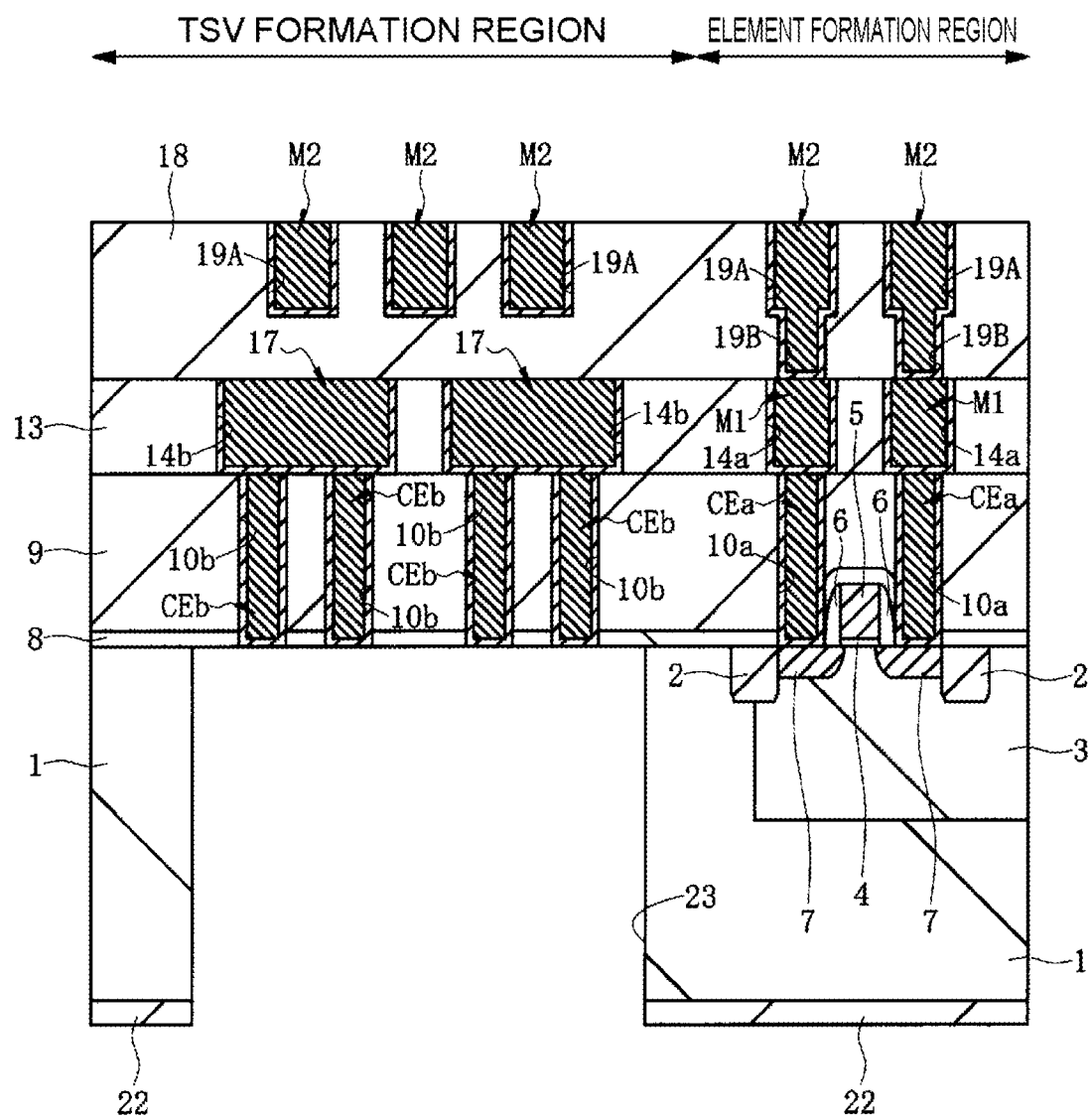
FIG. 11 is a principal part cross-sectional view of the same place as in FIG. 7 in the process of manufacturing the semiconductor device, following FIG. 10.

First, as shown in FIG. 11, by polishing the rear surface (the second main surface) of the semiconductor substrate 1, which is the surface opposite to the main surface, the thickness of the semiconductor substrate 1 is set to, for example, not more than 100 μm. Next, after forming the insulating film 22 on the rear surface of the semiconductor substrate 1, the insulating film 22 is dry-etched by using a resist pattern (illustration is omitted) as a mask to form a hard mask. The insulating film 22 includes, for example, a silicon nitride film or a silicon oxide film formed by a plasma CVD method, and, for example, has a thickness of about 0.5 μm. In addition to the function as a hard mask, the insulating film 22 also has a function as a protective film that prevents metal pollution from the rear surface of the semiconductor substrate 1.

Then, the semiconductor substrate 1 in the TSV-forming region is dry-etched from the rear surface of the semiconductor substrate 1 until the connection electrode CEb (the barrier metal film 11) formed inside the connection hole 10b and the stopper insulating film 8 are exposed, by using the hard mask including the resist pattern and the insulating film 22 as a mask. The resist pattern disappears in the etching process. Consequently, the through hole 23 reaching the connection electrode CEb is formed. The diameter of the through hole 23 is, for example, about 5 μm. Here, the through hole 23 does not reach the interlayer insulating film 9, and thus it is possible to prevent $H_2O$, a metal ion such as $Na^+$ or $K^+$, etc. from intruding into the element-forming region via the interlayer insulating film 9.

Figure 12:
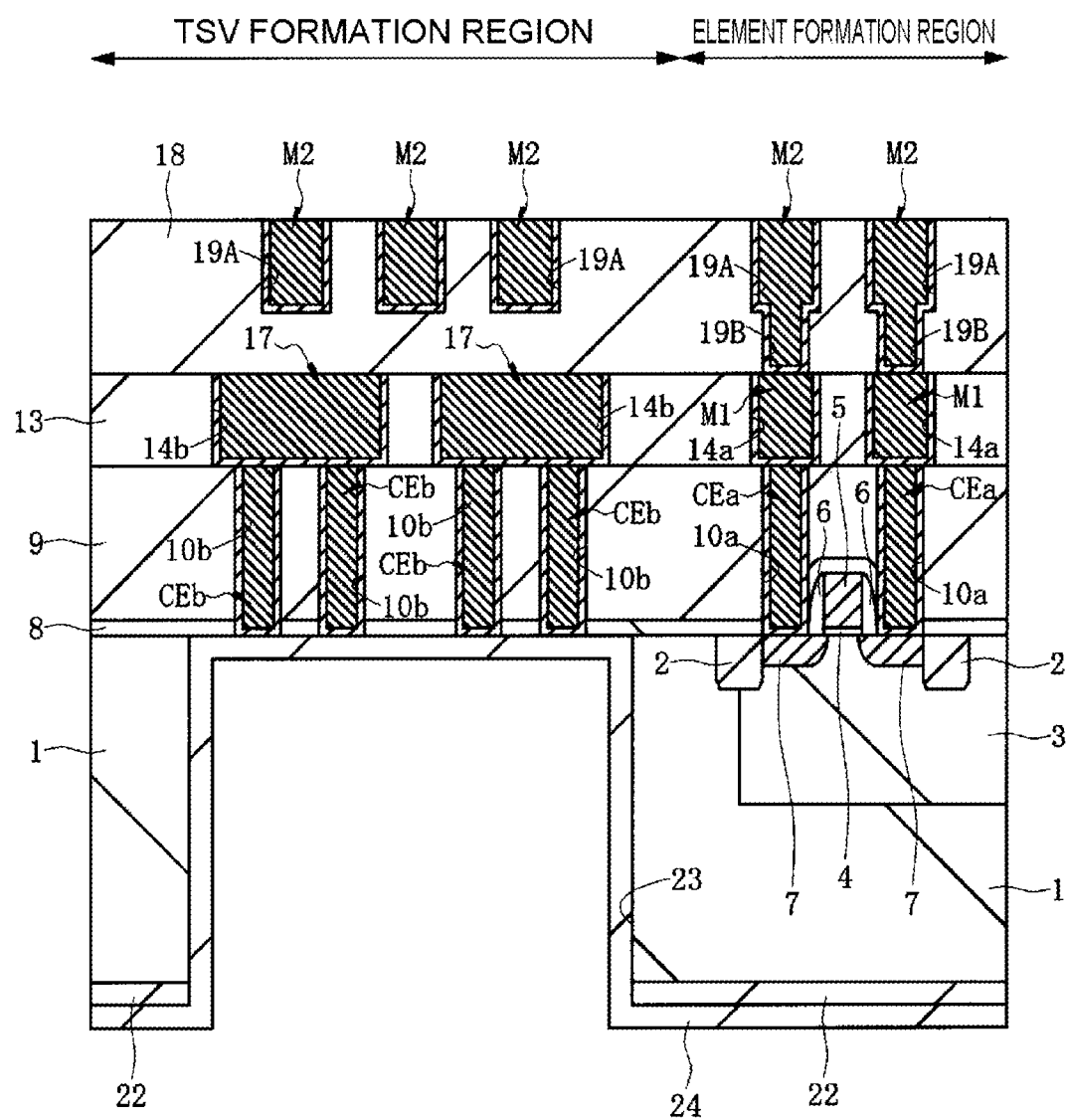
FIG. 12 is a principal part cross-sectional view of the same place as in FIG. 7 in the process of manufacturing the semiconductor device, following FIG. 11.

Next, as shown in FIG. 12, the insulating film 24 is formed over the rear surface of the semiconductor substrate 1 including the bottom surface and the side surface of the through hole 23. The insulating film 24 is, for example, a silicon oxide film formed by a plasma CVD method and the thickness thereof is, for example, about 0.5 μm.

Figure 13:
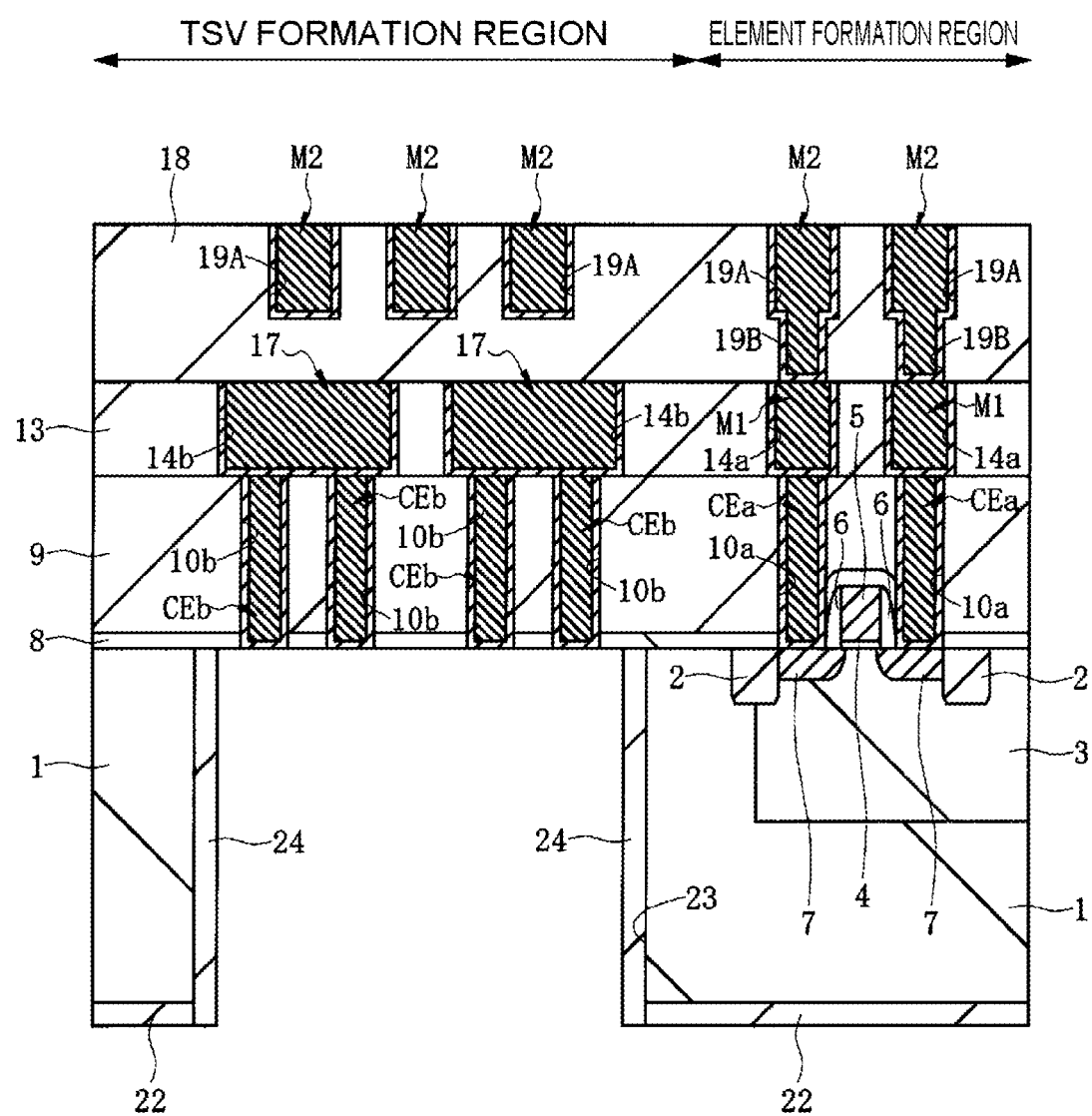
FIG. 13 is a principal part cross-sectional view of the same place as in FIG. 7 in the process of manufacturing the semiconductor device, following FIG. 12.

Then, as shown in FIG. 13, the insulating film 24 over the hard mask including the insulating film 22 and on the bottom surface of the through hole 23 is removed by anisotropic dry etching to leave the insulating film 24 only on the side surface of the through hole 23.

Figure 14:
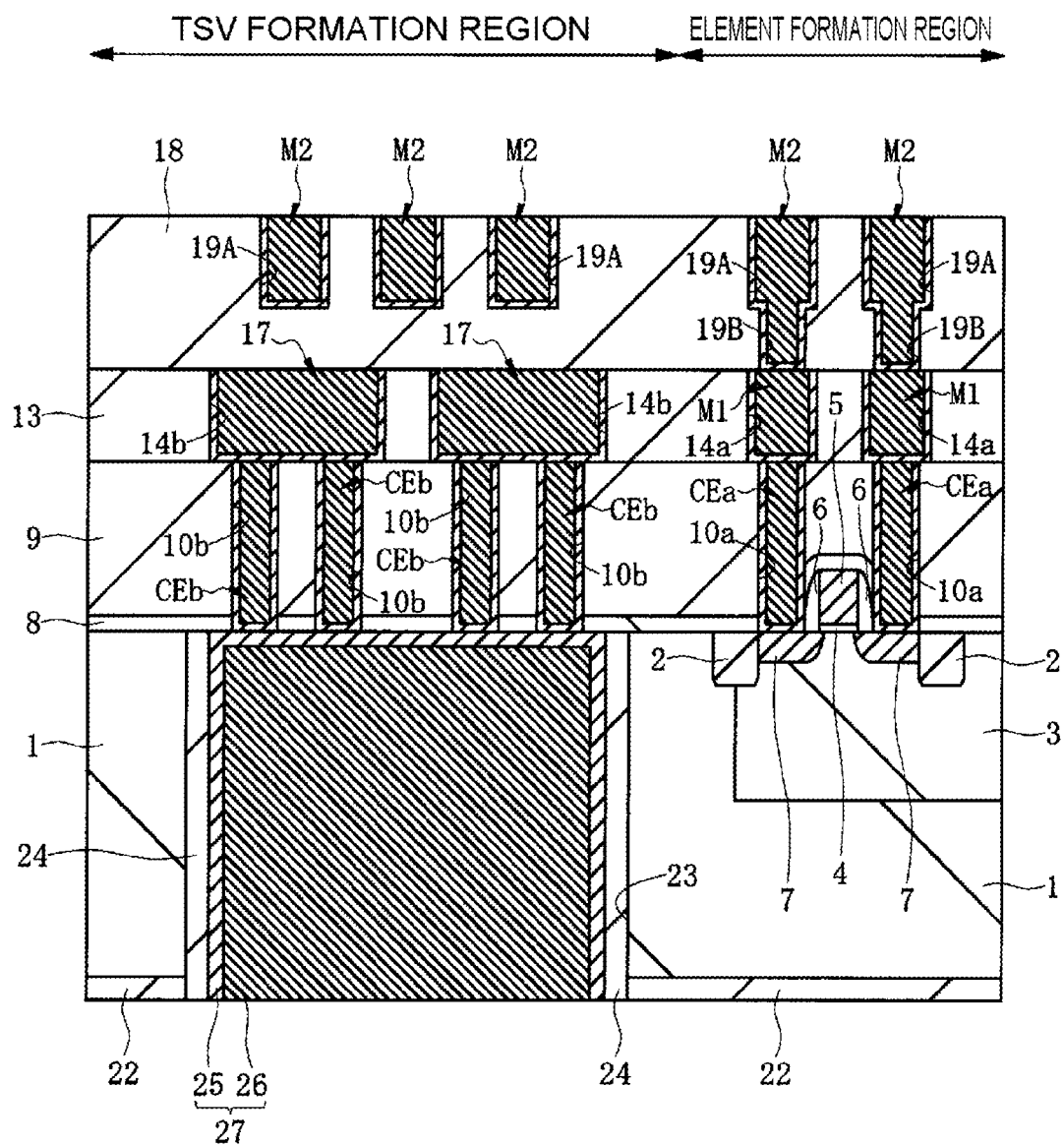
FIG. 14 is a principal part cross-sectional view of the same place as in FIG. 7 in the process of manufacturing the semiconductor device, following FIG. 13.

Next, as shown in FIG. 14, after forming the barrier metal film 25 over the rear surface of the semiconductor substrate 1, over the barrier metal film 25, a seed layer of cupper (illustration is omitted) is formed, and, furthermore, over the seed layer, the Cu plating film 26 is formed using an electrolytic plating method. The barrier metal film 25 includes, for example, a TiN film, a Ta film, a TaN film or the like. After that, the Cu plating film 26, the seed layer, and the barrier metal film 25 in regions other than the inside of the through hole 23 are removed by a CMP method to form the through electrode 27 including a Cu film as a main conductor inside the through hole 23.

As described above, according to the First embodiment, by partitioning the connection pad-forming region PDA into a plurality of regions, and by forming, respectively, connection pads 17 having a relatively small planar area, spaced apart from an adjacent connection pad in each of partitioned regions, the dishing generated in the connection pad 17 is lightened. Consequently, no short-circuit defect caused by the dishing is generated in the second layer wiring M2 formed on the upper layer of the connection pad 17. Therefore, lowering of manufacturing yield of semiconductor devices can be avoided. Moreover, since no through hole 23 for forming the through electrode 27 is formed in the interlayer insulating film 9 covering the semiconductor element, it is possible to prevent $H_2O$, a metal ion such as $Na^+$ or $K^+$, etc. from intruding into the element-forming region from the through hole 23 via the interlayer insulating film 9. Consequently, the variation of operation characteristics of the semiconductor element can be suppressed, which allows avoidance of lowering reliability of the semiconductor device.

Second Embodiment

The Second embodiment is different from the aforementioned First embodiment in the configuration of the connection pad and the connection electrode formed in the TSV-forming region. In the First embodiment, the connection pad 17 is constituted mainly by a Cu film, and the connection electrode CEb coupling electrically the connection pad 17 to the through electrode 27 is constituted mainly by a W film. But, in the Second embodiment, the connection pad and the connection electrode are constituted mainly by a Cu film of the same layer.

Figure 15:
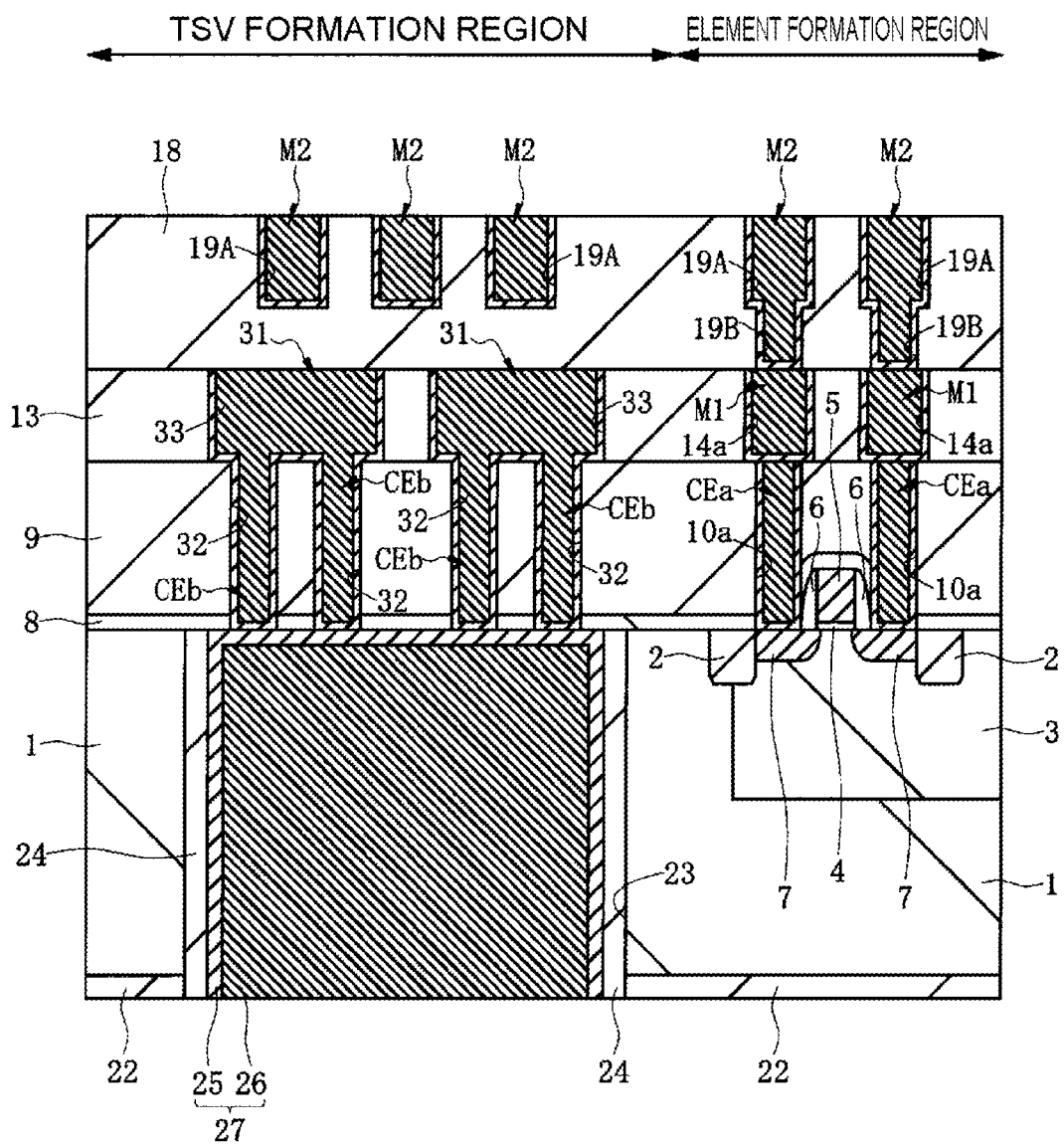
FIG. 15 is a principal part cross-sectional view showing a semiconductor device adopting the TSV technique by the via last system according to a Second embodiment of the invention.

The semiconductor device provided with TSV according to the Second embodiment will be explained by using FIG. 15. FIG. 15 is a principal part cross-sectional view of the semiconductor device and shows a part of the element-forming region, and the TSV-forming region. Since the configuration of an nMISFET formed in the element-forming region in FIG. 15 is the same as the configuration of the nMISFET described in the First embodiment, the explanation thereof is omitted.

As shown in FIG. 15, the through hole 23 formed in the semiconductor substrate 1 in the TSV-forming region, the through electrode 27 constituted by the barrier metal film and the Cu plating film 26 formed inside the through hole 23, the insulating film 22 formed on the rear surface of the semiconductor substrate 1, and the insulating film 24 formed between the through electrode 27 and the semiconductor substrate 1 are the same as those in the First embodiment.

Furthermore, in the same manner as in the First embodiment, the connection pad-forming region is partitioned into a plurality of regions, and in each of partitioned regions, connection pads 31 are arranged, respectively, spaced apart from the adjacent connection pad 31. As the form of the shape of the connection pad 31 viewed from above, for example, adoption of shapes explained by using g FIG. 2, 5 or 6 in the First embodiment is possible.

However, the connection pad 31 is formed by using a dual damascene method. That is, by embedding a Cu film of the same layer inside connection hole 32 for forming a through electrode formed in the stopper insulating film 8 and the interlayer insulating film 9 and the inside of the trench 33 for forming a connection pad formed in the interlayer insulating film 13, the connection pad 31 integrated with a connection member to be connected with the through electrode 27 is formed. Even in the case where the connection pad 31 integrated with a connection member is formed as described above, it is possible to partition the connection pad-forming region into a plurality of regions, and to form, respectively, trenches 33 for forming a connection pad having a planar area that hardly allows dishing to be generated in each of partitioned regions. Accordingly, since the inside of the trench 33 for forming a connection pad thus formed is embedded with a Cu film, the dishing that will be generated in the connection pad 31 is lightened as compared with a case where one connection pad is formed over the whole surface of the connection pad-forming region PDA, and the surface of the pad 17 is approximately flat.

Furthermore, over the connection pad 31, the second layer wiring M2 is formed using a dual damascene method, in the same manner as in the element-forming region. That is, the second layer wiring M2 is formed by forming the trench 19A for forming wiring in the interlayer insulating film 18 deposited over the connection pad 31 and the interlayer insulating film 13, and embedding the inside thereof with a barrier metal film and a Cu film. However, since the surface of the connection pad 31 is approximately flat, the surface of the interlayer insulating film 18 is also approximately flat. Accordingly, in the TSV-forming region, it is possible to prevent a short-circuit defect between adjacent second layer wirings M2, and thus, to avoid the lowering of manufacturing yield of semiconductor device caused by the dishing of the connection pad 31. In addition, by using a Cu film as a connection member connecting the connection pad 31 with the through electrode 27, the resistance between the connection pad 31 and the through electrode 27 can be reduced as compared with a case where a connection electrode including a W film as a main conductor is used.

Furthermore, in the same manner as in the First embodiment, no through hole 23 for forming the through electrode 27 is formed in the interlayer insulating film 9, and the connection pad 31 is electrically coupled to the through electrode 27 through the connection hole 32 for a through electrode. Accordingly, it is possible to prevent $H_2O$, a metal ion such as $Na^+$ or $K^+$, etc. from intruding into the element-forming region from the through hole 23 via the interlayer insulating film 9. Therefore, the variation of operation characteristics of the nMISFET can be suppressed, which allows avoidance of lowering reliability of the semiconductor device. As the form of the shape of the connection hole 32 for a through electrode, for example, adoption of shapes explained by using FIG. 2, 3 or 4 in the First embodiment is possible.

Next, a method of manufacturing a semiconductor device adopting the TSV technique by the via last system according to the Second embodiment will be explained in order of processes by using FIGS. 16 to 20. FIGS. 16 to 20 are principal part cross-sectional views of a semiconductor device in a process of manufacturing a semiconductor device, and show a part of the element-forming region, and the TSV-forming region. In addition, in element-forming regions in FIGS. 16 to 20, an nMISFET is illustrated as a semiconductor element.

First, as explained in the First embodiment by using FIG. 7, an nMISFET is formed on the main surface of the semiconductor substrate 1 in the element-forming region.

Figure 16:
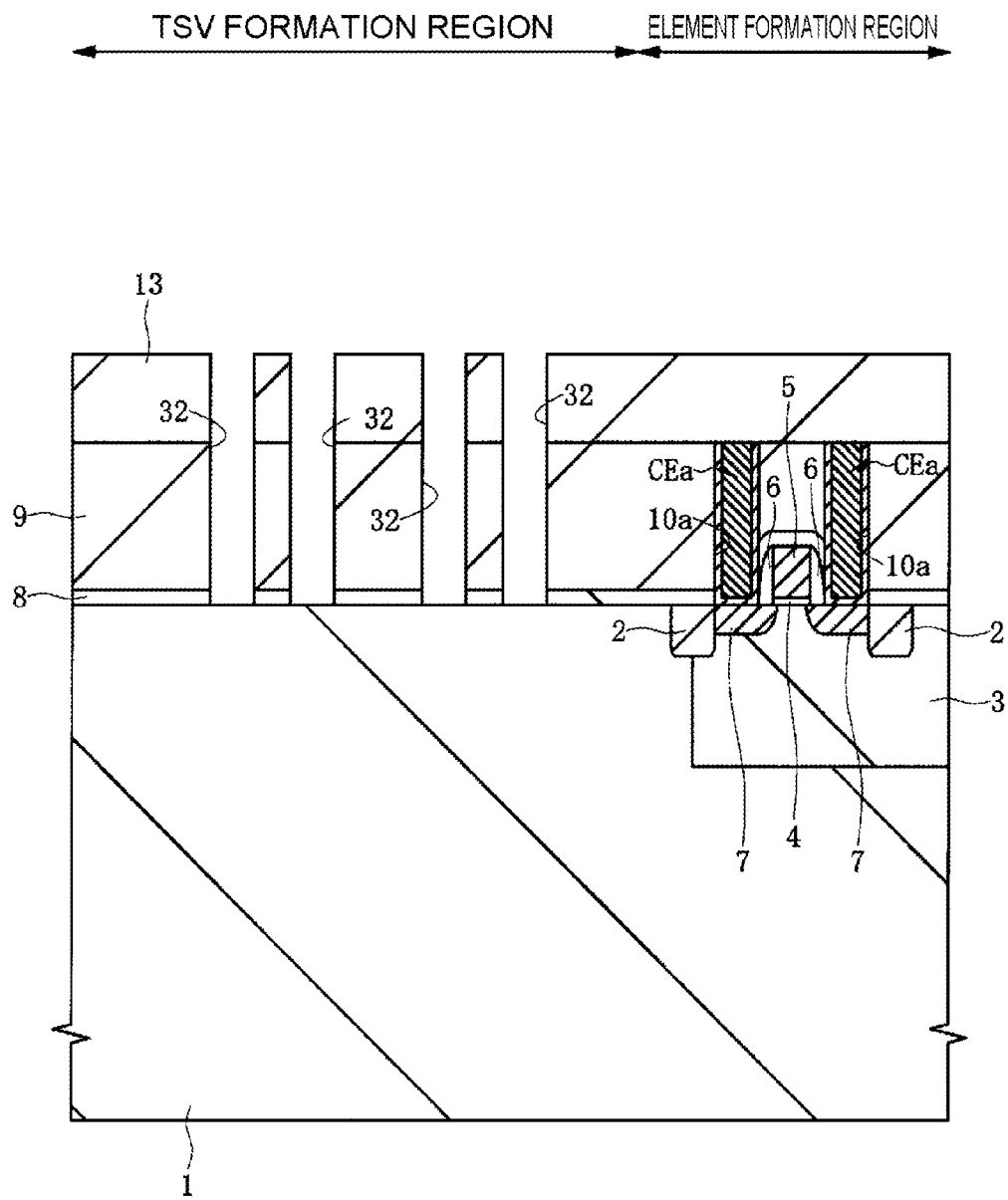
FIG. 16 is a principal part cross-sectional view showing a process of manufacturing a semiconductor device, adopting the TSV technique by the via last system according to the Second embodiment of the invention.

Then, as shown in FIG. 16, after forming sequentially the stopper insulating film 8 and the interlayer insulating film 9 over the main surface of the semiconductor substrate 1, by dry etching using a resist pattern as a mask, the interlayer insulating film 9 and the stopper insulating film 8 are processed sequentially to form the connection hole 10a. The connection hole 10a is formed in parts to which application of voltage is necessary in order to operate the nMISFET, such as over the n-type semiconductor region 7 and over the gate electrode 5 of the nMISFET. Subsequently, inside the connection hole 10a, the connection electrode CEa including a W film as a main conductor is formed.

Next, by a dual damascene method, the first layer wiring M1 is formed in the element-forming region, and the connection pad 31 integrated with a connection member is formed in the TSV-forming region.

First, over the main surface of the semiconductor substrate 1, the interlayer insulating film 13 is formed. The interlayer insulating film 13 includes, for example, a silicon oxide film formed by a plasma CVD method. Subsequently, by using a resist pattern as a mask, there are dry-etched sequentially the interlayer insulating film 13, the interlayer insulating film 9 and the stopper insulating film 8 in the TSV-forming region, to form the connection hole 32 reaching the semiconductor substrate 1.

Figure 17:
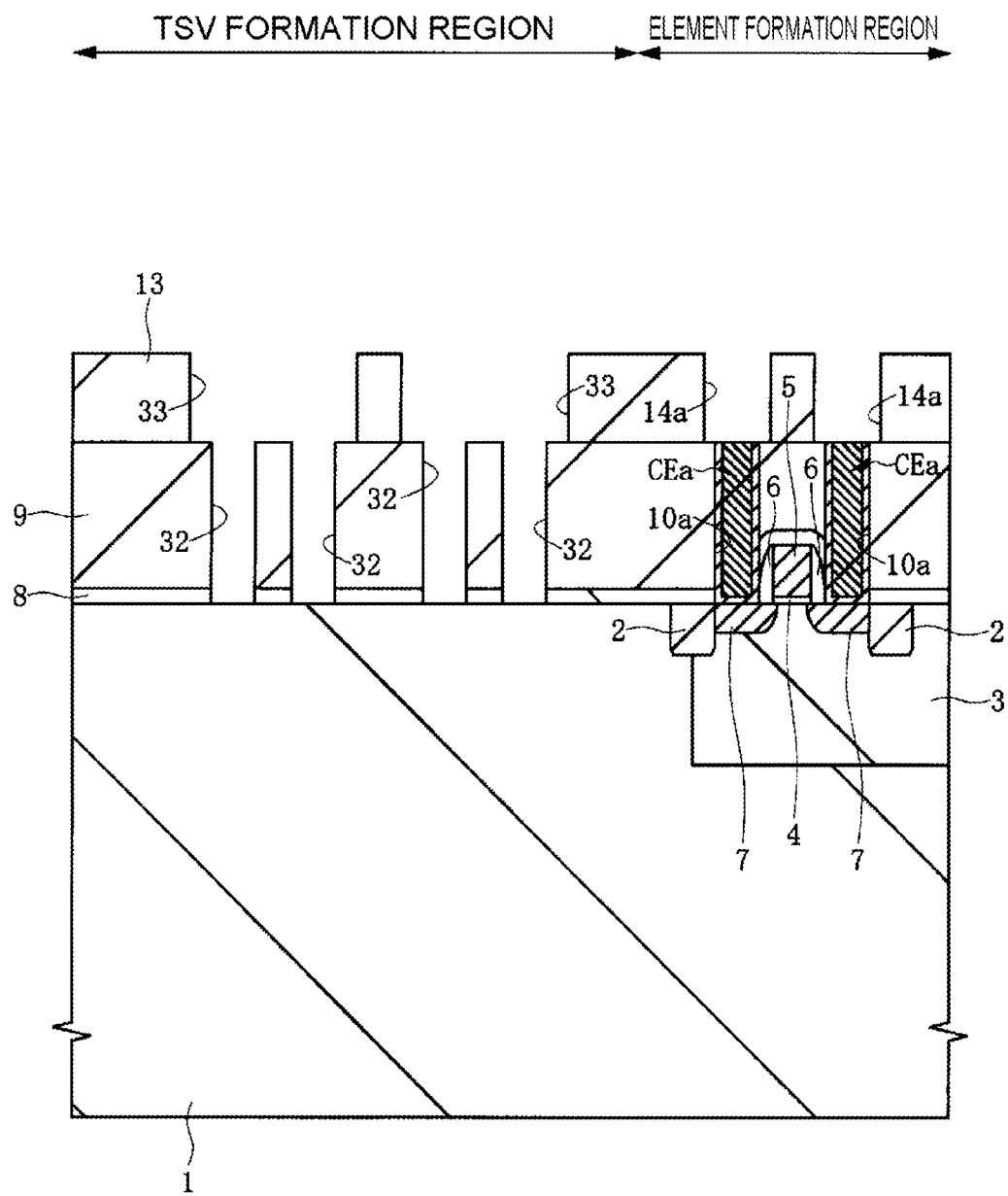
FIG. 17 is a principal part cross-sectional view of the same place as in FIG. 16 in the process of manufacturing the semiconductor device, following FIG. 16.

Then, as shown in FIG. 17, by using a resist pattern as a mask, the interlayer insulating film 13 is dry-etched to form the trench 14a for forming wiring that passes through the interlayer insulating film 13 from the upper surface to the lower surface and that reaches the connection electrode CEa, in a region in which the first layer wiring is to be formed in the element-forming region. Simultaneously, the trench 33 for forming a connection pad that passes through the interlayer insulating film 13 from the upper surface to the lower surface and that reaches the connection hole 32 is formed in a region in which the connection pad is to be formed in the TSV-forming region.

Figure 18:
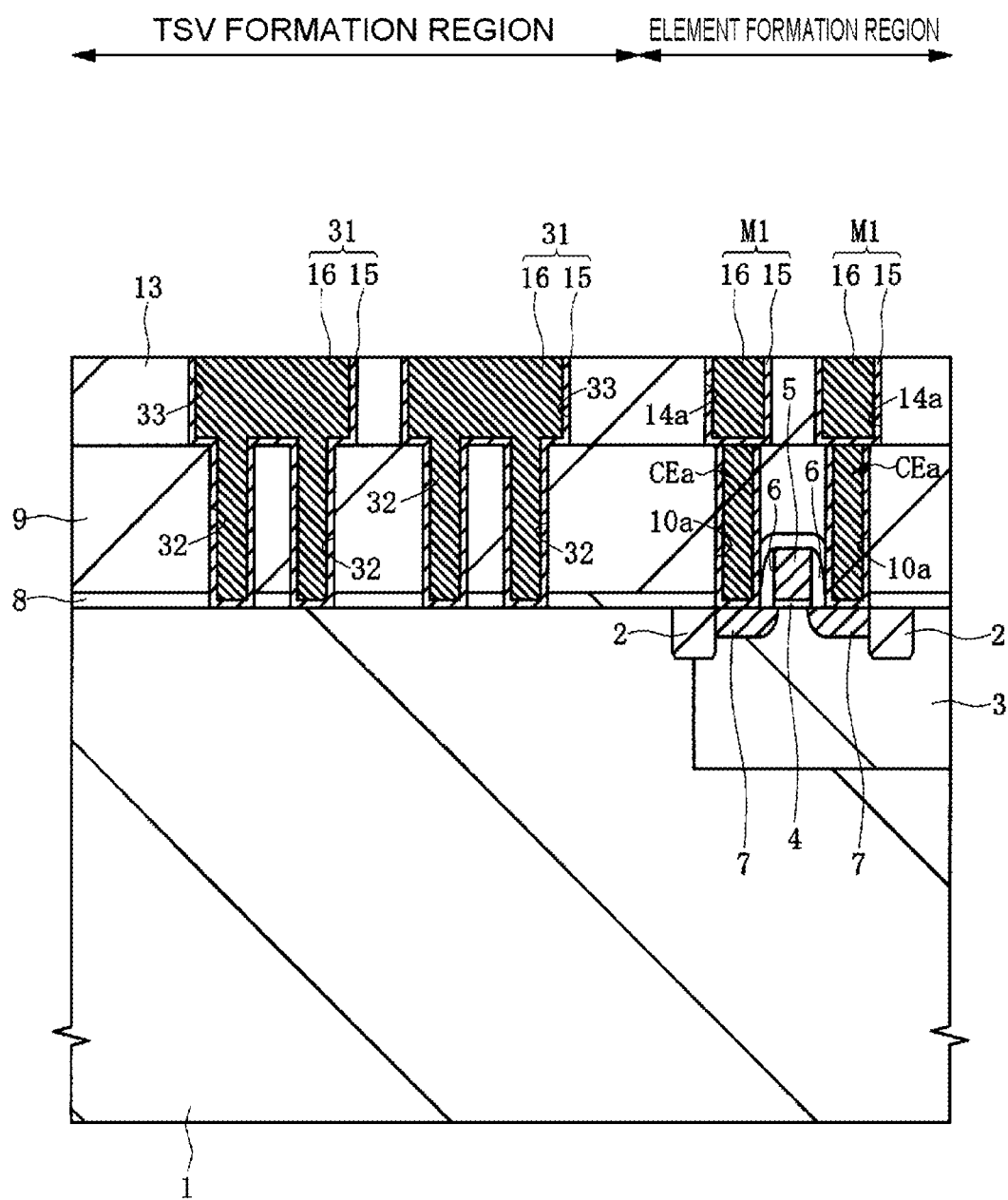
FIG. 18 is a principal part cross-sectional view in the same place as in FIG. 16 in the process of manufacturing the semiconductor device, following FIG. 17.

Next, as shown in FIG. 18, in the element-forming region, a barrier metal film and a Cu film are embedded inside the trench 14a for forming wiring to form the first layer wiring M1 including a Cu film as a main conductor. Simultaneously, in the TSV-forming region, the barrier metal film and the Cu film are embedded inside the trench 33 for forming a connection pad and inside the connection hole 32. Consequently, inside the trench 33 for forming a connection pad, the connection pad 31 including the Cu film as a main conductor is formed, and the connection pad 31 is formed integral with a connection member including the Cu film, as a main conductor, formed inside the connection hole 32.

Figure 19:
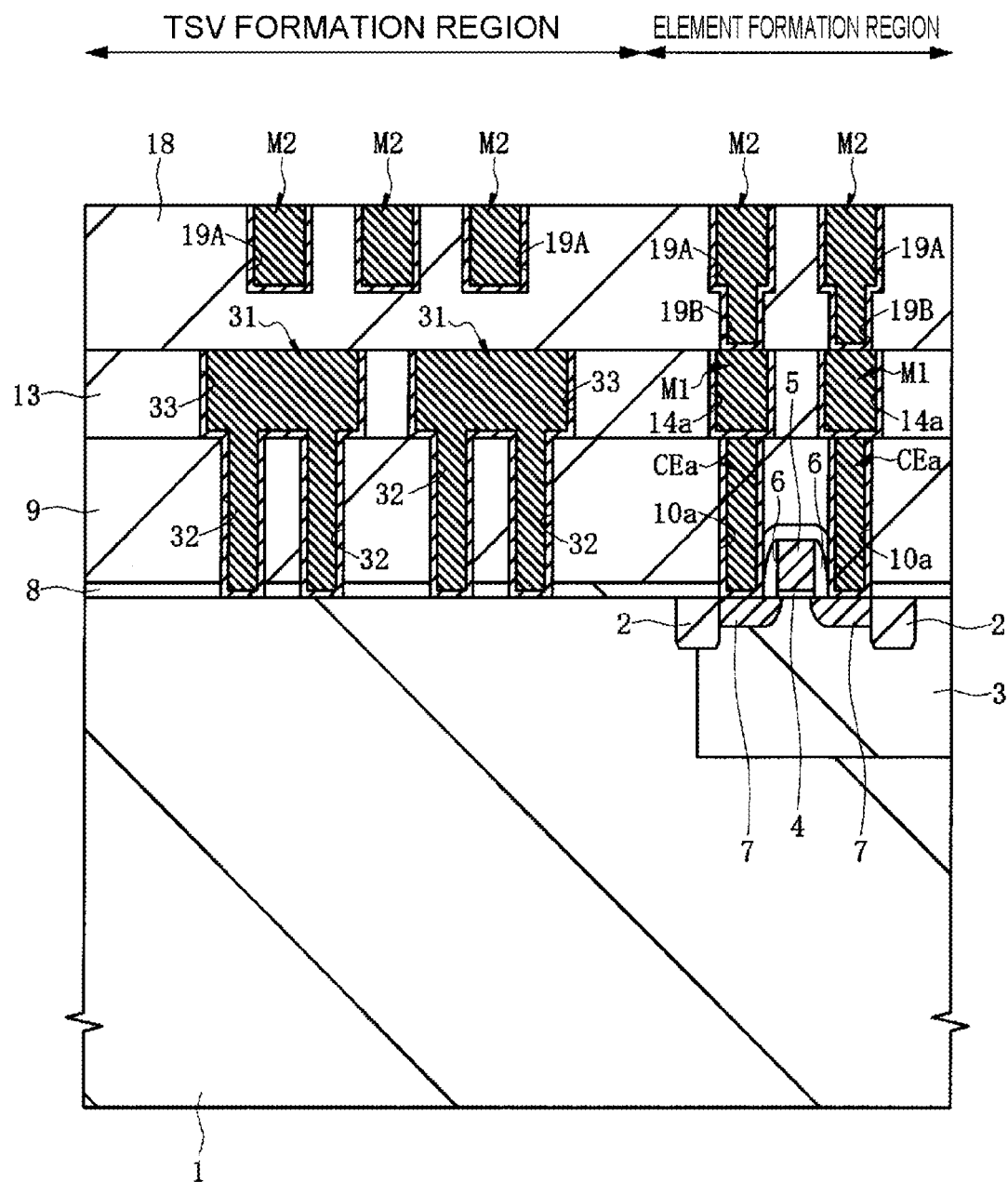
FIG. 19 is a principal part cross-sectional view in the same place as in FIG. 16 in the process of manufacturing the semiconductor device, following FIG. 18.
Figure 20:
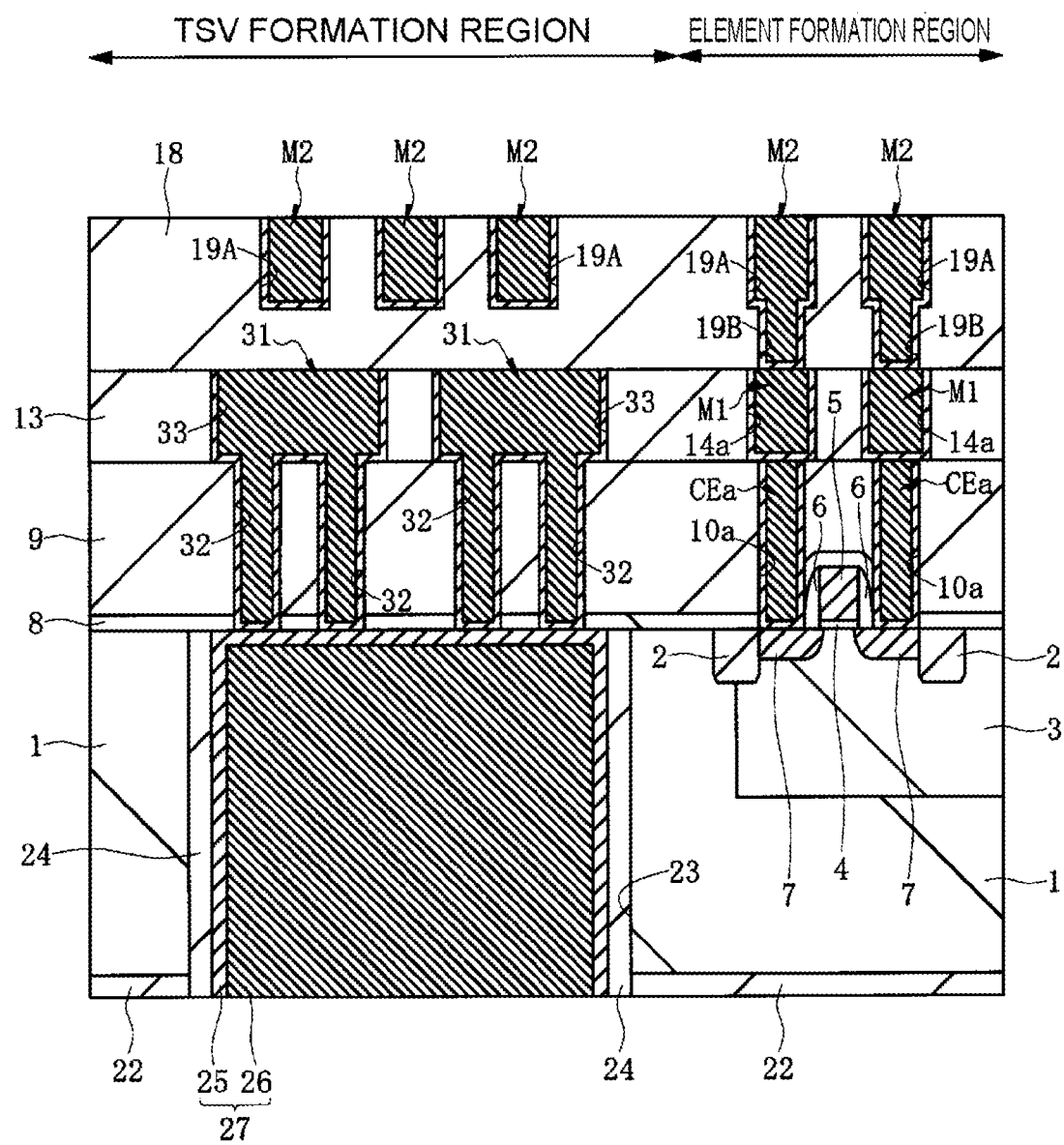
FIG. 20 is a principal part cross-sectional view in the same place as in FIG. 16 in the process of manufacturing the semiconductor device, following FIG. 19.

Then, as shown in FIG. 19, in the same manner as in the First embodiment, the second layer wiring M2 is formed and, furthermore, wirings of upper layers thereof, for example, the third layer to sixth layer wirings are formed. After that, as shown in FIG. 20, in the same manner as in the First embodiment, the through electrode 27 is formed after reducing the thickness of the semiconductor substrate 1, for example, to not more than 100 μm.

As described above, according to the Second embodiment, even when the connection pad 31 is formed through the use of a dual damascene method, the same effect as that in the First embodiment is obtained. Furthermore, since the connection pad 31 is connected to the through electrode 27 by a connection member including a Cu film as a main conductor, the resistance is more reduced than a case where a connection electrode including a W film as a main conductor is used, and a TSV that operates at a higher speed and with a lower power can be provided.

Third Embodiment

The Third embodiment is different from the First embodiment in that a metal silicide layer is formed between the connection electrode and the through electrode, in the TSV-forming region.

Figure 21:
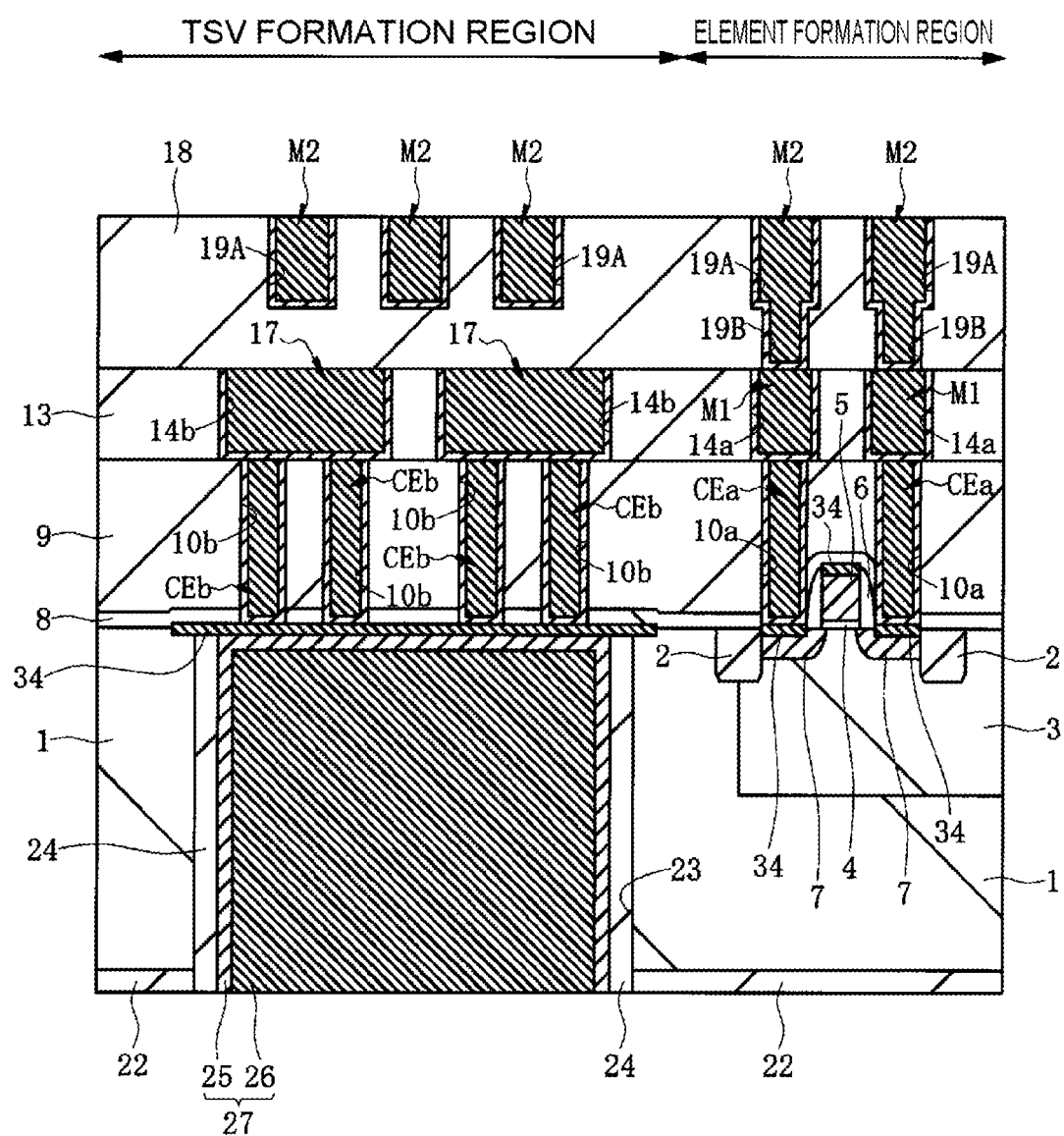
FIG. 21 is a principal part cross-sectional view showing a semiconductor device adopting the TSV technique by the via last system according to a Third embodiment of the invention.

A semiconductor device provided with TSV according to the Third embodiment will be explained by using FIG. 21. FIG. 21 is a principal part cross-sectional view of the semiconductor device, and shows a part of the element-forming region, and the TSV-forming region. The configuration of an nMISFET formed in the element-forming region in FIG. 21 is the same as the configuration of the nMISFET described in the First embodiment, except that a metal silicide layer is formed on the surface of the gate electrode 5 and the surface of the n-type semiconductor region 7 configuring source/drain, and thus the explanation thereof is omitted.

As shown in FIG. 21, the through hole 23 formed in the semiconductor substrate 1 in the TSV-forming region, the through electrode 27 configured by the barrier metal film and the Cu plating film 26 formed inside the through hole 23, the insulating film 22 formed on the rear surface of the semiconductor substrate 1, and the insulating film 24 formed between the through electrode 27 and the semiconductor substrate 1 are the same as those in the First embodiment.

Furthermore, in the same manner as in the First embodiment, the connection pad-forming region is partitioned into a plurality of regions and, in each of partitioned regions, connection pads 17 are arranged, respectively, spaced apart from the adjacent connection pad 17. As the form of the shape of the connection pad 17 viewed from above, for example, adoption of shapes explained by using FIG. 2, 5 or 6 in the First embodiment is possible.

Moreover, in the same manner as in the First embodiment, no through hole 23 for forming the through electrode 27 is formed in the interlayer insulating film 9, but the connection pad 17 is connected with the through electrode 27 through the connection hole 10b for a through electrode. Accordingly, it is possible to prevent $H_2O$, a metal ion such as $Na^+$ or $K^+$, etc. from intruding into the element-forming region from the through hole 23 via the interlayer insulating film 9. Therefore, the variation of operation characteristics of the nMISFET can be suppressed, which allows avoidance of lowering reliability of the semiconductor device. As the form of the shape of the connection hole 10b for a through electrode, for example, adoption of shapes explained by using FIG. 2, 3 or 4 in the First embodiment is possible.

However, between the connection electrode CEb and the through electrode 27, a metal silicide layer 34 is formed. The metal silicide layer 34 is, for example, a nickel silicide (NiSi) layer, a platinum (Pt)-containing nickel silicide (NiPtSi) layer, a cobalt silicide ($CoSi_2$) layer or the like. By forming the metal silicide layer 34 as described above, the contact resistance between the connection electrode CEb and the through electrode 27 can be reduced.

Next, the method of manufacturing a semiconductor device adopting the TSV technique according to the via last system of the Third embodiment will be explained in order of processes by using FIGS. 22 to 28. FIGS. 22 to 28 are principal part cross-sectional views of a semiconductor device in a process of manufacturing a semiconductor device, and show a part of the element-forming region, and the TSV-forming region. In addition, in the element-forming region of FIGS. 22 to 28, an nMISFET is illustrated as a semiconductor element.

Figure 22:
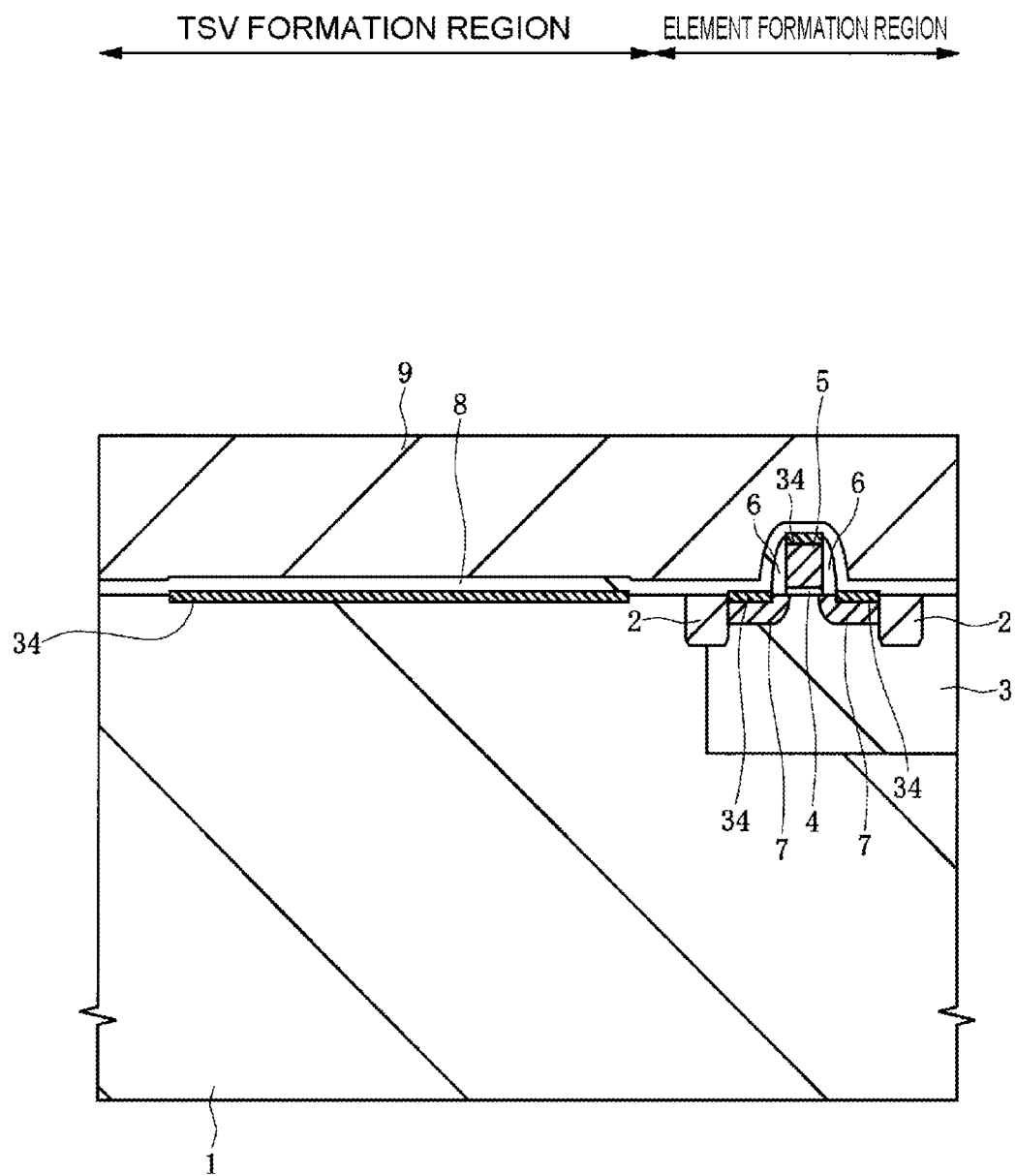
FIG. 22 is a principal part cross-sectional view showing a process of manufacturing a semiconductor device, adopting the TSV technique by the via last system according to the Third embodiment of the invention.

First, as shown in FIG. 22, the semiconductor substrate 1 including, for example, single crystalline silicon is prepared. The thickness of the semiconductor substrate 1 is, for example, about 750 μm. Next, in an element isolation region of the main surface (the front surface, first main surface) of the semiconductor substrate 1, the isolation part 2 including an insulating film is formed. Subsequently, into the semiconductor substrate 1 in a region in which the nMISFET is to be formed, impurities showing p-type electroconductivity are ion-implanted to form the p-type well 3.

Then, after forming the gate insulating film 4 on the main surface of the semiconductor substrate 1, over the gate insulating film 4, the gate electrode 5 of the nMISFET including a polycrystalline silicon film is formed. Subsequently, after forming the sidewall 6 on the side surface of the gate electrode 5, impurities showing n-type electroconductivity are ion-implanted into p-type wells 3 on both sides of the gate electrode 5 to form n-type semiconductor regions 7 functioning as source/drain of the nMISFET, in a self-alignment manner relative to the gate electrode 5 and the sidewall 6.

Next, in the element-forming region, on each of surfaces of the gate electrode 5 of the nMISFET and the n-type semiconductor region 7 and, in the TSV-forming region, on the surface of the semiconductor substrate 1 in a region in which the through electrode 27 is to be formed in a later process, the metal silicide layer 34 is formed.

The metal silicide layer 34 can be formed, for example, by a process explained below.

First, after forming an insulating film (illustration is omitted) on the main surface of the semiconductor substrate 1 other than a region in which the metal silicide layer 34 is to be formed, over the main surface of the semiconductor substrate 1, a metal film, for example, nickel (Ni), platinum-containing (Pt) Ni, cobalt (Co) or the like is deposited. Subsequently, by subjecting the semiconductor substrate 1 to a heat treatment, the metal film is selectively reacted with the polycrystalline silicon film configuring the gate electrode 5, the metal film is selectively reacted with the single crystalline silicon configuring the semiconductor substrate 1 in the n-type semiconductor region 7, and the metal film is selectively reacted with the single crystalline silicon configuring the semiconductor substrate 1 in a region in which the through electrode 27 is to be formed, to thereby form the metal silicide layer 34. Subsequently, the unreacted metal film is removed by wet cleaning using hydrofluoric acid, wet cleaning using hydrofluoric acid and hydrogen peroxide, or the like, to thereby form the metal silicide layer 34.

Next, over the main surface of the semiconductor substrate 1, the stopper insulating film 8 and the interlayer insulating film 9 are formed sequentially. The stopper insulating film 8 is a film serving as an etching stopper when processing the interlayer insulating film 9, and is formed by using a material having an etching selection ratio relative to the interlayer insulating film 9. The stopper insulating film 8 includes, for example, a silicon nitride film, and the interlayer insulating film 9 includes, for example, a silicon oxide film.

Figure 23:
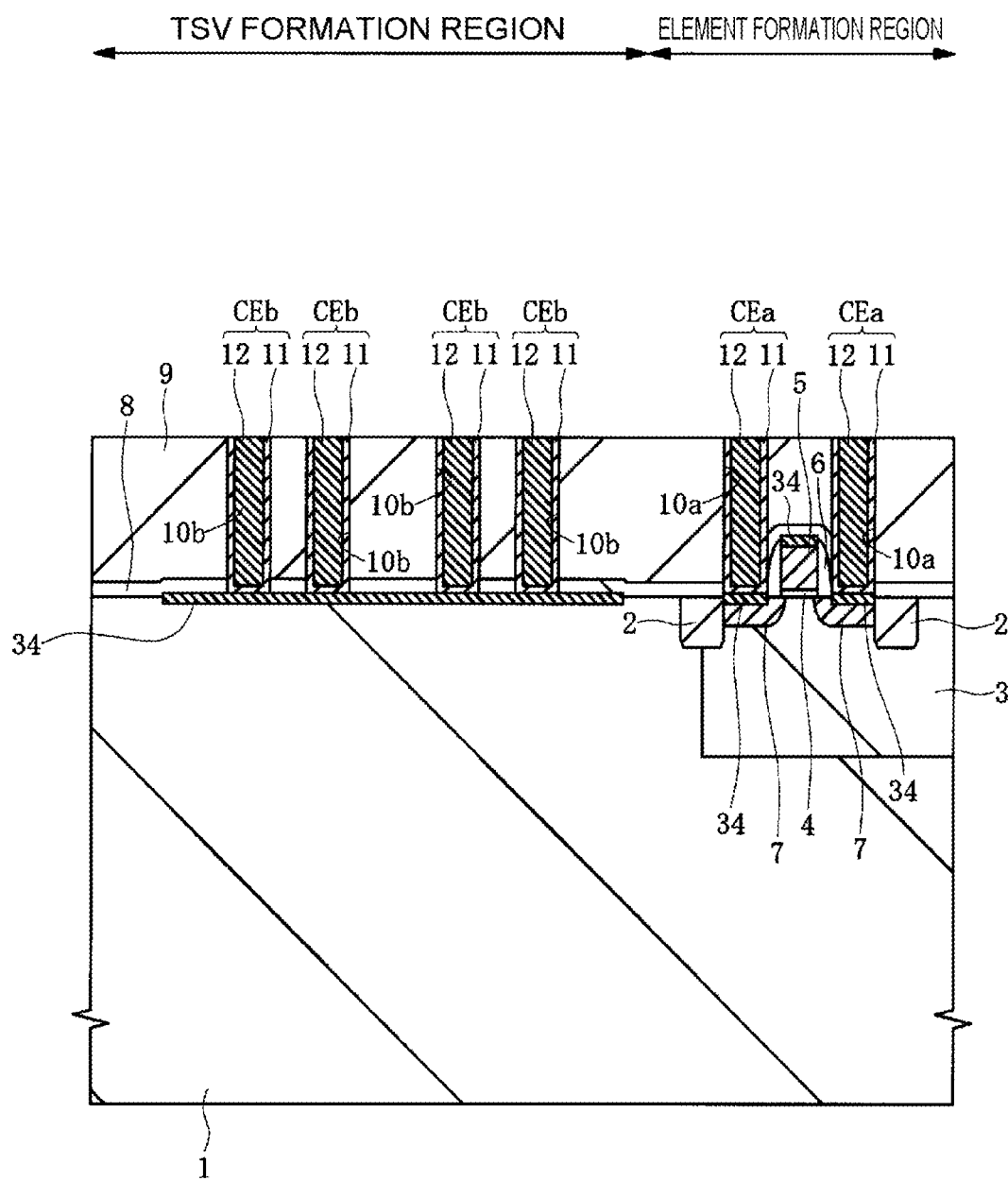
FIG. 23 is a principal part cross-sectional view of the same place as in FIG. 22 in the process of manufacturing the semiconductor device, following FIG. 22.

Then, as shown in FIG. 23, by dry etching using a resist pattern as a mask, the interlayer insulating film 9 and the stopper insulating film 8 are processed sequentially to form the connection hole 10a and the connection hole 10b for a through electrode, reaching the metal silicide layer 34. The connection hole 10a is formed in parts to which application of voltage is necessary in order to operate the nMISFET, such as over the n-type semiconductor region 7 and over the gate electrode 5 of the nMISFET. The connection hole 10b for a through electrode is formed in parts in which the through electrode 27 is to be formed in a later process.

Next, over the main surface of the semiconductor substrate 1, the barrier metal film 11 is formed, for example, by a sputtering method. The barrier metal film 11 includes, for example, a TiN film, a Ta film, a TaN film or the like. Subsequently, over the barrier metal film 11, a W film is formed, for example, by a CVD method or a sputtering method. Subsequently, the W film and the barrier metal film 11 in regions other than the inside of the connection hole 10a and the inside of the connection hole 10b for a through electrode are removed by a CMP method to form, inside the connection hole 10a, the connection electrode CEa that includes the W film as a main conductor and that is connected to the metal silicide layer 34, and to form, inside the connection hole 10b for a through electrode, the connection electrode CEb that includes a W film as a main conductor and that is connected to the metal silicide layer 34.

Figure 24:
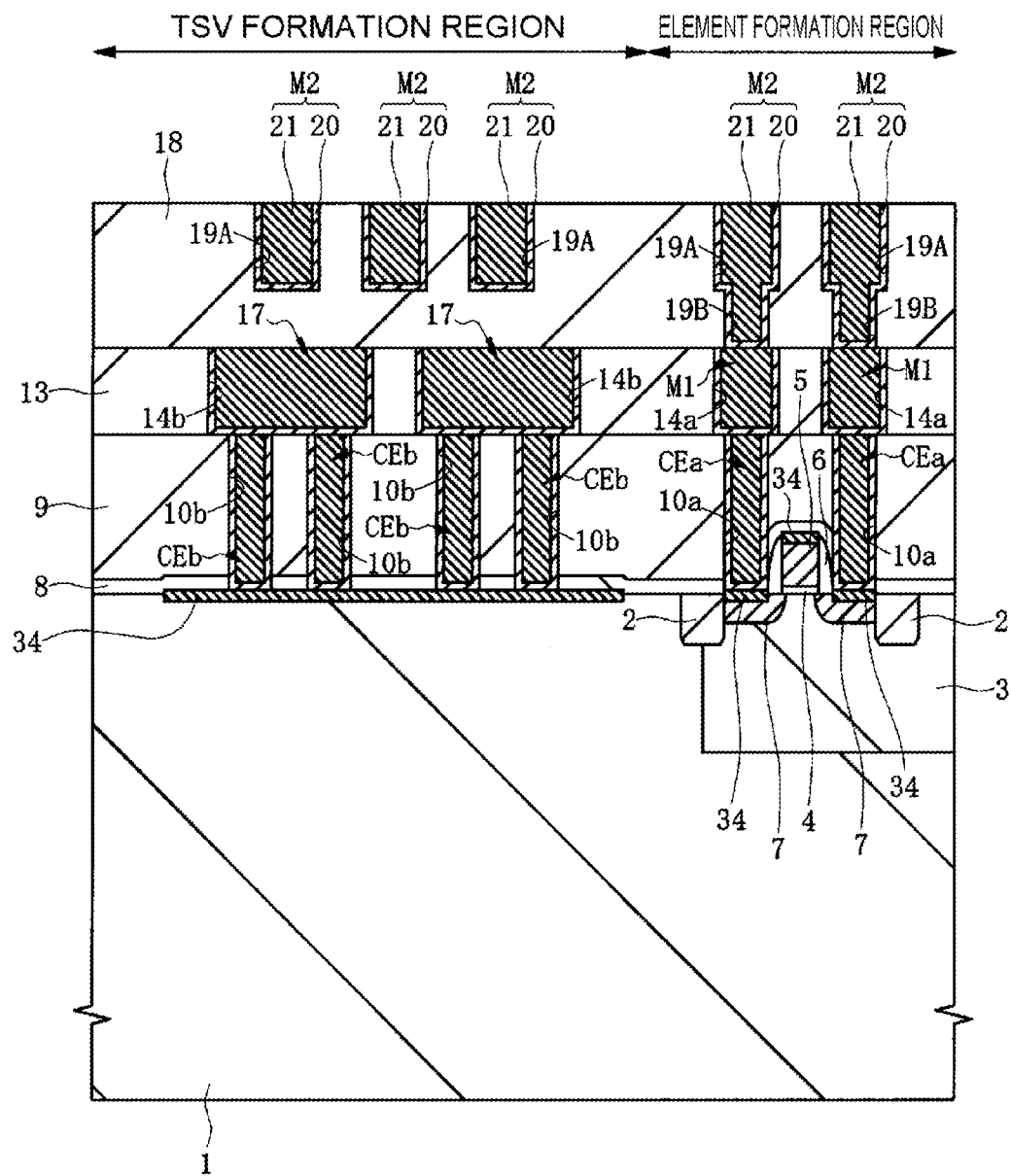
FIG. 24 is a principal part cross-sectional view in the same place as in FIG. 22 in the process of manufacturing the semiconductor device, following FIG. 23.

Next, as shown in FIG. 24, in the same manner as in the First embodiment, the first layer wiring M1 is formed in the element-forming region and the connection pad 17 is formed in the TSV-forming region, by a single damascene method. Furthermore, in the same manner as in the First embodiment, the second layer wiring M2 is formed in the element-forming region and the TSV-forming region, by a dual damascene method. After that, although illustration is omitted, wirings of further upper layers, for example, the third layer to sixth layer wirings are formed by, for example, the same method as in the second layer wiring M2.

Next, the through electrode 27 is formed.

Figure 25:
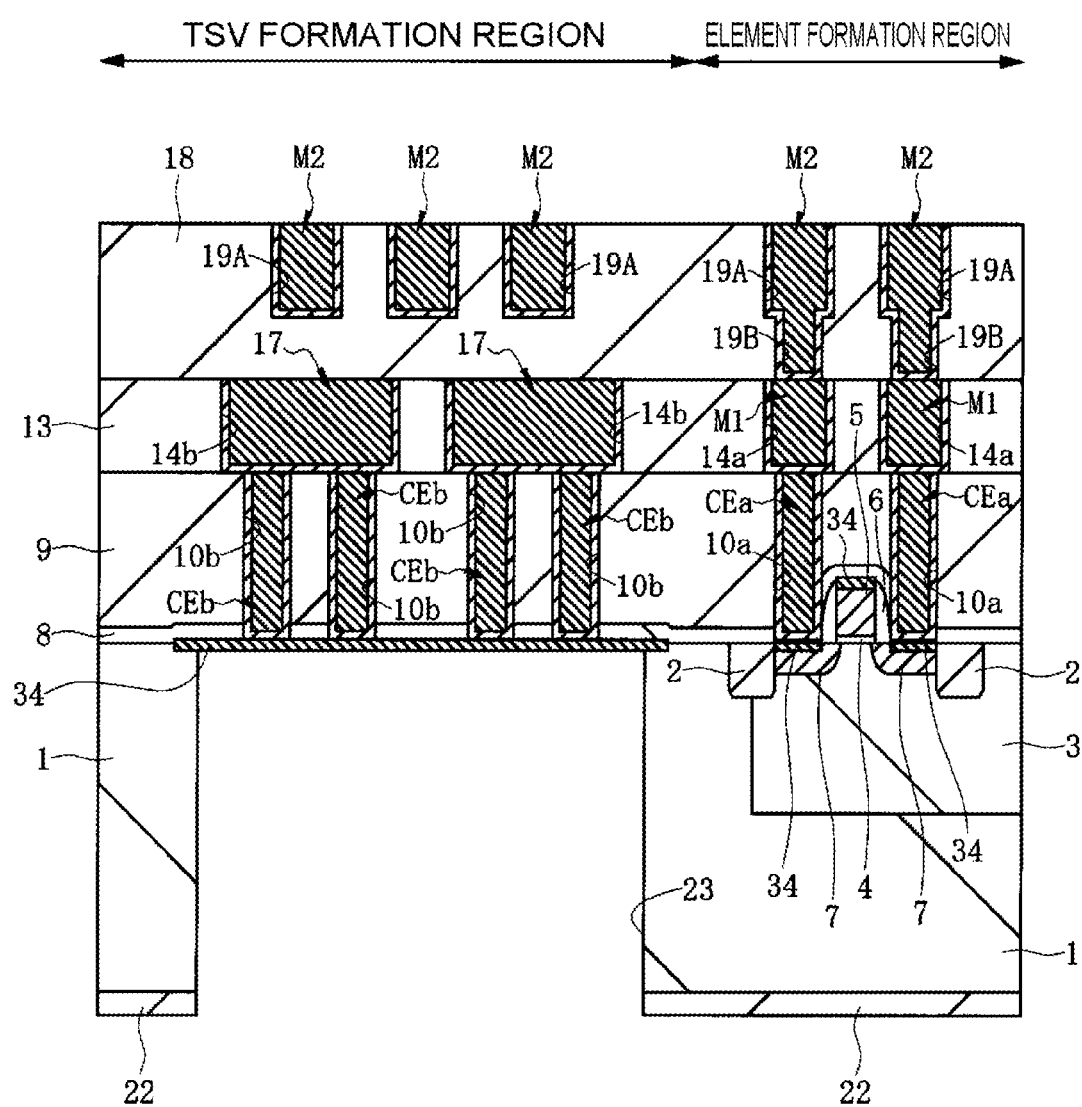
FIG. 25 is a principal part cross-sectional view of the same place as in FIG. 22 in the process of manufacturing the semiconductor device, following FIG. 24.

First, as shown in FIG. 25, by polishing the rear surface (the second main surface) that is the surface opposite to the main surface of the semiconductor substrate 1, the thickness of the semiconductor substrate 1 is set to, for example, not more than 100 μm. Then, after forming the insulating film 22 on the rear surface of the semiconductor substrate 1, the insulating film 22 is dry-etched by using a resist pattern (illustration is omitted) as a mask to form a hard mask. The insulating film 22 includes, for example, a silicon nitride film or a silicon oxide film formed by a plasma CVD method, and, for example, has a thickness of about 0.5 μm. Furthermore, in addition to the function as a hard mask, the insulating film 22 also has a function as a protective film that prevents metal pollution from the rear surface of the semiconductor substrate 1.

Next, by using the hard mask including the resist pattern and the insulating film 22 as a mask, the semiconductor substrate 1 in the TSV-forming region is dry-etched from the rear surface of the semiconductor substrate 1 until the metal silicide layer 34 is exposed. The resist pattern disappears in the etching process. Consequently, the through hole 23 reaching the metal silicide layer 34 is formed. The diameter of the through hole 23 is, for example, about 5 μm. Here, since the through hole 23 does not reach the interlayer insulating film 9, it is possible to prevent the intrusion of $H_2O$, a metal ion such as $Na^+$ or $K^+$, etc. via the interlayer insulating film 9.

Figure 26:
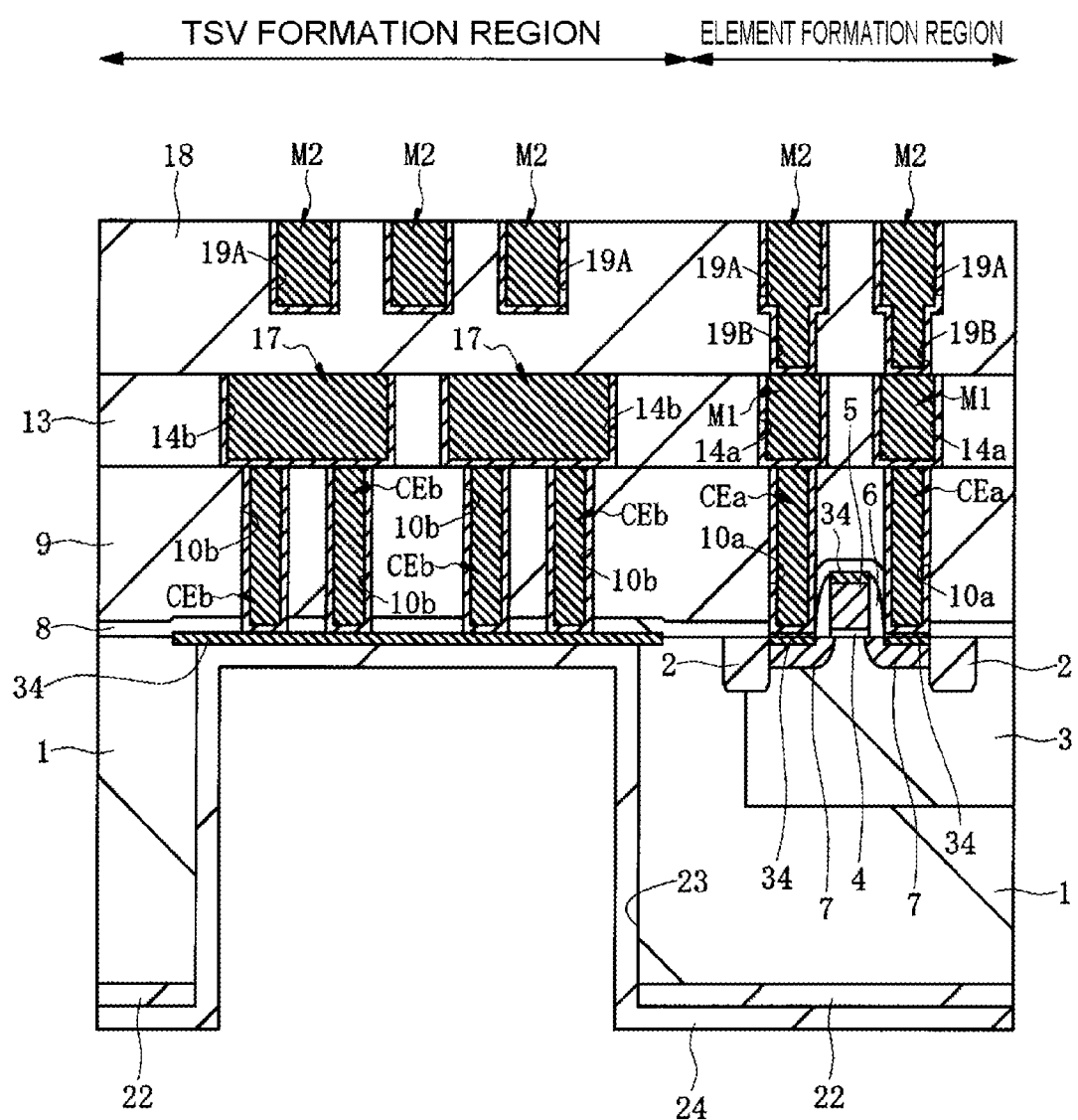
FIG. 26 is a principal part cross-sectional view of the same place as in FIG. 22 in the process of manufacturing the semiconductor device, following FIG. 25.

Next, as shown in FIG. 26, over the rear surface of the semiconductor substrate 1 including the bottom surface and the side surface of the through hole 23, the insulating film 24 is formed. The insulating film 24 includes, for example, a silicon oxide film formed by a plasma CVD method and has, for example, a thickness of about 0.5 μm.

Figure 27:
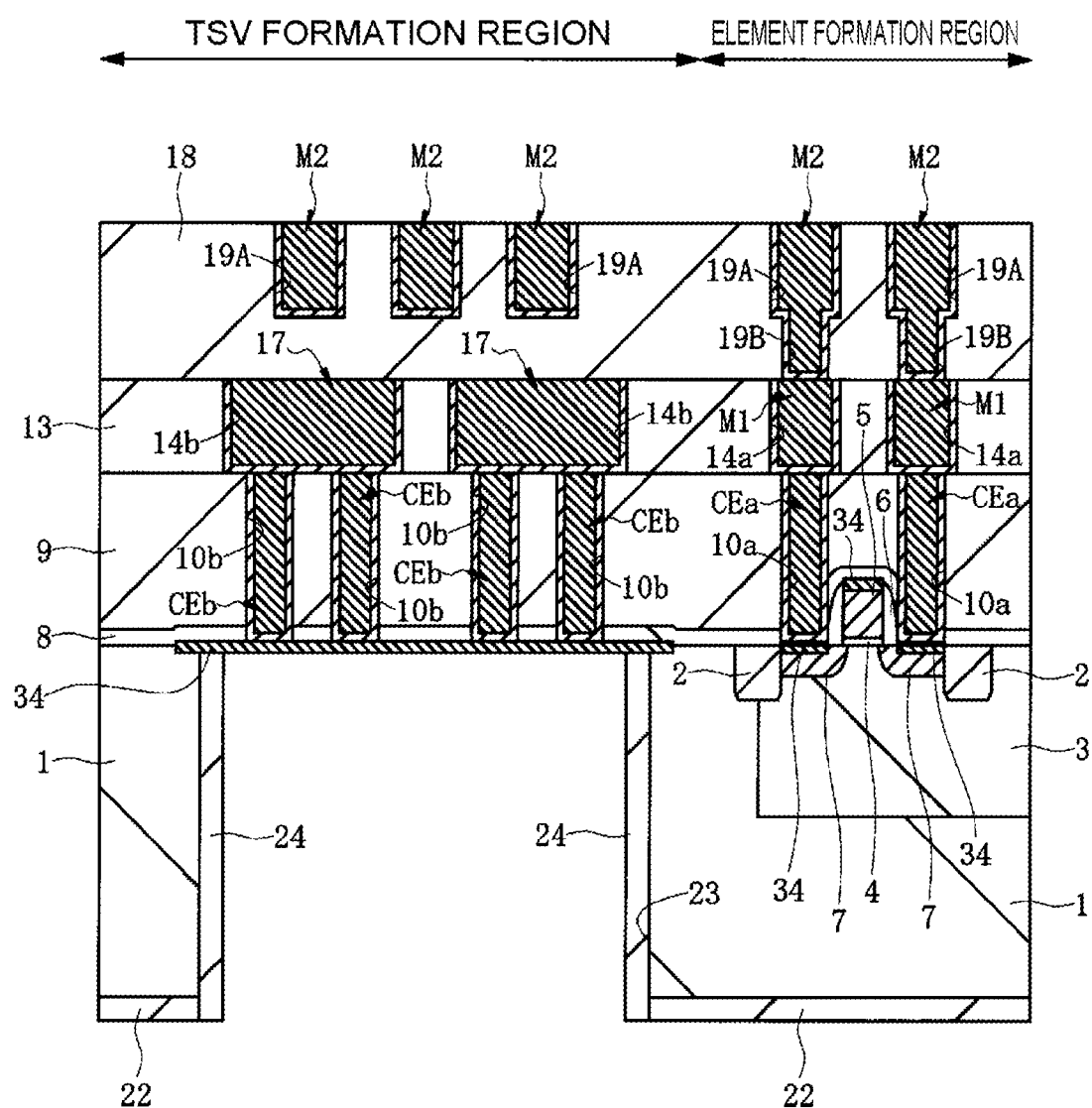
FIG. 27 is a principal part cross-sectional view of the same place as in FIG. 22 in the process of manufacturing the semiconductor device, following FIG. 26.

Then, as shown in FIG. 27, the insulating film 24 over the hard mask including the insulating film 22 and on the bottom surface of the through hole 23 is removed by anisotropic dry etching to leave the insulating film 24 only on the side surface of the through hole 23.

Figure 28:
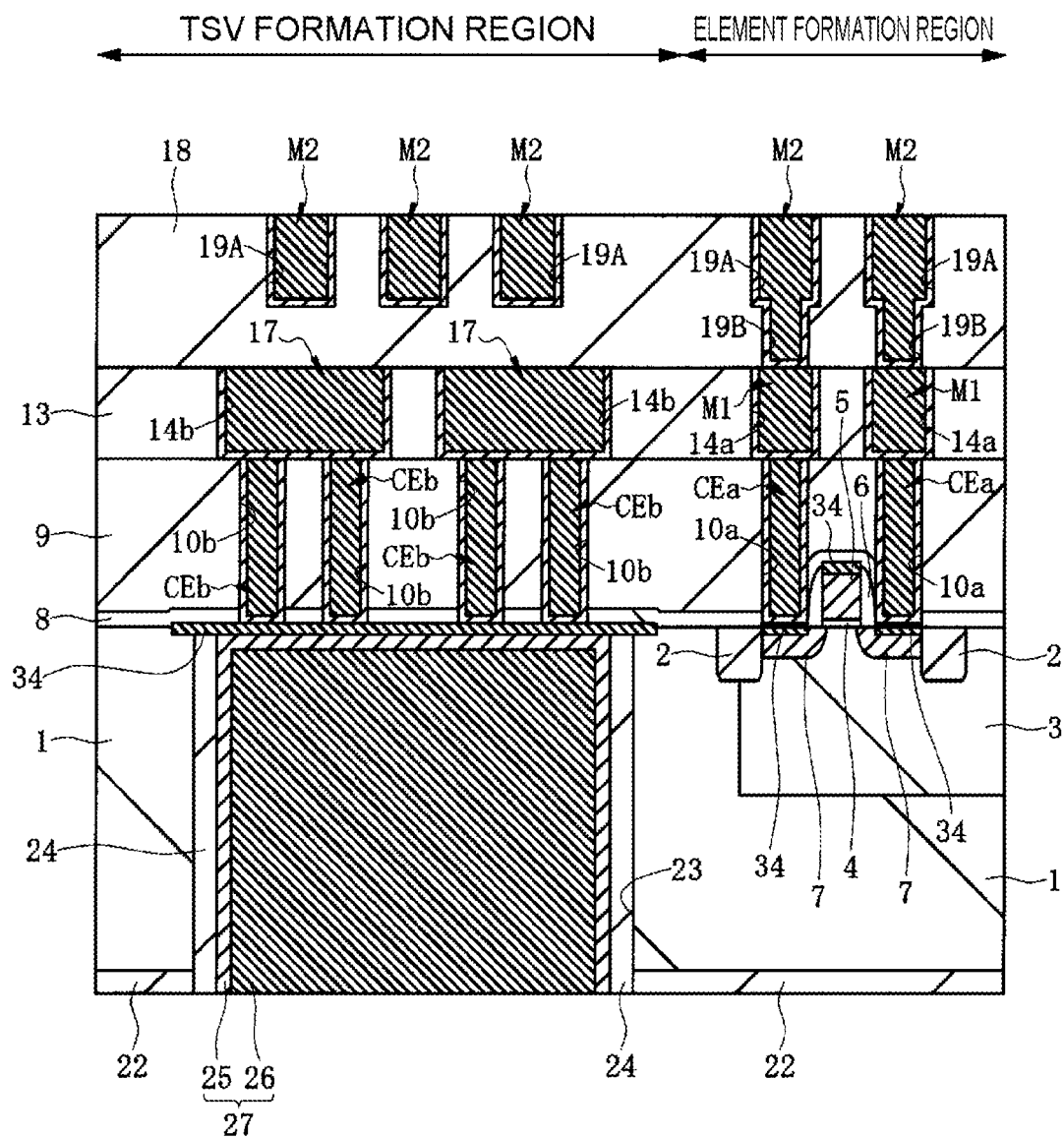
FIG. 28 is a principal part cross-sectional view of the same place as in FIG. 22 in the process of manufacturing the semiconductor device, following FIG. 27.

Next, as shown in FIG. 28, after forming the barrier metal film 25 over the rear surface of the semiconductor substrate 1, over the barrier metal film 25, a seed layer of cupper (illustration is omitted) is formed and, furthermore, over the seed layer, the Cu plating film 26 is formed by using an electrolytic plating method. The barrier metal film 25 includes, for example, a TiN film, a Ta film, a TaN film or the like. After that, the Cu plating film 26, the seed layer and the barrier metal film 25 in regions other than the inside of the through hole 23 are removed by a CMP method to form the through electrode 27 including a Cu film as a main conductor inside the through hole 23.

As described above, according to the Third embodiment, in addition to the same effect as in the First embodiment, furthermore, the metal silicide layer 34 formed between the connection electrode CEb and the through electrode 27 reduces the contact resistance between the connection electrode CEb and the through electrode 27, and a TSV that operates at a higher speed and with a lower power can be realized.

Fourth Embodiment

The Fourth embodiment is different from the First embodiment in that the connection electrode protrudes inside the through electrode in the TSV-forming region.

Figure 29:
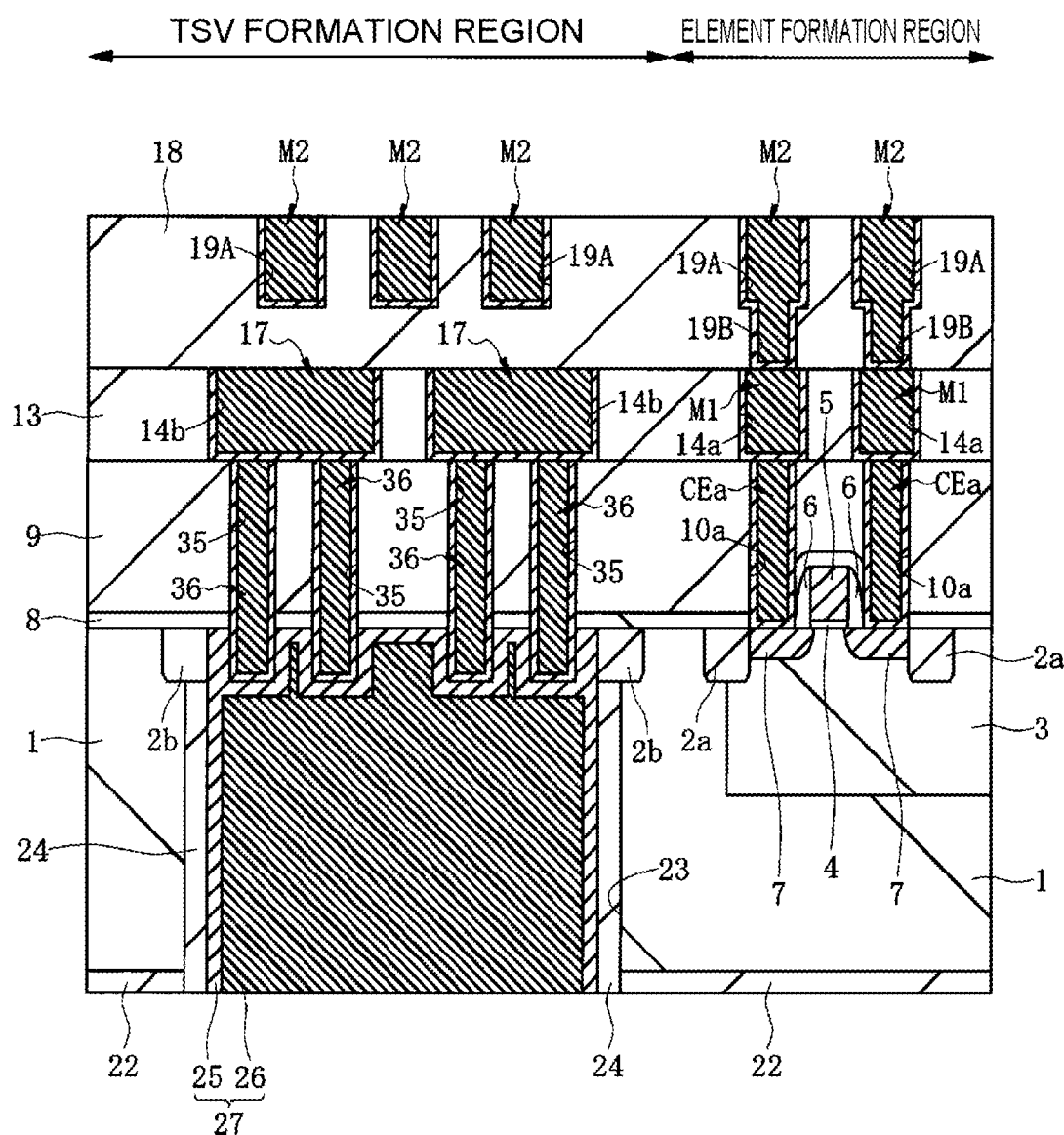
FIG. 29 is a principal part cross-sectional view showing a semiconductor device adopting the TSV technique by the via last system according to a Fourth embodiment of the invention.

A semiconductor device provided with the TSV according to the Fourth embodiment will be explained by using FIG. 29. FIG. 29 is a principal part cross-sectional view of the semiconductor device, and shows a part of the element-forming region, and the TSV-forming region. The configuration of an nMISFET formed in the element-forming region in FIG. 29 is the same as the configuration of the nMISFET described in the First embodiment, and the explanation thereof is omitted.

As shown in FIG. 29, the through hole 23 formed in the semiconductor substrate 1 in the TSV-forming region, the through electrode 27 configured by the barrier metal film and the Cu plating film 26 formed inside the through hole 23, the insulating film 22 formed on the rear surface of the semiconductor substrate 1, and the insulating film 24 formed between the through electrode 27 and the semiconductor substrate 1 are the same as those described in the First embodiment.

Furthermore, in the same manner as in the First embodiment, the connection pad-forming region is partitioned into a plurality of regions, and in each of partitioned regions, connection pads 17 are arranged, respectively, spaced apart from the adjacent connection pad 17. As the form of the shape of the connection pad 17 viewed from above, for example, adoption of shapes explained by using FIG. 2, 5 or 6 in the First embodiment is possible.

In addition, in the same manner as in the First embodiment, no through hole 23 for forming the through electrode 27 is formed in the interlayer insulating film 9, and the connection pad 17 is electrically coupled to the through electrode 27 through the connection hole 35 for a through electrode. Accordingly, it is possible to prevent $H_2O$, a metal ion such as $Na^+$ or $K^+$, etc. from intruding into the element-forming region from the through hole 23 via the interlayer insulating film 9, and thus the variation of operation characteristics of the nMISFET can be suppressed, which allows avoidance of lowering reliability of the semiconductor device. As the form of the shape of the connection hole 35 for a through electrode, for example, adoption of shapes explained by using FIG. 2, 3 or 4 in the First embodiment is possible.

However, the connection electrode 36 connecting the connection pad 17 with the through electrode 27 protrudes inside the through electrode 27. By the fact that the connection electrode 36 protrudes into the through electrode 27 as described above, the contact area between the through electrode 27 and the connection electrode 36 increases, and the contact resistance between the through electrode 27 and the connection electrode 36 can be reduced.

Then, a method of manufacturing a semiconductor device adopting the TSV technique by the via last system according to the Fourth embodiment will be explained in order of processes by using FIGS. 30 to 37. FIGS. 30 to 37 are principal part cross-sectional views of a semiconductor device in the manufacturing process of the semiconductor device, and show a part of the element-forming region, and the TSV-forming region. Moreover, in the element-forming region in FIGS. 30 to 37, an nMISFET is illustrated as a semiconductor element.

Figure 30:
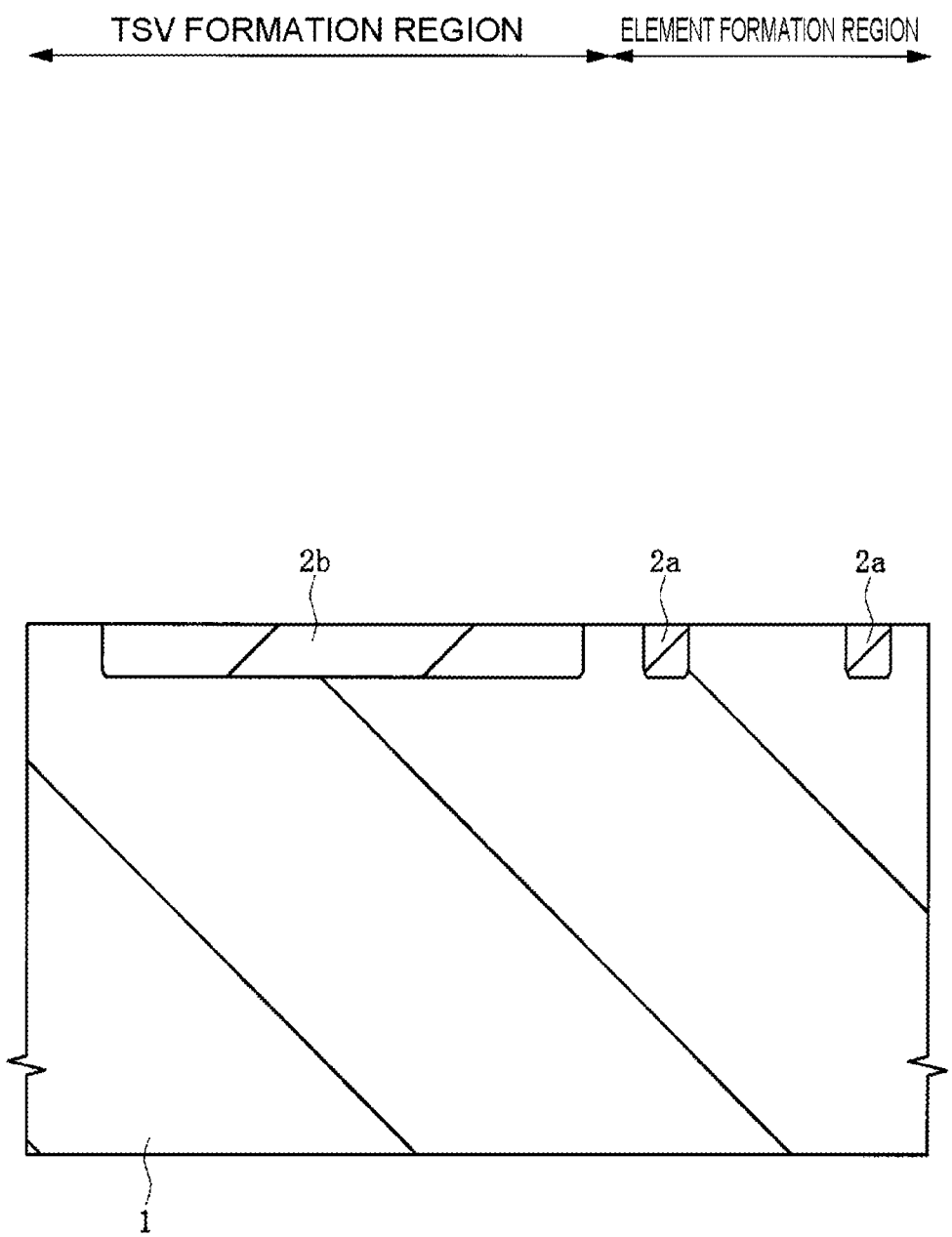
FIG. 30 is a principal part cross-sectional view showing a process of manufacturing a semiconductor device, adopting the TSV technique by the via last system according to the Fourth embodiment of the invention.

First, as shown in FIG. 30, the semiconductor substrate 1 including, for example, single crystalline silicon is prepared. The thickness of the semiconductor substrate 1 is, for example, about 750 µm. Next, in an element isolation region of the main surface (the front surface, first main surface) of the semiconductor substrate 1 in the element-forming region, an isolation part 2a including an insulating film is formed. Simultaneously, also on the main surface of the semiconductor substrate 1 in the TSV-forming region, too, an insulating part 2b including the abovementioned insulating film is formed.

Figure 31:
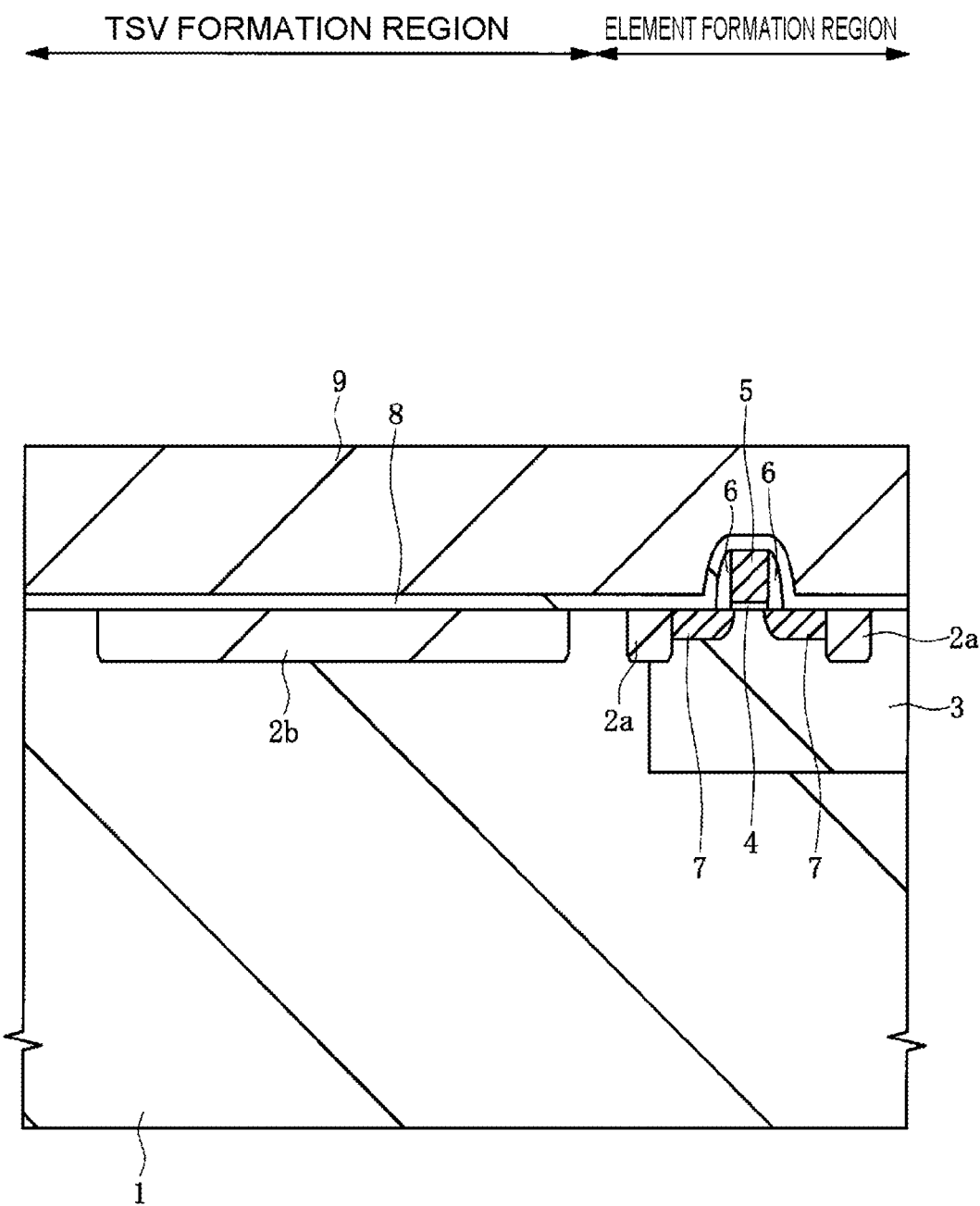
FIG. 31 is a principal part cross-sectional view of the same place as in FIG. 30 in the process of manufacturing the semiconductor device, following FIG. 30.

Next, as shown in FIG. 31, into the semiconductor substrate 1 in a region in which an nMISFET is to be formed, impurities showing p-type electroconductivity are ion-implanted to form the p-type well 3.

Next, after forming the gate insulating film 4 on the main surface of the semiconductor substrate 1, the gate electrode 5 of the nMISFET is formed over the gate insulating film 4. Subsequently, after forming the sidewall 6 on a side surface of the gate electrode 5, into p-type wells 3 on both sides of the gate electrode 5, impurities showing n-type electroconductivity are ion-implanted to form n-type semiconductor regions 7 that function as source/drain of the nMISFET, in a self-alignment manner relative to the gate electrode 5 and the sidewall 6.

Then, over the main surface of the semiconductor substrate 1, the stopper insulating film 8 and the interlayer insulating film 9 are formed sequentially. The stopper insulating film 8 is a film serving as an etching stopper when processing the interlayer insulating film 9, and is formed by using a material having an etching selection ratio relative to the interlayer insulating film 9. The stopper insulating film 8 includes, for example, a silicon nitride film, and the interlayer insulating film 9 includes, for example, a silicon oxide film.

Figure 32:
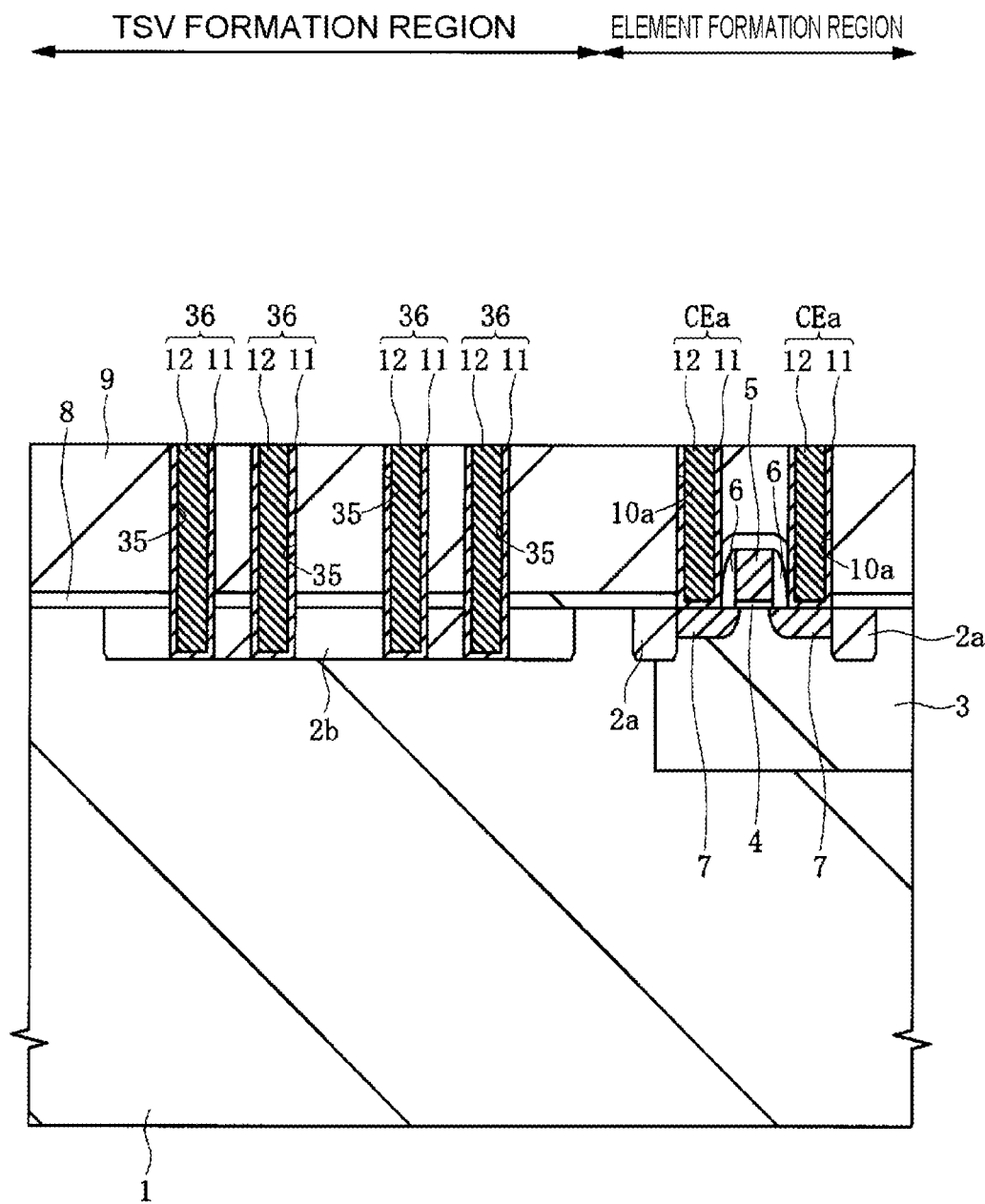
FIG. 32 is a principal part cross-sectional view of the same place as in FIG. 30 in the process of manufacturing the semiconductor device, following FIG. 31.

Next, as shown in FIG. 32, the interlayer insulating film 9 and the stopper insulating film 8 in the element-forming region are processed sequentially by dry etching using a resist pattern as a mask to form the connection hole 10a, and, simultaneously, the interlayer insulating film 9, the stopper insulating film 8 and the insulating part 2b in the TSV-forming region are processed sequentially to form the connection hole 35 for a through electrode. The connection hole 10a is formed in parts to which application of voltage is necessary in order to operate the nMISFET, such as over the n-type semiconductor region 7 and over the gate electrode 5. In addition, the connection hole 35 for a through electrode is formed in parts in which the through electrode 27 is to be formed in a later process. The bottom surface of the connection hole 10a lies in an approximately the same plane as the main surface of the semiconductor substrate 1 on which an n-type diffusion region 7 is formed (occasionally, it may be etched slightly by dry etching), but the bottom surface of the connection hole 35 for a through electrode lies deeper from the main surface of the semiconductor substrate 1 in about 0.2 to 0.25 µm.

Then, over the main surface of the semiconductor substrate 1, a barrier metal film 11 is formed, for example, by a sputtering method. The barrier metal film 11 includes, for example, a TiN film, a Ta film, a TaN film or the like. Subsequently, over the barrier metal film 11, a W film is formed, for example, by a CVD method or a sputtering method. Subsequently, the W film and the barrier metal film 11 in regions other than the inside of the connection hole 10a and the inside of the connection hole 35 for a through electrode are removed by a CMP method to form the connection electrode CEa including the W film as a main conductor inside the connection hole 10a, and to form a connection electrode 36 including the W film as a main conductor inside the connection hole 35 for a through electrode.

Figure 33:
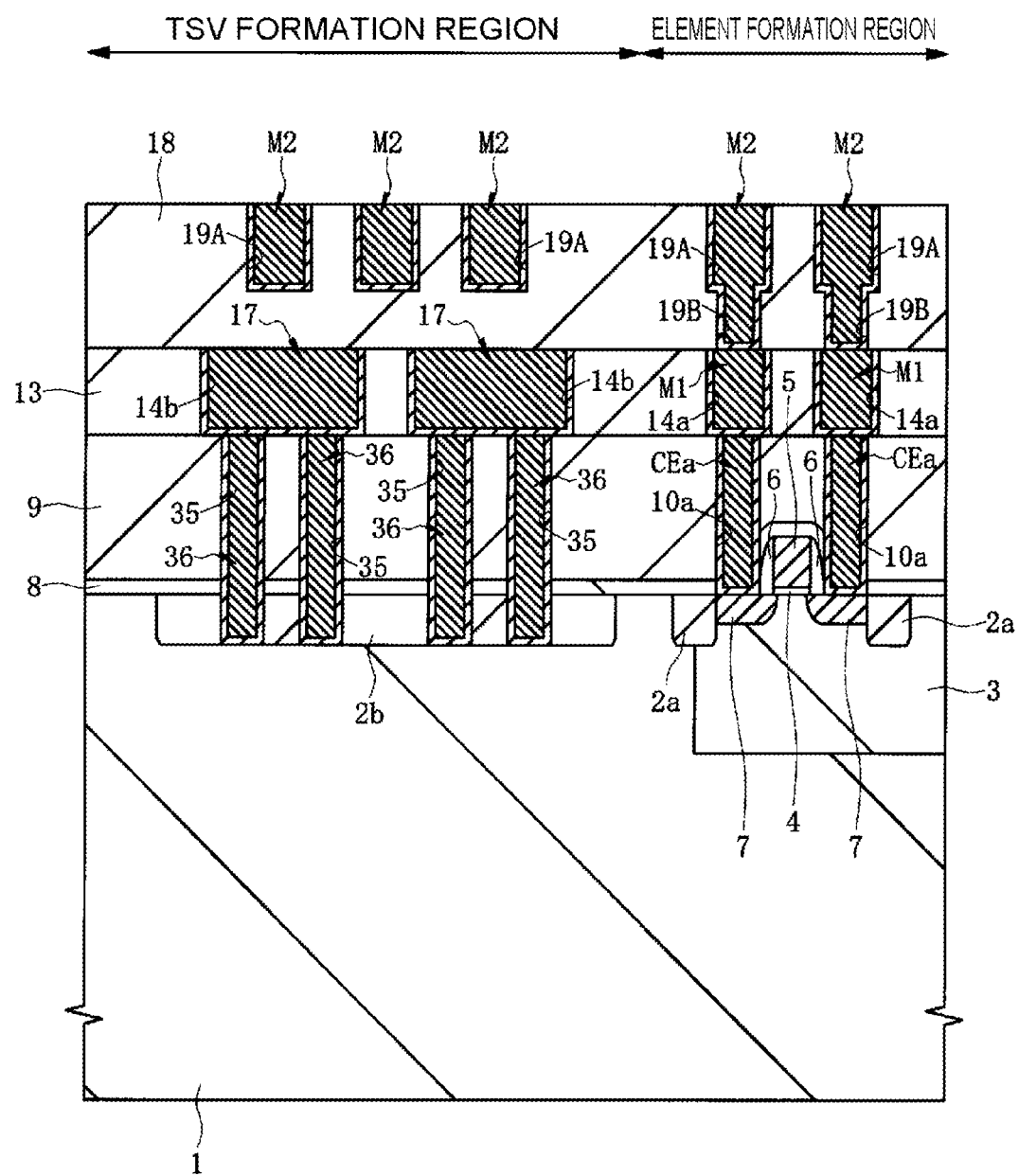
FIG. 33 is a principal part cross-sectional view of the same place as in FIG. 30 in the process of manufacturing the semiconductor device, following FIG. 32.

Next, as shown in FIG. 33, in the same manner as in the First embodiment, by a single damascene method, the first layer wiring M1 is formed in the element-forming region, and the connection pad 17 is formed in the TSV-forming region. Furthermore, in the same manner as in the First embodiment, by a dual damascene method, the second layer wiring M2 is formed in the element-forming region and the TSV-forming region. After that, although illustration is omitted, wirings of further upper layers, for example, the third layer to sixth layer wirings are formed, for example, by the same method as in the second layer wiring M2.

Then, the through electrode 27 is formed.

Figure 34:
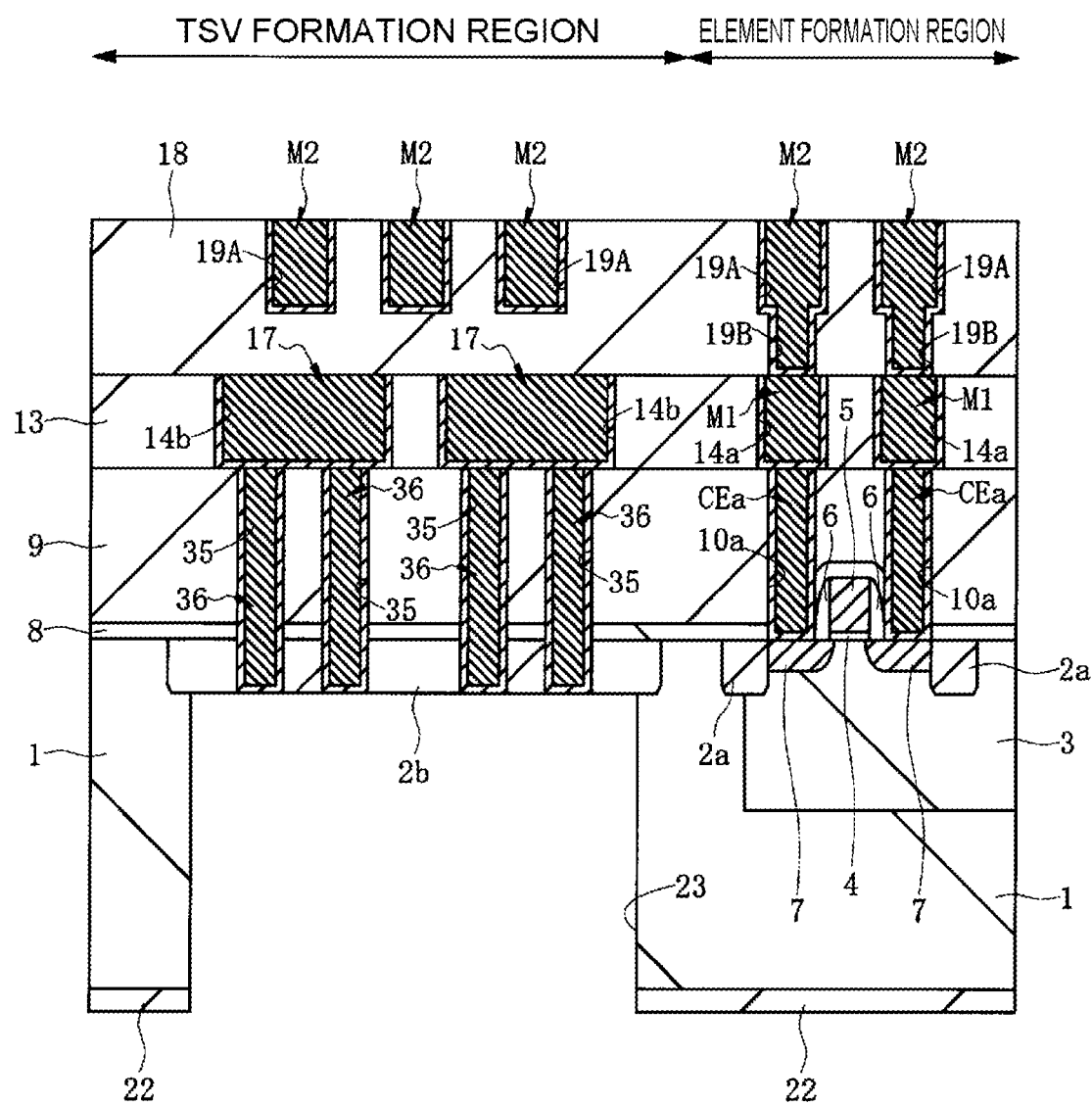
FIG. 34 is a principal part cross-sectional view of the same place as in FIG. 30 in the process of manufacturing the semiconductor device, following FIG. 33.

First, as shown in FIG. 34, the rear surface (the second main surface) that is the surface opposite to the main surface of the semiconductor substrate 1 is polished to make the thickness of the semiconductor substrate 1 be, for example, not more than 100 µm. Next, after forming the insulating film 22 on the rear surface of the semiconductor substrate 1, the insulating film 22 is dry-etched using a resist pattern (illustration is omitted) as a mask to form a hard mask. The insulating film 22 includes, for example, a silicon nitride film or a silicon oxide film formed by a plasma CVD method and has, for example, a thickness of about 0.5 µm. In addition to the function as a hard mask, the insulating film 22 also has a function as a protective film that prevents metal pollution from the rear surface of the semiconductor substrate 1.

Next, by using the hard mask including the resist pattern and the insulating film 22 as a mask, the semiconductor substrate 1 in the TSV-forming region is dry-etched from the rear surface of the semiconductor substrate 1 until the connection electrode 36 (the barrier metal film 11) formed inside the connection hole 35 of a through electrode and the insulating part 2b are exposed. The resist pattern disappears in the etching process. Consequently, the through hole 23 reaching the connection electrode 36 is formed. The diameter of the through hole 23 is, for example, about 5 μm. Here, since the through hole 23 does not reach the interlayer insulating film 9, it is possible to prevent the intrusion of $H_2O$, a metal ion such as $Na^+$ or $K^+$, etc. via the interlayer insulating film 9.

Figure 35:
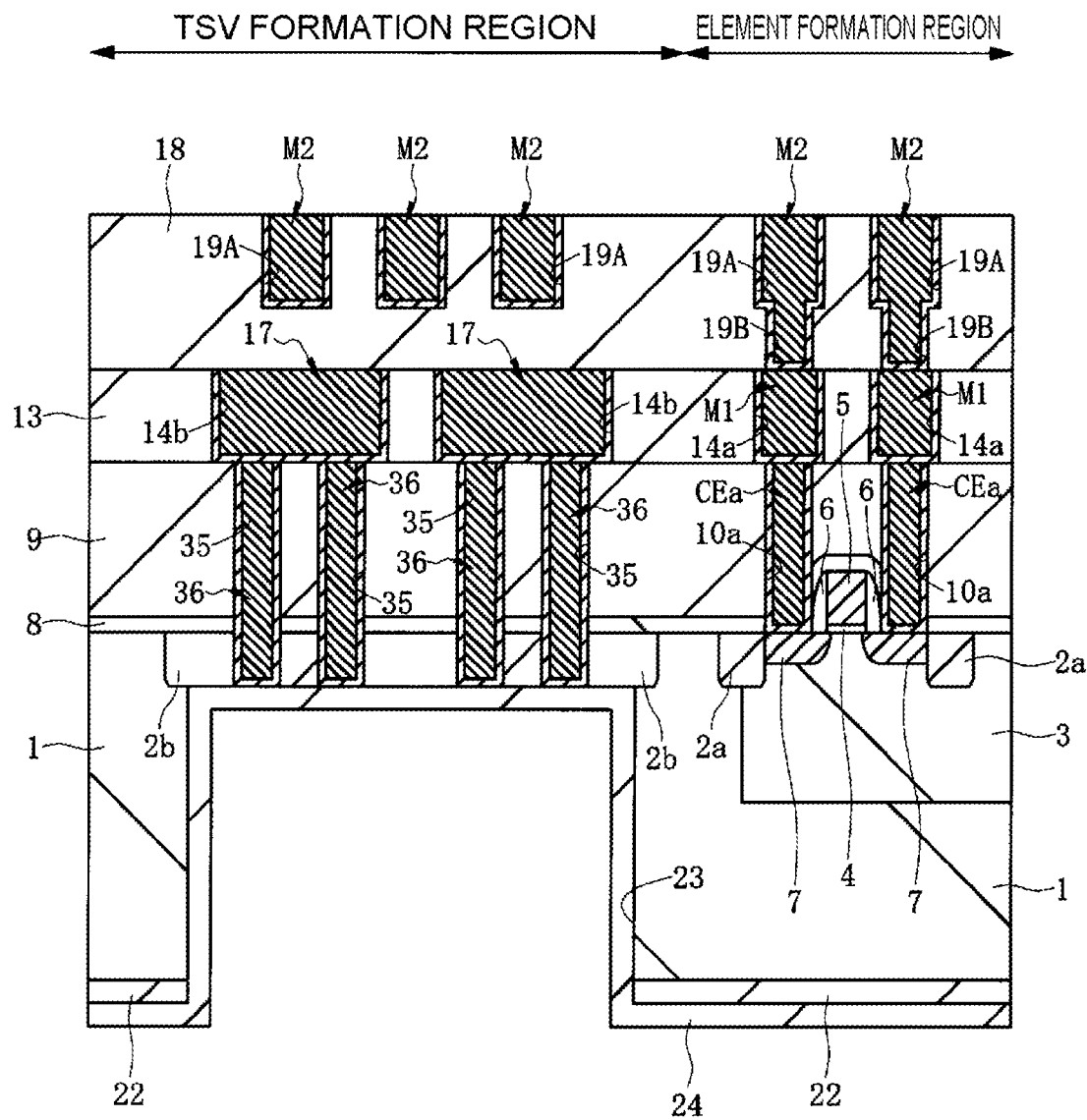
FIG. 35 is a principal part cross-sectional view of the same place as in FIG. 30 in the process of manufacturing the semiconductor device, following FIG. 34.

Then, as shown in FIG. 35, over the rear surface of the semiconductor substrate 1 including the bottom surface and the side surface of the through hole 23, the insulating film 24 is formed. The insulating film 24 includes, for example, a silicon oxide film formed by a plasma CVD method and has, for example, a thickness of about 0.5 μm.

Figure 36:
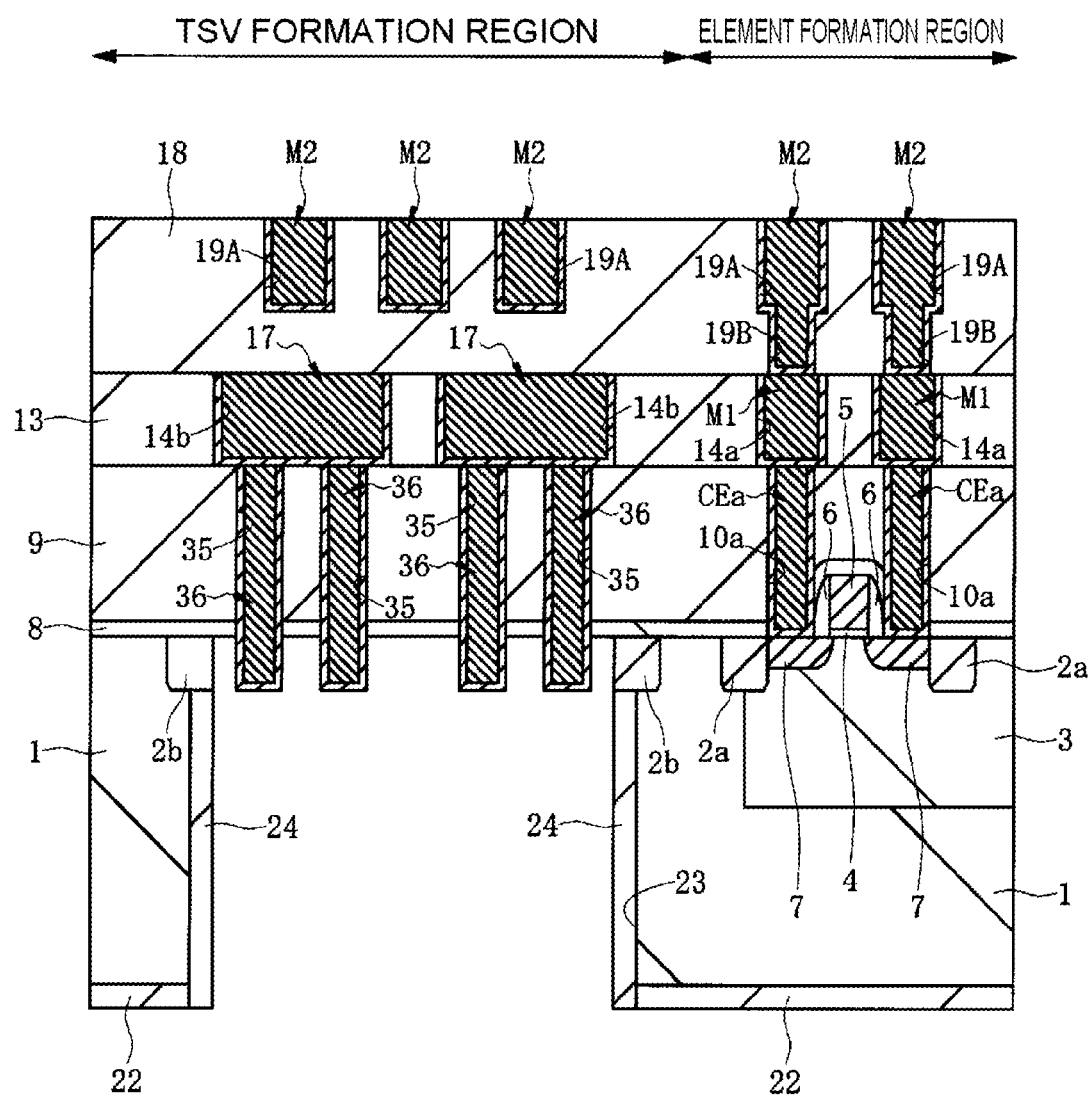
FIG. 36 is a principal part cross-sectional view of the same place as in FIG. 30 in the process of manufacturing the semiconductor device, following FIG. 35.

Next, as shown in FIG. 36, the insulating film 24 and the insulating part 2b over the hard mask including the insulating film 22 and on the bottom surface of the through hole 23 are removed by anisotropic dry etching to leave the insulating film 24 only on the side surface of the through hole 23, and to make a part of the connection electrode 36 protrude from the bottom surface of the through hole 23. The length of the part of the connection hole 36 protruding into the through hole 23 is, for example, about 0.2 to 0.25 μm.

Figure 37:
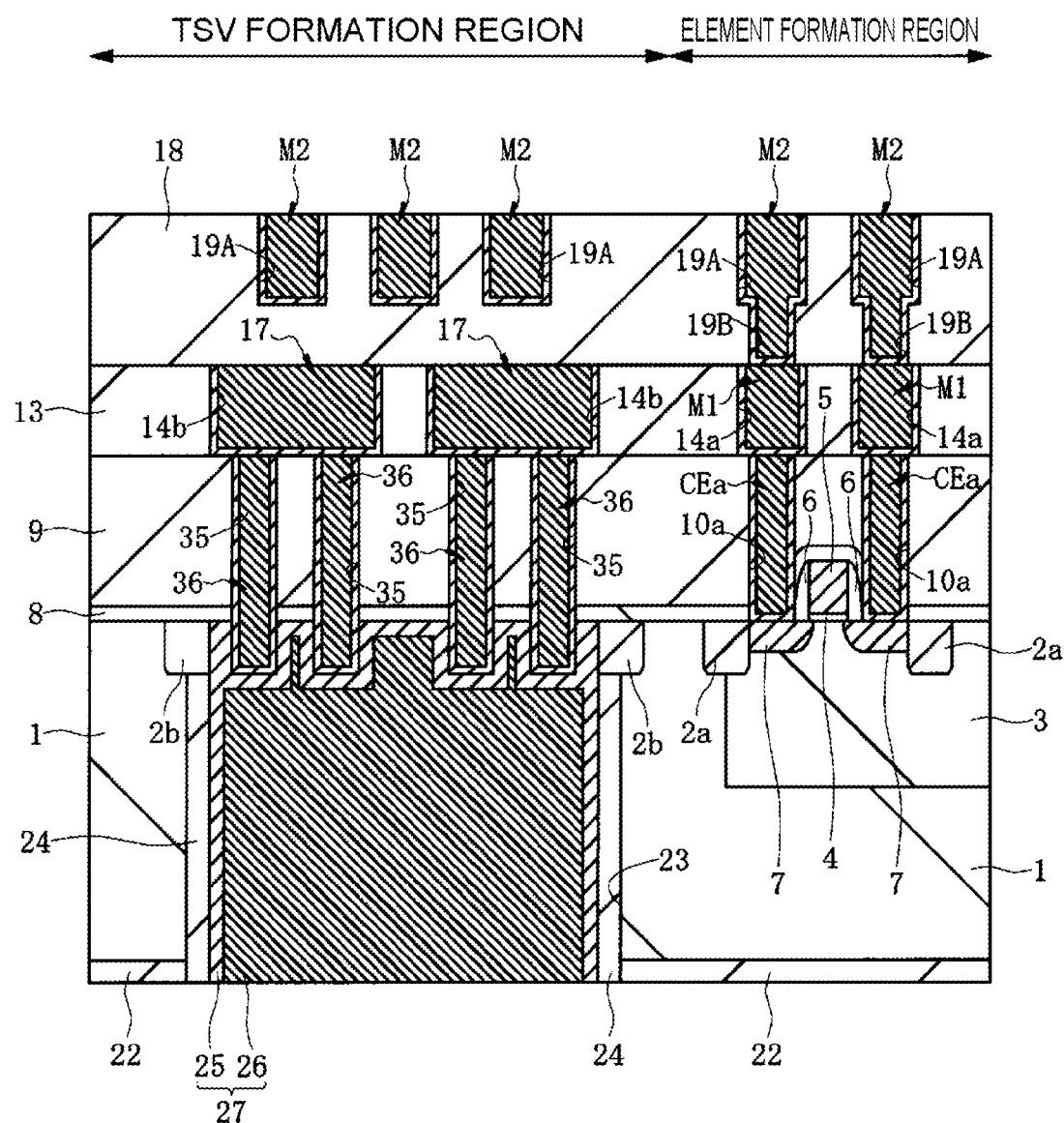
FIG. 37 is a principal part cross-sectional view of the same place as in FIG. 30 in the process of manufacturing the semiconductor device, following FIG. 36.

Then, as shown in FIG. 37, after forming the barrier metal film 25 over the rear surface of the semiconductor substrate 1, over the barrier metal film 25, a seed layer of Cu (illustration is omitted) is formed, and, furthermore, over the seed layer, the Cu plating film 26 is formed by using an electrolytic plating method. The barrier metal film 25 includes, for example, a TiN film, a Ta film, a TaN film or the like. After that, the Cu plating film 26, the seed layer and the barrier metal film 25 in regions other than the inside of the through hole 23 are removed by a CMP method to form the through electrode 27 including the Cu film as a main conductor inside the through hole 23.

Incidentally, in the Fourth embodiment, the connection pad 17 is configured mainly by the Cu film and the connection electrode 36 connecting electrically the connection pad 17 with the through electrode 27 is configured mainly by the W film. However, as described in the Second embodiment, the connection pad and the connection electrode may be configured by a Cu film of the same layer.

As described above, according to the Fourth embodiment, in addition to the same effect as in the First embodiment, furthermore, by making the connection electrode 36 protrude inside the through electrode 27, the contact resistance between the through electrode 27 and the connection electrode 36 is reduced, and a TSV that operates at a higher speed and with a lower power can be realized.

Hereinbefore, the invention invented by the inventor is explained specifically on the basis of embodiments, but the invention is not limited to the embodiments, and it is needless to say that various modifications are possible within a scope not departing from the gist thereof.

For example, in embodiments, the planar area of the connection pad-forming region is set to be larger than the planar area of the through electrode (the through hole), but the relation between areas is not limited to this. The planar area of the connection pad-forming region may be set to be the same as or smaller than the planar area of the through electrode (the through hole).

The invention can be applied to the structure of three dimensional multifunctional devices and the manufacturing thereof.

What is claimed is:

1. A semiconductor device, comprising:
   a semiconductor substrate having a first main surface and a second main surface opposite to the first main surface;
   a through hole passing through the semiconductor substrate from the first main surface to the second main surface;
   a through electrode formed inside the through hole;
   a MISFET formed over the first main surface of the semiconductor substrate, the MISFET having a semiconductor region in the semiconductor substrate on a side of the first main surface;
   an insulating film formed over the MISFET;
   multilayer wirings formed over the insulating film, said multilayer wirings being electrically coupled to the semiconductor region;
   a plurality of connection pads formed over the insulating film, the connection pads formed at the lowest wiring layer of the multilayer wirings; and
   a plurality of connection electrodes formed inside a plurality of connection holes formed in the insulating film,
   wherein the plurality of connection pads are electrically coupled to the through electrode via the plurality of connection electrodes, respectively.

2. The semiconductor device according to claim 1,
   wherein the connection electrode has a shape in which a first dimension in a first direction is the same as a second dimension in a second direction orthogonal to the first direction, in plan view, and each of the connection pads is electrically coupled to the through electrode via the connection electrodes.

3. The semiconductor device according to claim 2,
   wherein a shape of the connection electrodes viewed from above is circular respectively.

4. The semiconductor device according to claim 1,
   wherein the connection electrodes have a shape having a first dimension in a first direction and a second dimension larger than the first dimension in a second direction orthogonal to the first direction respectively, in plan view, and each of the connection pads is electrically coupled to the through electrode via the connection electrodes.

5. The semiconductor device according to claim 1,
   wherein the connection electrodes have a shape of a lattice type, respectively, in plan view, and each of the connection pads is electrically coupled to the through electrode via the connection electrodes.

6. The semiconductor device according to claim 1, wherein the connection electrode is constituted by a metal film of the same layer as the connection pad.

7. The semiconductor device according to claim 1, wherein a metal silicide layer is formed between the connection electrode and the through electrode.

8. The semiconductor device according to claim 1, wherein the connection electrode protrudes inside the through electrode.

9. A semiconductor device, comprising:
   a semiconductor substrate having a first main surface and a second main surface opposite to the first main surface;
   a through hole passing through the semiconductor substrate from the first main surface to the second main surface;
   a through electrode formed inside the through hole;
   a MISFET formed over the first main surface of the semiconductor substrate, the MISFET having a semiconductor region in the semiconductor substrate on a side of the first main surface;

an insulating film formed over the MISFET;

multilayer wirings formed over the insulating film, said multilayer wirings being electrically coupled to the semiconductor region;

a connection pad that is formed over the insulating film and has a shape of a lattice type in plan view, the connection pads formed at a lowest wiring layer of the multilayer wirings; and a plurality of connection electrodes formed inside a plurality of connection holes formed in the insulating film, wherein the connection pad is electrically coupled to the through electrode via the plurality of connection electrodes.

10. The semiconductor device according to claim 9, wherein the connection electrode is constituted by a metal film of the same layer as the connection pad.

11. The semiconductor device according to claim 9, wherein a metal silicide layer is formed between the connection electrode and the through electrode.

12. The semiconductor device according to claim 9, wherein the connection electrode protrudes inside the through electrode.

13. The semiconductor device according to claim 1, wherein one of the plurality of connection pads is electrically coupled to the through electrode via two or more of the plurality of connection electrodes.

14. The semiconductor device according to claim 1,
wherein the plurality of connection pads are directly coupled to the plurality of connection electrodes respectively, and
wherein the plurality of connection electrodes are directly coupled to the through electrode.

15. The semiconductor device according to claim 9,
wherein the connection pad is directly coupled to the plurality of connection electrodes, and
wherein the plurality of connection electrodes are directly coupled to the through electrode.

* * * * *